(12) United States Patent
Shafer et al.

(10) Patent No.: US 7,697,211 B2
(45) Date of Patent: Apr. 13, 2010

(54) SYMMETRICAL OBJECTIVE HAVING FOUR LENS GROUPS FOR MICROLITHOGRAPHY

(75) Inventors: David R. Shafer, Fairfield, CT (US); Aurelian Dodoc, Heidenheim (DE); Johannes Zellner, Aalen (DE); Heiko Feldmann, Aalen (DE); Wilhelm Ulrich, Aalen (DE); Holger Walter, Essingen-Lauterburg (DE); Ulrich Loering, Oberkochen (DE); Daniel Kraehmer, Essingen (DE); Gerhard Fuerter, Ellwangen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 12/257,156

(22) Filed: Oct. 23, 2008

(65) Prior Publication Data

US 2009/0080086 A1 Mar. 26, 2009

Related U.S. Application Data

(63) Continuation of application No. PCT/US2007/068227, filed on May 4, 2007.

(60) Provisional application No. 60/798,157, filed on May 5, 2006, provisional application No. 60/838,213, filed on Aug. 17, 2006.

(51) Int. Cl.
*G02B 27/30* (2006.01)

(52) U.S. Cl. .................................................... 359/649

(58) Field of Classification Search .......... 359/649–651
See application file for complete search history.

(56) References Cited

U.S. PATENT DOCUMENTS 2,698,555 A 1/1955 McCarthy
5,696,631 A * 12/1997 Hoffman .................... 359/649

FOREIGN PATENT DOCUMENTS

JP 2002-072080 3/2002
JP 2006-267383 10/2006

OTHER PUBLICATIONS

Michael J. Kidger, "Fundamental Optical Design," Chapter 2, SPIE Press, 2002.

* cited by examiner

*Primary Examiner*—Joseph Martinez
(74) *Attorney, Agent, or Firm*—Fish & Richardson P.C.

(57) ABSTRACT

The invention features a system for microlithography that includes a mercury light source configured to emit radiation at multiple mercury emission lines, a projection objective positioned to receive radiation emitted by the mercury light source, and a stage configured to position a wafer relative to the projection objective. During operation, the projection objective directs radiation from the light source to the wafer, where the radiation at the wafer includes energy from more than one of the emission lines. Optical lens systems for use in said projection objective comprise four lens groups, each having two lenses comprising silica, the first and second lens groups on one hand and the third and fourth lens groups on the other hand are positioned symmetrically with respect to a plane perpendicular to the optical axis of said lens system.

26 Claims, 15 Drawing Sheets

SYMMETRICAL OBJECTIVE HAVING FOUR LENS GROUPS FOR MICROLITHOGRAPHY

CROSS-REFERENCE TO RELATED APPLICATIONS

This application claims priority to International Application No. PCT/US2007/068227, filed May 4, 2007, which claims priority to Provisional Patent Application No. 60/798,157, filed on May 5, 2006 and claims priority to Provisional Patent Application No. 60/838,213, filed on Aug. 17, 2006. The entire contents of both the above-mentioned Provisional Patent Applications and the above-mentioned International Application are incorporated herein by reference.

TECHNICAL FIELD

This disclosure relates to optical lens systems, and related microlithography systems and processes.

BACKGROUND

Optical lens systems can be used to direct optical radiation. Optical lens systems can be imaging systems, directing the radiation from a object to an image region thereby forming an image of the object in the image region. In certain applications, optical lens systems can be used in microlithography systems. For example, optical lens systems can be used to project an image of a mask onto a photosensitive layer (e.g., a photoresist) on a substrate.

SUMMARY

In certain aspects, this disclosure features imaging optical lens systems designed to have relatively low longitudinal chromatic aberration (e.g., relatively low primary and/or secondary longitudinal chromatic aberration). The optical lens systems include lenses formed from at least two different materials. Some embodiments feature lenses formed from at least three different materials. The arrangement and design of each lens is selected so that, in addition to low longitudinal chromatic aberration, the optical lens system has other favorable imaging properties such as relatively low image field curvature, relatively low horizontal chromatic aberration (e.g., primary and/or secondary horizontal chromatic aberration). Embodiments include imaging optical systems designed for imaging radiation at wavelengths corresponding to the i-, h-, and g-emission lines of a mercury source.

In general, in a first aspect, the invention features an optical lens system for directing radiation at a wavelength $\lambda$ from an object region to an image region, the optical lens system having an optical axis. The optical lens system includes a first lens group comprising first and second lenses positioned along the optical axis of the optical lens system, a second lens group comprising first and second lenses positioned along the optical axis of the optical lens system, a third lens group comprising first and second lenses positioned along the optical axis of the optical lens system, and a fourth lens group comprising first and second lenses positioned along the optical axis of the optical lens system. The first and second lenses in each of the first, second, third and fourth lens groups include silica. The first, second, third and fourth lens groups are symmetrically positioned about a plane perpendicular to the optical axis. The first lens group has a first chromatic aberration for the radiation. The second lens group has a second chromatic aberration for the radiation. A difference between a magnitude of the second chromatic aberration and a magnitude of the first chromatic aberration is less than about $\lambda$. A sign of the second chromatic aberration is opposite to a sign of the first chromatic aberration. The optical lens system forms a portion of a microlithography optical lens system.

In general, in another aspect, the invention features an optical lens system for directing radiation from an object region to an image region, the optical lens system having an optical axis. The optical lens system includes a first lens group comprising first and second lenses positioned along the optical axis of the optical lens system and a second lens group comprising first and second lenses positioned along the optical axis of the optical lens system. The first lens group has a first chromatic aberration for the radiation. The second lens group has a second chromatic aberration for the radiation. The radiation includes a wavelength, $\lambda$, where a difference between a magnitude of the second chromatic aberration and a magnitude of the first chromatic aberration is less than about $\lambda$. The optical lens system images radiation at the wavelength $\lambda$ to an image region and a sign of the second chromatic aberration is opposite to a sign of the first chromatic aberration. The optical lens system forms a portion of a microlithography optical lens system and the first lens group reduces a curvature of the image at the wavelength $\lambda$ in the image region to less than a depth of focus of the microlithography optical lens system in the image region of microlithography optical lens system.

In general, in another aspect, the invention features an optical lens system for directing radiation at a wavelength $\lambda$ from an object region to an image region, the optical lens system having an optical axis. The optical lens system includes a first lens group having positive optical power positioned along the optical axis between the object region and the image region, a second lens group having positive optical power positioned along the optical axis between the first lens group and the image region, wherein the second lens group includes a first doublet and a second doublet and the first doublet includes a lens formed from a first material and a lens formed from a second material, the first and second materials having different dispersions at $\lambda$, a third lens group having positive optical power positioned along the optical axis between the second lens group and the image region, wherein the third lens group includes a first doublet and a second doublet and the first doublet includes as lens formed from a third material and a lens formed from a fourth material, the third and fourth materials having different dispersions at $\lambda$, and a fourth lens group having positive optical power positioned along the optical axis between the third lens group and the image region. The first and second doublets of the second lens group are arranged symmetrically to the first and second doublets in the third lens group with respect to a plane perpendicular to the optical axis. The optical lens system forms a portion of a microlithography projection system.

In general, in a further aspect, the invention features an optical lens system for directing radiation at a wavelength $\lambda$ from an object region to an image region, the optical lens system having an optical axis. The optical lens system includes a first lens group having positive optical power positioned along the optical axis between the object region and the image region, a second lens group having positive optical power of a first value, the second lens group being positioned along the optical axis between the first lens group and the image region, wherein the second lens group includes a lens formed from a first material, a lens formed from a second material, and a lens formed from a third material, the first, second, and third materials having different dispersions at $\lambda$, a third lens group having positive optical power, the third lens group being positioned along the optical axis between the second lens group and the image region, and a fourth lens group having positive optical power positioned along the optical axis between the third lens group and the image region. The lenses in the second lens group are arranged symmetrically to lenses of the third lens group with respect to a pupil plane of the optical lens system. The optical lens system forms a portion of a microlithography projection system.

In general, in a further aspect, the invention features an optical lens system for directing radiation at wavelengths $\lambda$ and $\lambda'$ from an object region to an image region, the optical lens system having an optical axis. The optical lens system includes a plurality of lenses positioned along the optical axis between the object region and the image region, wherein at least half of a total number of lenses of the optical lens system are formed from fused silica, $|\lambda-\lambda'| \geq 20$ nm, and the optical lens system forms a portion of a microlithography projection system.

In general, in a further aspect, the invention features an optical lens system for directing radiation at a wavelength $\lambda$ from an object region to an image region, the optical lens system having an optical axis. The optical lens system includes plurality of lenses positioned along the optical axis between the object region and the image region. The optical lens system has maximum numerical aperture of 0.2 or less and a $\Gamma$ ratio of less than 0.33, and the optical lens system forms a portion of a microlithography projection system.

In general, in another aspect, the invention features a system that includes a mercury light source configured to emit radiation at multiple mercury emission lines, a projection objective positioned to receive radiation emitted by the mercury light source, and a stage configured to position a wafer relative to the projection objective. During operation, the projection objective directs radiation from the light source to the wafer, where the radiation at the wafer includes energy from more than one of the emission lines.

Embodiments can include one or more of the following advantages. For example, the optical lens systems disclosed herein can be used as a projection lens in a photolithography tool and can expose a wafer to radiation at more than one wavelength. Accordingly, radiation sources that emit radiation at more than one wavelength can be used more efficiently relative to systems which expose wafers to radiation at just one of the emission wavelengths of the source. As a result, higher power exposure can be used relative to such single wavelengths systems. In turn, the higher power exposure can reduce exposure times and increase throughput of the lithography tool.

Embodiments include designs that exhibit low chromatic aberration and other desirable imaging characteristics at more than one wavelength (e.g., two or three wavelengths) and utilize components made from a relative small number of different materials. For example, embodiments include optical lens systems formed from lenses composed from one of only two different types of material. Embodiments are also disclosed that include lenses composed from one of only three different types of material. In embodiments, the materials are all commercially available and the design of individual lenses manufacturable. In certain embodiments that include lenses of different materials, a large proportion of the lenses can be formed from a material that is readily commercially available at a quality sufficient for use in photolithography projections objectives. For example, in some embodiments, a large proportion (e.g., at least half) of the lenses can be formed from fused silica.

Embodiments also include optical lens systems having relatively low sensitivity to lens heating effects. Lens heating effects on the imaging properties of projection objectives can be reduced by using lens arrangements that include a reduced number of lenses at locations where the imaging radiation inhomogeneously illuminates the lens. Reduced sensitivity to heating effects can be achieved without active control, providing an economical approach to reducing this source of imaging errors.

Accordingly, commercially practical designs for projection objectives useful at more than one wavelength are disclosed.

Other features and advantages will be apparent from the description, drawings, and claims.

DESCRIPTION OF DRAWINGS

Like reference symbols in the various drawings indicate like elements.

DETAILED DESCRIPTION

Figure 1:
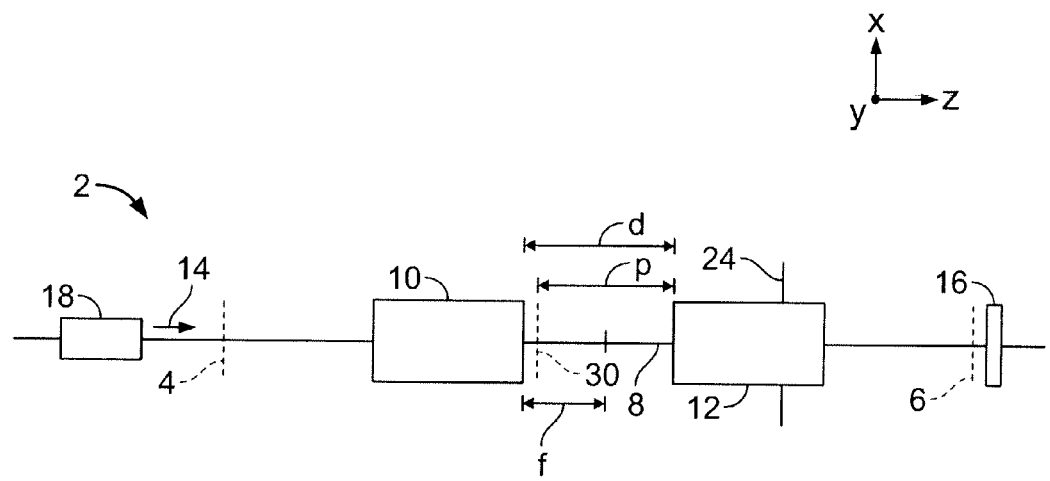
FIG. 1 is a schematic diagram of an embodiment of an optical lens system.

FIG. 1 is a schematic diagram of an embodiment of an optical lens system 2 for directing radiation from a source 18 to an article 16. Optical lens system 2 includes a first lens group 10 and a second lens group 12, each positioned along an optical axis 8 of optical lens system 2. Source 18 provides source radiation 14 propagating along optical axis 8 from source plane 4 to output plane 6, passing first through first lens group 10, and then through second lens group 12. Article 16 can be positioned in or near output plane 6 to receive the radiation.

Output plane 6 can be a focal plane of optical lens system 2. Alternatively, output plane 6 can be an image plane of optical lens system 2, or another type of plane with respect to optical lens system 2. For example, optical lens system 2 can form a portion of a microlithography optical lens system (e.g., a portion of a microlithography optical projection lens system), where source plane 4 is an object plane of the microlithography optical lens system and output plane 6 is an image plane of the microlithography optical lens system. Article 16, positioned in or near output plane 6, can be a substrate such as a wafer.

Optical lens system 2 can also include an element 24 such as an aperture stop for defining an aperture of the microlithography optical lens system. Element 24 can be positioned at a location along optical axis 8 to define an aperture. For example, in some embodiments, element 24 can be positioned within second lens group 12. In certain embodiments, element 24 can be positioned adjacent to output plane 6.

In some embodiments, optical lens system 2 can also include an aperture (not shown) such as an adjustable mask or diaphragm for defining an illumination aperture of the microlithography optical lens system. For example, an aperture can be used to provide dipole illumination, quadrupole illumination, annular illumination, or another type of illumination to the microlithography optical lens system.

Source radiation 14 provided by source 18 includes a distribution of radiation wavelength components. The distribution has a central wavelength $\lambda$ and a full-width at half maximum spectral bandwidth $\Delta\lambda$. Chromatic aberration arises in optical systems due to dispersion in optical components (e.g., a variation of a refractive index in each component with $\lambda$). Typically, the larger the spectral bandwidth $\Delta\lambda$ of source radiation 14, the larger the magnitude of chromatic aberration in an optical system.

Chromatic aberration can be described in terms of positions of a focus along optical axis 8 of three wavelength components within the spectral bandwidth $\Delta\lambda$ of source radiation 14. Such chromatic aberration is also referred to as longitudinal chromatic aberration, in contrast to horizontal chromatic aberration which refers to variations in the position of focus of different wavelengths in a direction perpendicular to the optical axis. The three wavelength components have wavelengths $\lambda_1$, $\lambda_2$, and $\lambda_3$, so that $\lambda_1 < \lambda_2 < \lambda_3$. For example, in some embodiments, source radiation can include radiation having wavelengths in the visible and near-UV regions of the electromagnetic spectrum, and the wavelengths $\lambda_1$, $\lambda_2$, and $\lambda_3$ can correspond to the i, h, and g spectral lines in the emission spectrum of atomic mercury. The mercury spectral i-line has a wavelength of 365.01 nm, the h-line has a wavelength of 404.65 nm, and the g-line has a wavelength of 435.84 nm.

A magnitude of chromatic aberration refers to a maximum length of a focal region along optical axis 8 in which the wavelength components in source radiation 14 are focused. For example, the wavelength components in source radiation 14, which span a spectral bandwidth $\Delta\lambda$, are focused to different positions along optical axis 8 due to wavelength-dependent dispersion of the various lens materials. Among the wavelength components of source radiation 14, one component will be focused by an optical lens system to a position along optical axis 8 that is nearer to the lens system than the focal position of any other wavelength component. Another wavelength component will be focused by the optical lens system to a position along optical axis 8 that is further away from the lens system than the focal position of any other wavelength component. The distance along optical axis 8 between the nearest and furthest focal positions of wavelength components of source radiation 14 is the magnitude of chromatic aberration of the optical lens system for source radiation 14. The position of focus of central wavelength $\lambda$ of source radiation 14 along optical axis 8 defines the position of output plane 6, which lies within the focal region.

A sign of chromatic aberration refers to a relative ordering of the wavelength components $\lambda_1$ and $\lambda_3$ along optical axis 8 and within a focal region of a lens system. For example, normal optical dispersion in lens materials causes shorter wavelength optical radiation components to focus at positions closer to the lens system along optical axis 8 than longer wavelength optical radiation components. Chromatic aberration that leads to radiation having a wavelength $\lambda_1$ focusing to a position along optical axis 8 that is nearer to the lens system than the focal position of radiation having a wavelength $\lambda_3$ along optical axis 8 is referred to as positive chromatic aberration. Negative chromatic aberration, on the other hand, causes radiation having a wavelength $\lambda_3$ to focus to a position along optical axis 8 that is nearer to the lens system than the focal position of radiation having a wavelength $\lambda_1$ along optical axis 8.

Various types of chromatic aberration can be corrected by the optical systems disclosed herein. A first type of chromatic aberration is primary chromatic aberration, which refers to a difference in focal positions along optical axis 108 between optical radiation components having wavelengths $\zeta_1$ and $\lambda_3$. Optical lens system 2 can be configured to correct for primary chromatic aberration by selectively adjusting the contributions to primary chromatic aberration from first lens group 10 and second lens group 12. When primary chromatic aberration is perfectly compensated, optical radiation components having wavelengths $\lambda_1$ and $\lambda_3$ are focused to a common position along optical axis 8 by optical lens system 2.

A second type of chromatic aberration is secondary chromatic aberration, which refers to a difference in focal positions along optical axis 108 between the common focus of wavelengths $\lambda_1$ and $\lambda_3$, and optical radiation having a wavelength $\lambda_2$. Secondary chromatic aberration can also be compensated by optical lens system 2 through suitable choice of materials, distances, and lens dimensions. When secondary chromatic aberration is perfectly compensated, optical radiation components having wavelengths $\lambda_1$, $\lambda_2$, and $\lambda_3$ are focused to a common position along optical axis 8 by optical lens system 2.

Higher order chromatic aberrations can also be present, and some embodiments of optical lens system 2 can be configured to correct for these higher order aberrations. For example, in certain embodiments, optical lens system 2 can correct for tertiary chromatic aberration. When tertiary chromatic aberration is perfectly compensated, optical radiation components having four different wavelengths are each focused to a common position along optical axis 8 by optical lens system 2. In general, chromatic aberration of a lens system includes primary chromatic aberration, secondary chromatic aberration, and higher-order chromatic aberrations (e.g., tertiary chromatic aberration).

First lens group 10 and second lens group 12 are configured to provide a selected chromatic aberration of optical lens system 2 with respect to output plane 6. First lens group 10 includes one or more lenses. Each individual lens in first lens group 10 produces chromatic aberration. Dimensions, spacings, and materials for the lenses in first lens group 10 are selected to produce a particular magnitude of a first chromatic aberration for first lens group 10. Second lens group 12 includes two or more lenses configured to produce a particular magnitude of a second chromatic aberration for second lens group 12. In certain embodiments, dimensions, spacings, and materials for the lenses in second lens group 12 are selected so that a difference between the magnitudes of the first and second chromatic aberrations is less than a wavelength (e.g., less than $\lambda$) of source radiation 14. Further, second lens group 12 is configured so that the second chromatic aberration has a sign that is opposite to a sign of the first chromatic aberration. That is, the second chromatic aberration can be selected to compensate for the first chromatic aberration.

In certain embodiments, the magnitude of the total chromatic aberration can be selected so that each of the optical radiation components having wavelengths $\lambda_1$, $\lambda_2$, and $\lambda_3$ is focused substantially to a common focal plane, e.g., output plane 6. In some embodiments, only paraxial rays having wavelengths $\lambda_1$, $\lambda_2$, and $\lambda_3$ can be focused to a common focal plane.

In some embodiments, the magnitude of the chromatic aberration of optical lens system 2 can vary according to the distance d between first lens group 10 and second lens group 12 along optical axis 8. Distance d can be chosen to produce a particular magnitude of the chromatic aberration of optical lens system 2 with respect to output plane 6. For example, d can be chosen so that a magnitude of a the chromatic aberration of optical lens system 2 with respect to output plane 6 is less than about a wavelength of source radiation 14. In some embodiments, d can be about five centimeters or more (e.g., about 10 centimeters or more, about 15 centimeters or more, about 20 centimeters or more).

In general, first lens group 10 can have a variety of configurations and can include various lenses. For example, in some embodiments, first lens group 10 can include two or more lenses, such as three lenses, or four lenses, or five lenses, or more than five lenses. In certain embodiments, for example, first lens group 10 can include only one lens. Each of the lenses can have concave surfaces, convex surfaces, or both concave and convex surfaces.

Second lens group 12 can also have a variety of configurations and can include various lenses. In general, second lens group 12 includes two or more lenses, e.g., three lenses, four lenses, five lenses, or more than five lenses. Each of the lenses can have concave surfaces, convex surfaces, or both concave and convex surfaces.

In some embodiments, a maximum diameter of the lenses in the first lens group is at least about 1.5 times greater than a maximum diameter of the lenses in the second lens group. For example, the maximum diameter of the lenses in the first lens group can be at least about two times (e.g., at least about three times, at least about four times) greater than a maximum diameter of the lenses in the second lens group. The maximum diameter of the lenses in the first lens group can be selected, for example, to allow optical lens system 2 to accommodate large diameter optical fields provided by source 18.

In some embodiments, a distance between a principal plane of first lens group 10 and the first lens of second lens group 12, measured along optical axis 8, is larger than a focal length of the first lens group. Principal planes are described, for example, in Michael J. Kidger, "Fundamental Optical Design", Chapter 2, SPIE Press, 2002. A principal plane of first lens group 10 can be determined as follows: a paraxial optical ray from source plane 4, propagating parallel to optical axis 8, enters first lens group 10. First lens group 10 focuses the optical ray, so that it emerges from first lens group 10 at an angle to optical axis 8. The ray is focused to a point on optical axis 8. By projecting the focused optical ray backward and the source optical ray forward, a point of intersection between the rays is determined. A plane extending through the point of intersection perpendicular to optical axis 8 is a principal plane of the optical system.

A principal plane 30 of first lens group 10 is shown in FIG. 1. A distance p between principal plane 30 and a first lens of second lens group 12 is larger than a focal length f of first lens group 10. In general, p can be at least about 5% larger than f (e.g., at least about 10% larger than f, at least about 20% larger than f, at least about 40% larger than f, at least about 60% larger than f, at least about 80% larger than f).

In certain embodiments, a surface of a lens in first lens group 10 that is nearest to source plane 4 (measured along optical axis 8) and that faces source plane 4 can be a concave surface. The concave surface can have a radius of curvature that is less than 130 mm, e.g., less than 120 mm, less than 110 mm, less than 100 mm, less than 90 mm, less than 70 mm, less than 50 mm. In other embodiments, the surface of the lens in first lens group 10 that is nearest to source plane 4 along optical axis 8 and that faces source plane 4 can be a convex surface. In some embodiments, a radius of curvature of the concave or convex lens surface can be larger than 130 mm, for example.

In some embodiments, a surface of a lens in first lens group 10 that is nearest to element 24 (measured along optical axis 8) and that faces element 24 can be a concave surface. The concave surface can have a radius of curvature that is less than 130 mm, e.g., less than 120 mm, less than 110 mm, less than 100 mm, less than 90 mm, less than 70 mm, less than 50 mm. In other embodiments, the surface of the lens in first lens group 10 that is nearest to element 24 along optical axis 8 and that faces element 24 can be a convex surface. In some embodiments, a radius of curvature of the concave or convex lens surface can be larger than 130 mm, for example.

In certain embodiments, first lens group 10 can be divided into a first lens subgroup having a negative optical power and a second lens subgroup having a positive optical power. Each of the first and second lens subgroups can include one or more lenses, for example. The first lens subgroup can be positioned optically upstream from the second lens subgroup, that is, the first lens subgroup can be positioned between source plane 4 and the second lens subgroup.

Source radiation 14 can have spatial intensity modulations in one or more directions transverse to optical axis 8. The spatial intensity modulations can define a source pattern. For example, the source pattern can be an image of a microlithography mask or reticle.

In some embodiments, optical lens system 2 can be configured to transfer the source pattern from source plane 4 to output plane 6, forming an image of the source pattern in output plane 6. The image can be used to expose a substrate, for example.

In general, lenses focus radiation from source plane 4 to an output surface rather than to an output plane. The output surface is, in general, a curved surface having a radius of curvature that is determined by the dimensions, materials, and arrangement of the lenses. When optical lens system 2 is configured to transfer a source pattern from source plane 4 to form an image of the source pattern in output plane 6, the image of the source pattern can be formed in a curved output surface. A curvature of the image is defined as a difference between a position of the center of the image in the curved output surface and a position of a point on an edge of the image in the curved output surface, measured in a direction parallel to optical axis 8. In some embodiments, first lens group 10 can be configured so that the curvature of the image is less than a depth of focus of optical lens system 2, where the depth of focus is a distance, measured in a direction parallel to optical axis 8, within which the image of the source pattern is in focus.

When optical lens system 2 is an imaging system, a magnification factor M of optical lens system 2 is defined as a ratio of a dimension, in a plane transverse to optical axis 8, of a source pattern in source plane 4 to a corresponding dimension of an image of the source pattern in output plane 6. In certain embodiments, M can be one. In some embodiments, M can be greater than one. For example, M can be at least about two (e.g., at least about three, at least about four, at least about five, at least about ten). As used herein, optical lens systems 2 with M larger than one are reduction optical lens systems, e.g., the image of the source pattern in output plane 6 is smaller than the source pattern in source plane 4.

In certain embodiments, optical lens system 2 can be telecentric. That is, optical lens system 2 can be configured so that translating first and second lens groups 10 and 12 along optical axis 8 with respect to source plane 4 produces an image of source radiation 14 in output plane 6, where the magnification factor M of optical lens system 2 is substantially unchanged as the distance between first lens group 10 and source plane 4 is varied. By translating first and second lens groups 10 and 12 along optical axis 8 with respect to source plane 4, the position of output plane 6 with respect to source plane 4 can be selected without significantly changing the magnification factor M of optical lens system 2.

In some embodiments, optical lens system 2 can include a manipulator (not shown) to adjust the magnification factor M of the system. In certain embodiments, the manipulator can be an actuator (e.g., an electromechanical actuator such as a piezoelectric actuator, a motor having a rotating shaft which moves in an axial direction, or another type of actuator) coupled to one or more movable components that can be used to adjust positions of various lenses in optical lens system 2. For example, the manipulator can include a lens mount configured to support one or more lenses, and attached to a movable stage. The lens mount can be positioned to support one or more lenses of first lens group 10 or second lens group 12. The lens mount can be translated along the direction of optical axis 8 either manually or in automated fashion. For example, the movable stage can be translated by a motor controlled by a computer. Computer control of the movable stage can be passive (e.g., during construction of optical lens system 2) and/or active (e.g., during operation of optical lens system 2).

In some embodiments, the dimensions, materials, and arrangement of lenses in first lens group 10 and in second lens group 12 can be selected to provide a particular numerical aperture for optical lens system 2. For example, a numerical aperture of optical lens system 2 can be at least about 0.1 (e.g., at least about 0.15, at least about 0.2, at least about 0.25, at least about 0.5) in output plane 6.

A field size of source radiation 14 is defined as a full-width at half maximum of an intensity distribution of source radiation 14 in output plane 6, measured along a direction in a plane transverse to optical axis 8. In some embodiments, a maximum field size can be about 10 millimeters or more. For example, the maximum field size can be about 20 millimeters or more (e.g., about 30 millimeters or more, about 50 millimeters or more, about 80 millimeters or more, about 90 millimeters or more, about 100 millimeters or more, about 120 millimeters or more). In certain embodiments, source radiation 14 has an intensity distribution in a plane transverse to optical axis 8 that is substantially circular. In other embodiments, the transverse intensity distribution of source radiation 14 has a non-circular shape such as an ellipse, for example.

A length L of optical lens system 2 is defined as a maximum distance along optical axis 8 between any two lenses in optical lens system 2. In some embodiments, L can be about 10 meters or less (e.g., about five meters or less, about four meters or less, about three meters or less, about two meters or less, about one meter or less).

In some embodiments, the length L is about 20 times or less the maximum field size of source radiation 14. For example, L can be about 16 times or less (e.g., about 14 times or less, about 12 times or less, about 10 times or less, about 8 times or less, about 6 times or less) the maximum field size of source radiation 14.

Lenses in optical lens system 2 can have spherical or aspherical surfaces. In general, the aspherical surfaces may have dimensions that are selected to eliminate or reduce certain imaging aberrations relative to optical lens systems that have only spherical lens surfaces. For example, optical lens system 2 can include at least one lens that has an aspherical surface. In certain embodiments, optical lens system 2 can include at least two lenses, each of which has at least one aspherical surface. For example, at least one of the lenses in first lens group 10 can have an aspherical surface, and at least one of the lenses in second lens group 12 can have an aspherical surface. Aspherical surfaces of lenses can be described by the equation:

$$P(h) = \frac{\delta \cdot h \cdot h}{1 + \sqrt{1 - (1 + CC) \cdot \delta \cdot \delta \cdot h \cdot h}} + C_1 h^4 + \ldots + C_n h^{2n+2}, \delta = \frac{1}{R} \quad (1)$$

where P(h) is a distance of the aspherical surface from a plane perpendicular to the optical axis as a function of a perpendicular distance h from the optical axis, and R is a radius of curvature of the lens at its apex. The parameter CC is the conic constant of the aspheric surface, and parameters $C_1$ to $C_n$ are aspheric constants.

In some embodiments, source 18 can be configured to provide broadband source radiation 14. For example, source radiation 14 can have a distribution of wavelengths of electromagnetic radiation with a spectral bandwidth Δλ of about 0.5 nanometer or more (e.g., about five nanometers or more, about 10 nanometers or more, about 25 nanometers or more, about 50 nanometers or more, about 70 nanometers or more). In some embodiments, source 14 can include one or more optical filter elements to select particular central wavelengths and/or bandwidths for source radiation 14. Filter elements can include interference filters, optical modulators such as liquid crystal modulators, and other elements that perform spectral filtering functions.

In certain embodiments, source radiation 14 can have at least one wavelength in the visible region of the electromagnetic spectrum. Alternatively, or in addition, source radiation 14 can have at least one wavelength in the ultraviolet region of the electromagnetic spectrum. For example, a central wavelength λ of source radiation 14 can be in the ultraviolet region of the electromagnetic spectrum, but source radiation 14 can also include one or more wavelengths in the visible region of the electromagnetic spectrum. Alternatively, for example, a central wavelength λ of source radiation 14 can be in the visible region of the electromagnetic spectrum, but source radiation 14 can also include one or more wavelengths in the ultraviolet region of the electromagnetic spectrum. In general, the central wavelength λ of source radiation 14 can be about 450 nm or less (e.g., about 400 nm or less, about 350 nm or less, about 300 nm or less, about 300 nm or less, about 250 nm or less, about 200 nm or less). In some embodiments, source radiation 14 includes significant power at two or more (e.g., three, four, five or more) discrete wavelengths. For example, source radiation 14 can include significant power at two or more wavelengths corresponding to emission lines of source 18. As an example, source radiation 14 can include significant power at the i-, h-, and g-emission lines of a mercury source.

Source 18 provides source radiation 14. In some embodiments, source 18 can be a mercury vapor lamp, for example. In some embodiments, source 18 can include light emitting diodes (LEDs). The diodes can all have a similar light emission spectrum or, alternatively, some or all of the diodes can have different emission spectra. The spectra can be complementary, so that the total spectral bandwidth $\Delta\lambda$ of source radiation 14 can be larger than an emission bandwidth of any of the individual diodes. In some embodiments, source 18 can include a laser system, such as a broadband laser system, for producing source radiation 14 with a suitable spectral bandwidth.

Figure 2A:
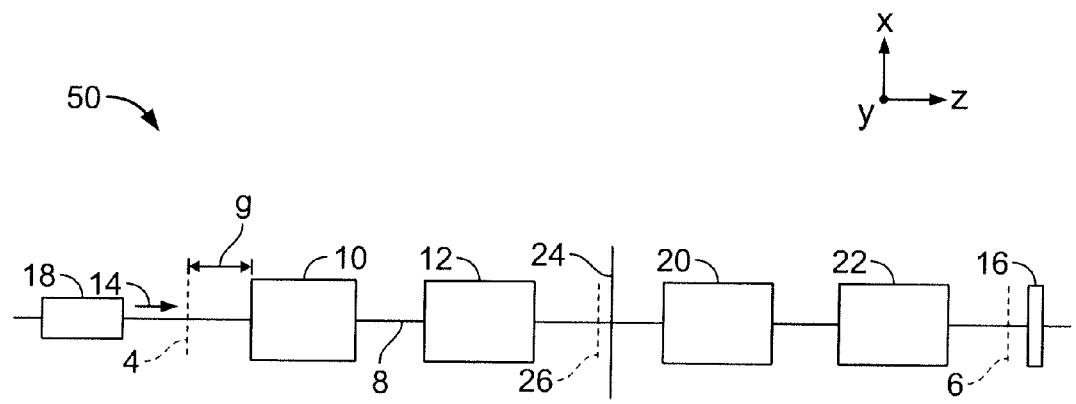
FIG. 2A is a schematic diagram of an embodiment of an optical lens system.

In some embodiments, optical lens systems includes more than two lens groups. FIG. 2A is a schematic diagram of an embodiment of an imaging optical lens system 50 that is configured as a imaging optical lens system. Optical lens system 50 is configured to transfer source radiation 14 emerging from spatial locations in source plane 4 to corresponding spatial locations in output plane 6. In some embodiments, optical lens system 50 can be configured as a telecentric imaging system (e.g., a double telecentric imaging system), so that a distance g between source plane 4 and first lens group 10 can be varied without changing a magnification factor M of optical lens system 50.

In addition to first lens group 10 and second lens group 12, optical lens system 50 also includes third lens group 20 and fourth lens group 22. Each of third lens group 20 and fourth lens group 22 can include one or more lenses positioned along optical axis 8. In general, the properties and features of third lens group 20 can be similar to the properties and features described above in connection with second lens group 12. Further, the properties and features of fourth lens group 22 can be similar to the properties and features described above in connection with first lens group 10.

In certain embodiments, optical lens system 50 can be a symmetric lens system, where first, second, third, and fourth lens groups 10, 12, 20, and 22 are symmetrically positioned about symmetry plane 26, which is perpendicular to optical axis 8. In a symmetric lens system, each lens in second lens group 12 has a similar corresponding lens in third lens group 20, and the lenses in the second and third lens groups 12 and 20 are symmetrically arranged along optical axis 8 with respect to symmetry plane 26. In addition, each lens in first lens group 10 has a similar corresponding lens in fourth lens group 22, and the lenses in the first and fourth lens groups 10 and 22 are symmetrically arranged along optical axis 8 with respect to symmetry plane 26. Similar lenses have the same design and are formed from the same material.

Figure 2B:
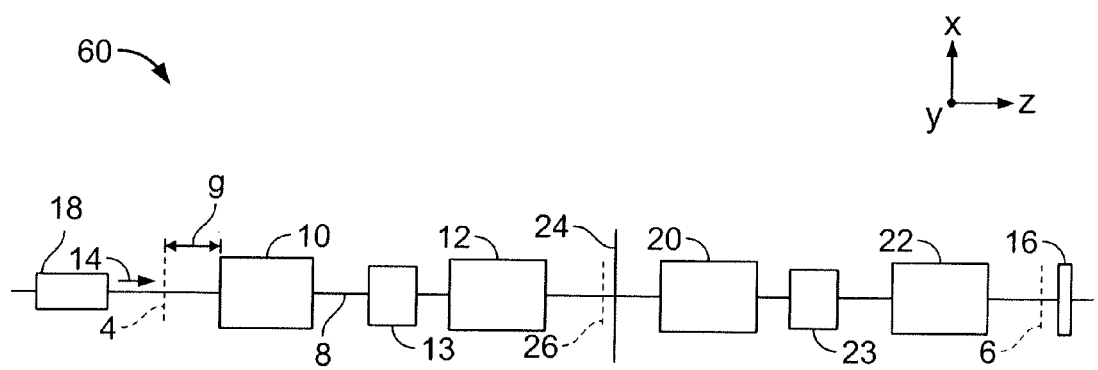
FIG. 2B is a schematic diagram of an embodiment of an optical lens system.

Referring to FIG. 2B, in certain embodiments, an optical lens system 60 is an imaging optical lens system that includes six lens groups, indicated as lens groups 10, 13, 12, 20, 23, and 22. Optical lens system 60 is be symmetric with respect to plane 26. In certain embodiments, symmetry plane 26 corresponds to a pupil plane of optical lens system 60.

In some embodiments, lens groups 10, 12, 20, and 22 are all positive lens groups. Lens group 10 helps to form an image of the entrance pupil, while lens group 12 helps to form an image of an object positioned at source plane 4. Lens groups 13 and 23 are negative lens groups, also arranged symmetrically with respect to plane 26. In general, lens groups 10, 12, 13, 20, 22, and 23 can each include one or more lenses.

In some embodiments, lens group 10 is includes a first lens subgroup (e.g., one or more lenses) having positive optical power and a second lens subgroup (e.g., one or more lenses) having negative optical power. The first and second lens subgroups can be designed as a retrofocus system, with the negative lens subgroup being position between source plane 4 and the positive lens subgroup. It is believed that such an arrangement can reduce image curvature of the optical lens system relative to other arrangements. Of course, being a symmetrical lens system, lens group 22 also includes a positive and negative lens subgroup arranged symmetrically relative to the first and second lens subgroups of lens group 10.

Furthermore, in certain embodiments, lens groups 10 and 22 can include a third lens subgroup (e.g., one or more lenses) in addition to the first and second lens subgroups. The third lens subgroups can have positive optical power and, in lens group 10, the third lens subgroup can be positioned between the negative lens subgroup and source plane 4. Correspondingly, the third lens subgroup in lens group 22 can be positioned between the negative lens subgroup and output plane 6. It is believed that a third lens subgroup having positive optical power can help reduce telecentricity errors and other field-dependent aberrations without the use of aspheric surfaces.

It is believed that chromatic aberration (e.g., primary and/or secondary chromatic aberration) of optical lens system 60 can be reduced by providing only weak correction of chromatic aberration in portions of the optical lens system where the marginal rays are located relatively far from optical axis 8. Typically, in optical lens system 60, the marginal rays have their maximum distance from optical axis 8 (measured perpendicularly from optical axis 8) in the region of lens groups 12 and 20. Accordingly, lens groups 12 and 20 can be designed so that these groups provide only weak correction (or overcorrection) of chromatic aberration.

In some embodiments, lens groups 12 and 20 include at least on positive-negative lens doublet (PN doublet) in which the positive lens displays relative weak dispersion while the negative lens displays relatively strong dispersion. In certain embodiments, lens groups 12 and 20 can each include more than one (e.g., two, three, four, more than four) positive-negative lens doublet.

A negative lens in one of the positive-negative lens doublets in lens groups 12 and 20 can be positioned closest to symmetry plane 26 on the respective sides of symmetry plane 26. It is believed that improved reduction in chromatic aberration can be achieved using such an arrangement. Furthermore, it is believed that such an arrangement can contribute to leveling the pupil image in optical lens system 60, which can result in improved preservation of the symmetry of all ray bundles in the system.

In general, lenses in optical lens systems 2, 50, and 60 are formed of materials that are selected based on criteria such as a material's dispersion, absorption properties, mechanical properties, chemical properties (e.g., purity), and on other criteria, such as commercial availability. Different lenses in the optical lens systems can be formed from different materials. For example, in embodiments, two or more different lens materials are used in order to reduce chromatic aberration.

Lens materials can be characterized in terms of their refractive index at a particular wavelength. Typically, a lens material has a refractive index in a range from about 1.4 to about 1.7, although certain materials have a refractive index higher than 1.7. Lens materials can also be characterized in terms of an Abbé number, V, which provides a characterization of the materials dispersion over a range of wavelengths. The Abbé number of a material can be calculated according to the formula:

$$V = \frac{n_2 - 1}{n_3 - n_1} \quad (2)$$

wherein $n_1$, $n_2$, and $n_3$ are the refractive index values of the material at wavelengths $\lambda_1$, $\lambda_2$, and $\lambda_3$, where $\lambda_1 < \lambda_2 < \lambda_3$. In general, a lower Abbé number is indicative of a material with relatively strong dispersion and a higher Abbé number is indicative of a material with a relatively weak dispersion.

Figure 3:
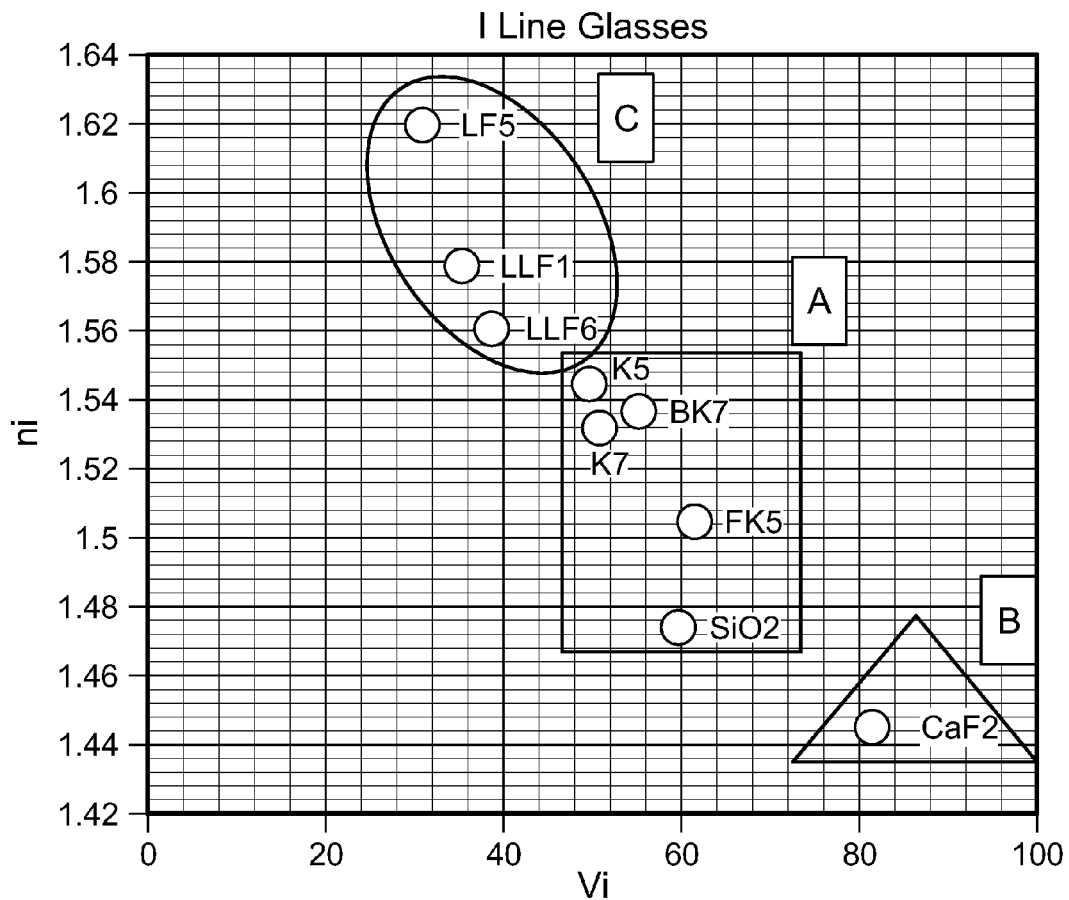
FIG. 3 is a plot comparing the refractive index and Abbé number of different materials.

Referring to FIG. 3, lens materials suitable for use with radiation in the UV can be categorized in three different groups based on their Abbé numbers and refractive indexes. A first group, designated group A, includes materials that have an Abbé number, Vi, in a range from 40 to 70, inclusive. Here, the Abbé number is calculated for wavelengths $\lambda_1$=365.01 nm, $\lambda_2$=404.65 nm, and $\lambda_3$=435.84 nm, which correspond to the respective i, h, g emission lines of a mercury source. The materials in group A have a refractive index in a range from 1.46 to 1.56. Materials in group A can include crown glasses, such fused silica ($SiO_2$) and borosilicate glasses (e.g., BK7 glass). Other examples include K5 glass, K7 glass, and FK5 glass.

A second group, designated group B, includes materials that have an Abbé number greater than 70. The materials in group B have a refractive index less than about 1.46. $CaF_2$ is an example of a material in group B.

A third group, designated group C, includes materials that have an Abbé number less than 40. The materials in group C have a refractive index greater than about 1.56. Materials in group C can include flint glasses, such as LLF-6 glass, LLF-1 glass, or LF-5 glass.

Generally, in order to reduce chromatic aberrations, an optical lens system should included lenses formed from at least two materials having different dispersions. Accordingly, embodiments are disclosed below that include at least one lens from two different groups shown in FIG. 3. Furthermore, it is believed that further reduction can be achieved using lenses formed from at least three materials having different dispersions. Accordingly, embodiments are disclosed below that include lenses formed from three different materials. For example, embodiments can include at least one lens formed from a material in group A, at least one lens formed from a material in group B, and at least one lens formed from a material in group C.

Referring to optical lens system 2, in some embodiments, some of the lenses in lens group 10 and/or in lens group 12 in optical lens system 2 can be made from a silica material such as UV-grade fused silica. Some of the lenses in first lens group 10 and/or in second lens group 12 can be made from a material in group C. In general, embodiments of optical lens system 2 can include at least one lens formed of a material in group B and at least one lens formed form a material in group A. For example, optical lens system 2 can include at least one lens formed of fused silica and at least one lens formed of LLF-1 glass.

In some embodiments, lens group 10 can include two lenses formed of different materials and having different dispersions with respect to a wavelength of source radiation 14. For example, at least one of the lenses in lens group 10 can be a lens formed of a material in group A (e.g., fused silica), and at least one other of the lenses in first lens group 10 can be a lens formed of a material in group C (e.g., LLF-1 glass). In embodiments, the lens formed form the material in group C can be positioned neared source plane 4.

Further, in some embodiments, lens group 12 can include two lenses formed of different materials and having different dispersions with respect to a wavelength of source radiation 14. For example, at least one of the lenses in second lens group 12 can be a lens formed of a material in group A (e.g., fused silica), and at least one other of the lenses in second lens group 12 can be a lens formed of a material in group C (e.g., LLF-1 glass). In certain embodiments, second lens group 12 can include at least one doublet of lenses, where a first lens of the doublet has a positive optical power and a second lens of the doublet has negative optical power. As discussed above with respect to optical lens system 60, in some embodiments, the positive lens can be formed of a material having relatively weak dispersion, such as a material in group A (e.g., BK7) or group B (e.g., $CaF_2$), while the negative lens is formed from a material having relatively strong dispersion, such as a material in group C (e.g., LLF-1 glass).

In certain embodiments, materials used for lenses can have very low optical absorption for wavelengths in source radiation 14. Absorption of radiation by lens materials can lead to thermal expansion of the lenses, producing changes in an index of refraction of the lens materials and changes in the shape of the lenses. By selecting lens materials such as silica and $CaF_2$ that absorb weakly the wavelengths in source radiation 14, effects due to thermal expansion of the lenses can be reduced. Materials such as silica and $CaF_2$ produce less secondary chromatic aberration than materials such as LLF-1 glass. Accordingly, in optical lens system 2, for example, the spacing d between first lens group 10 and second lens group 12 can be reduced relative to lens systems that include more secondary chromatic aberration.

In some embodiments, optical lens systems 2, 50, or 60 can be configured so that a magnitude of chromatic aberration is about a wavelength or less of source radiation 14 using lenses formed from only two different materials. For example, the optical lens systems can include at least one lens formed from a material from group A (e.g., fused silica) and at least one lens formed from a material from group C (e.g., LLF-1 glass).

Alternatively, in certain embodiments, optical lens systems 2, 50, or 60 can be configured so that a magnitude of chromatic aberration is about a wavelength or less of source radiation 14 using lenses formed from only three different materials. For example, the optical lens systems can include at least one lens formed from a material from group A (e.g., fused silica), at least one lens formed from a material from group B (e.g., $CaF_2$) and C at least one lens formed from a material from group C (e.g., LLF-1 glass).

In general, optical lens systems 2, 50, and 60 each include multiple lens groups, and each of the multiple lens groups can include one or multiple lenses. In each case, the lens groups can be configured to reduce a curvature of an image formed by the optical lens system to less than a depth of focus of the optical lens system. The dimensions and/or properties and/or materials and/or features disclosed in connection with first and second lens groups 10 and 12 can, in general, be shared by other lens groups and lenses thereof, as appropriate.

In certain embodiments, optical lens systems can be configured so that relatively few lenses are positioned at locations where the cross-sectional intensity distribution of the radiation is substantially inhomogeneous.

Figure 4A:
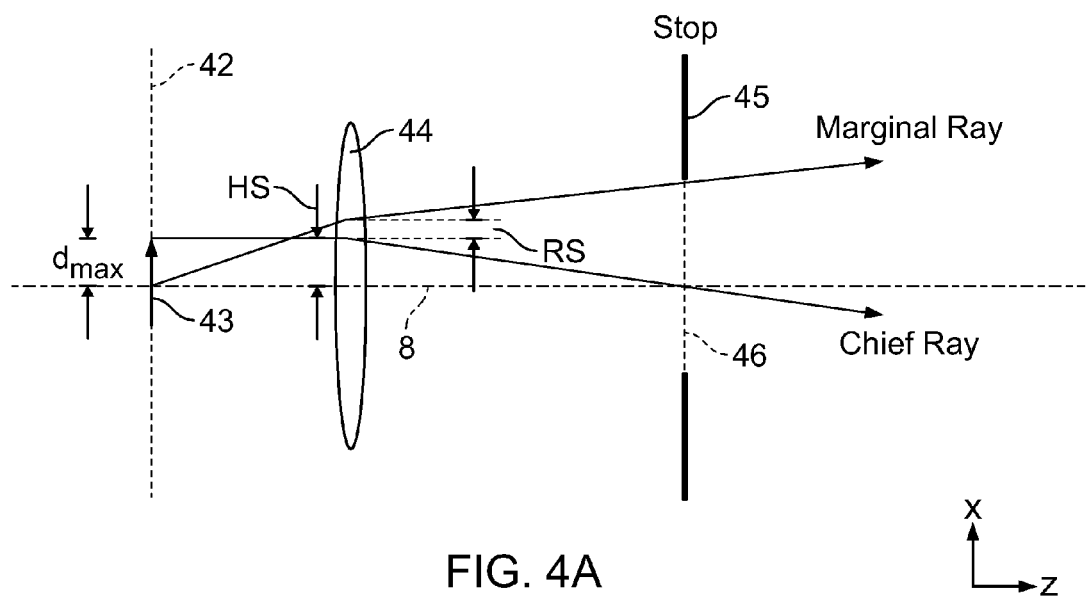
FIG. 4A is a schematic diagram of a portion of an optical lens system.

One way to characterize the cross-sectional intensity distribution of the radiation on a lens surface is from the ratio of the sub-aperture, SA, to the clear aperture, CA, of the radiation at each lens surface. The clear aperture, CA, at a lens surface refers to the area of the lens illuminated from all field points at the object region. The sub-aperture, SA, at a lens surface refers to the maximum area of the lens illuminated from a single field point at the object region. Referring to FIG. 4A, which shows an object 43, a lens 44, and a stop 45 of an optical lens system with maximum numerical aperture, $NA_{max}$, and maximum object size, $d_{max}$, the ratio SA/CA at lens position z can be approximated by:

$$\frac{SA}{CA}(z) \approx \frac{RS(z)}{RS(z) + HS(z)} \quad (3)$$

Here, HS(z) denotes the height of the marginal ray at position z. RS(z) is the difference between HS(z) and the height of the chief ray of the uppermost field point at position z (see, e.g., 'Fundamental Optical Design', by M. J. Kidger, p. 7). All quantities are defined in the meridian plane. For a rectangular field having a length, l, and a width, w, for example, $d_{max}$ is given as $$\sqrt{\left(\frac{l}{2}\right)^2 + \left(\frac{w}{2}\right)^2}.$$

Non-rectangular fields are also contemplated. For example, for a circular field, $d_{max}$ corresponds to the circle radius. For an elliptical field, $d_{max}$ corresponds to the radius along the semi-major axis. In general, the analysis disclosed herein can be applied to an arbitrary field size and shape. Further, note that in FIG. 4A, stop 45 is positioned at pupil plane 46 and object 43 is positioned at object region 42.

Typically, for a small SA/CA ratio (e.g., 0.2 or less), the lens is placed in the vicinity of the object region. Alternatively, if the SA/CA ratio is one the lens is positioned in the pupil plane.

In general, for a given projection objective the SA/CA ratio depends on the numerical aperture of the projection objective and the field size. That is, if a given lens system with possible maximum numerical aperture $NA_{max}$ is stopped down to a numerical aperture NA and if the maximum field size $d_{max}$ is reduced to field size d, then the ratio SA/CA typically changes. In order to avoid this dependency, a new quantity is defined which is unique for a given projection objective:

$$\left|\frac{SA}{CA}(z)\right|' = \frac{\frac{NA_{max}}{NA} RS(z)}{\frac{NA_{max}}{NA} RS(z) + \frac{d_{max}}{d} HS(z)} \quad (4)$$

An optical lens system can be characterized by averaged parameters related to the values of |SA/CA|' for each lens surface. For example, an optical lens system can be characterized by a parameter referred to as the $\Gamma$ ratio, which is determined as:

$$\Gamma = \frac{M_a}{M_b}, \quad (5)$$

where $M_a$ is the arithmetic mean of all |SA/CA|' values smaller than 0.6 for lenses positioned between the object region and the pupil plane of the optical lens system. $M_b$ is the arithmetic mean of all |SA/CA|' values equal to or larger than 0.6 for lenses positioned between the object region and the pupil plane of the optical lens system. Accordingly, the $\Gamma$ ratio provides a measure of the geometrical distribution of lenses within the optical lens system and therefore also a measure of the expected homogeneity of the intensity distribution onto the lenses.

Figure 4B:
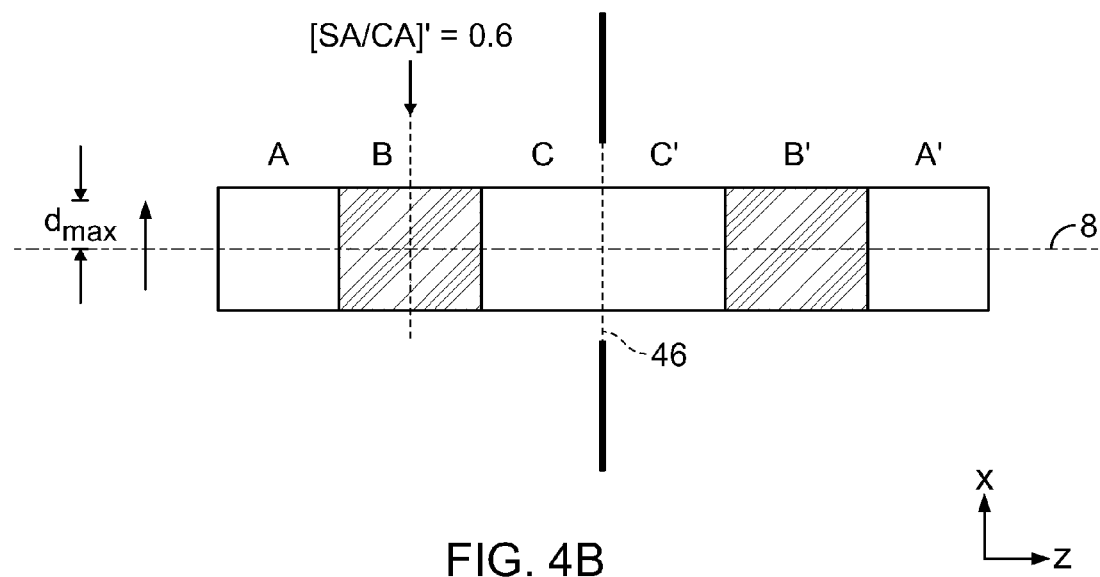
FIG. 4B is a schematic diagram of an embodiment of an optical lens system showing different regions of the lens system.

Referring also to FIG. 4B, an optical lens system can be considered to include three different zones between the object region and the pupil plane. These are shown as region A, B, and C in FIG. 4B. Correspondingly, the optical lens system includes regions C', B', and A' between the pupil plane and the image region. Regions A and A' are regions in which lenses have a relatively small |SA/CA|' values (e.g., less than 0.35). Regions C and C' are regions in which lenses have relatively large |SA/CA|' values (e.g., greater than 0.75). Regions B and B' are regions in which lenses have intermediate |SA/CA|' values (e.g., in a range from 0.35 to 0.75, inclusive).

In certain embodiments, optical lens systems can include relatively few lenses positioned between the object region and the pupil plane that have a surface with a |SA/CA|' value in a range from 0.35 to 0.75 (e.g., in a range from 0.4 to 0.7). For example, optical lens systems can include two or fewer (e.g., one or zero) lenses positioned between the object region and the pupil plane that have a surface with a |SA/CA|' value in a range from 0.35 to 0.75.

In some embodiments, a relatively small number of lenses in the optical lens system can include surfaces that contribute to $M_b$. In other words, a relatively small number of lenses positioned between the object region and the pupil plane have a |SA/CA|' value equal to or larger than 0.6. For example, optical lens systems can include no more than four (e.g., three or fewer, two or fewer) lenses that include surfaces that contribute to $M_b$. In certain embodiments, 40% or fewer (e.g., 35% or fewer, 30% or fewer, 25% or fewer, 20% or fewer) of the total number of lenses positioned between the object region and the pupil plane include surfaces that contribute to $M_b$.

It is believed that embodiments with relatively few lenses positioned at locations where the cross-sectional intensity distribution of the radiation is substantially inhomogeneous can exhibit reduced wavefront aberrations due to variations in the lenses due to heating by the radiation. For example, such optical lens systems can exhibit reduced variations in distortion, astigmatism, and/or coma over a range of input powers relative to other systems where the distribution of lenses along the optical axis relative to the image and object regions and pupil plane is different.

For example, where $\Gamma$ is small (e.g., where $M_a$ is relatively small, such as about 0.3 or less, and/or $M_b$ is relatively large, such as about 0.9 or more), then the lenses tend to be positioned either close to the object region and/or close to the pupil plane. In this case the intensity distribution on the lenses will be relatively homogeneous and, in turn, lens heating effects will be relatively small.

On the other hand, where $\Gamma$ is large (e.g., where $M_a$ is relatively large, such as about 0.31 or more, and/or $M_b$ is relatively small, such as about 0.85 or less), a larger proportion of lenses tend to be positioned in intermediate zone B, midway between the object region and the pupil plane where the illumination is relatively inhomogeneous across the lens surfaces. Here, the effect of lens heating on the imaging properties of an optical lens system can be relatively large.

In some embodiments, optical lens systems can have a $\Gamma$ ratio of less than 0.33 (e.g., 0.32 or less, 0.31 or less, 0.30 or less, 0.29 or less, 0.28 or less, 0.27 or less, 0.26 or less, 0.25 or less). Optical lens systems having a Γ ratio of less than 0.33 can have good lens heating properties. In other words, variations in imaging aberrations in optical lens systems with Γ ratios less than 0.33 can be relatively small over a range of input powers. For example, in embodiments where the optical lens system has an $NA_{max}$ of 0.2, a Γ ratio of less than 0.33 can correspond to good lens heating properties. In embodiments where the optical lens system has an $NA_{max}$ of 0.16, for example, a Γ ratio of less than 0.28 can correspond to good lens heating properties.

In general, as mentioned previously, the heating properties of an optical lens system depends on the size of the field. In certain embodiments, lenses in an optical lens system having a large field size should be arranged to have a relatively small Γ value compared to a similar lens with a smaller field size to provide a system with good heating properties. Referring to Table 1, exemplary ranges of Γ ratio are provided for optical lens systems with differing field sizes (given by $d_{max}$) and differing $NA_{max}$. These Γ ratios can correspond to optical lens systems with good heating properties. For example, in embodiments where the lenses are arranged symmetrically with respect to the pupil plane and the optical lens systems have a magnification of one, these ranges of Γ ratios for corresponding $NA_{max}$ values and field sizes can provide good heating properties.

The effect of lens heating on the imaging properties in an optical lens system can be characterized in a variety of ways. For example, the effects can be characterized by the variation of imaging aberrations as a function of radiation power input into the optical lens system at wavelength λ. An example of this is the variation in astigmatism over a range of input powers. This refers to the variation with input power in a distance between the focal position of a line extending along the x-direction intersecting the optical axis, and a line extending along the y-direction intersecting the optical axis. In some embodiments, optical lens systems can have a maximum astigmatism variation of 400 nm/W or less (e.g., 300 nm/W or less, 250 nm/W or less, 200 nm/W or less, 175 nm/W or less, 160 nm/W or less, 150 nm/W or less, 140 nm/W or less) at the image region for an input radiation power at the operational wavelength(s) up to 40 W.

A further example of how effects of lens heating can be characterized is the variation in the peak-to-valley focal plane deviation. The peak-to-valley focal plane deviation refers to the maximum variation in the focal position across the field as measured relative to the z-axis. In certain embodiments, optical lens systems can have a peak-to-valley focal plane deviation variation of 700 nm/W or less (e.g., 500 nm/W or less, 400 nm/W or less, 300 nm/W or less, 290 nm/W or less, 280 nm/W or less, 270 nm/W or less, 260 nm/W or less) at the image region for an input radiation power at the operational wavelength(s) up to 40 W.

Another parameter that can provide information about how effects of lens heating affect the imaging properties of an optical lens system is the variation in the peak-to-valley field curvature. Field curvature refers to the variation of focal position with field height. In certain embodiments, optical lens systems can have a peak-to-valley field curvature variation of 600 nm/W or less (e.g., 500 nm/W or less, 400 nm/W or less, 300 nm/W or less, 280 nm/W or less, 260 nm/W or less, 250 nm/W or less, 240 nm/W or less, 230 nm/W or less) at the image region for an input radiation power at the operational wavelength(s) up to 40 W.

Lens heating effects can also be characterized by variations in on-axis astigmatism of an optical lens system. On-axis astigmatism refers to a distance between the focal position of a line extending along the x-direction intersecting the optical axis, and a line extending along the y-direction intersecting the optical axis, where the distance is measured on-axis. In some embodiments, optical lens systems have a maximum on-axis astigmatism variation of −120 nm/W or less (e.g., −100 nm/W or less, −80 nm/W or less, −70 nm/W or less, −60 nm/W or less, −55 nm/W or less, −52 nm/W or less, −50 nm/W or less, −48 nm/W or less, −45 nm/W or less) at the image region for an input radiation power at the operational wavelength(s) up to 40 W. Here, the term "maximum" refers to the absolute value of the variation.

A further parameter that can provide information about how effects of lens heating affect the imaging properties of an optical lens system is variation in maximum distortion. Distortion refers to the variation in relative displacement of field points at the object and image regions. In some embodiments, optical lens systems have a maximum distortion variation of 12 nm/W or less (e.g., 10 nm/W or less, 9 nm/W or less, 8 nm/W or less, 7 nm/W or less, 6 nm/W or less, 5 nm/W or less, 4 nm/W or less) at the image region for an input radiation power at the operational wavelength(s) up to 40 W.

Maximum astigmatism, peak-to-valley focal plane deviation, peak-to-valley field curvature, on-axis astigmatism, and maximum distortion are determined for an optical lens system using computer modeling. Computer modeling can be performed as follows. First, ray tracing software (e.g., commercially-available ray tracing software such as Code V from ORA, Pasadena, Calif.) is used to determine a radiation load on each lens surface. This is performed by simply counting the rays that cross the surface. Using the appropriate absorption coefficients for each lens material, the amount of radiation absorbed by each lens can be calculated based on the radiation load.

For a number of differing incident power values, a finite element analysis can be used to solve the heat transport equation for each lens and calculate heat induced changes in the lens, such as a change of refractive index and/or a surface deformation. The heat induced changes result in a perturbed optical lens system for which additional imaging calculations can be performed. For example, ray tracing can be performed for an expected arial image can be simulated for structures of differing orientation at the object region and for different field points in the object region. The simulation of the arial image is based on two-beam interference accounting for the problem of partial coherence and takes the optical transfer function of the system into account. Using the simulated arial image, one can determine a best focus for the system, as well as a pattern shift in the x- and y-directions for the different structures.

Aberrations such as astigmatism, focal plane deviation, and other parameters, can be calculated to provide the information characterizing the heating of the optical lens system.

Optical lens systems 2, 50 and 60 can be used in microlithography systems. For example, optical lens system 2, 50, and/or optical lens system 60 can form a portion of a microlithography optical projection lens system. Optical lens systems 2, 50, and 60 can be configured so that output plane 6 of the optical lens system coincides with an image plane of the microlithography system. During use, an article 16 such as a substrate can be positioned in or near output plane 6, and source radiation 14 can be directed through optical lens system 2 and/or 50 to expose the substrate to the radiation.

Figure 5:
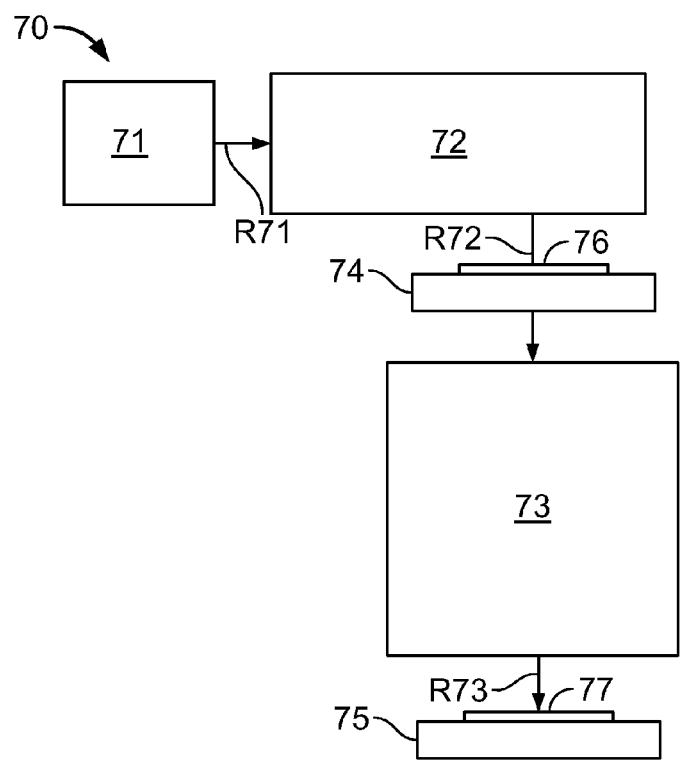
FIG. 5 is a schematic diagram of an embodiment of a microlithography system.

Referring to FIG. 5, an exemplary microlithography system 70 includes a source 71, an illumination system 72, a reticle 76 positioned on a reticle stage 74, an optical lens system 73, and a stage 75, which supports a wafer 77. Wafer 77 is positioned at the image region of optical lens system 73. Reticle 76 is positioned at the object region of optical lens system 73.

A layer of a resist (a light sensitive material) is disposed on the surface of wafer 77. During operation, source 71 directs radiation R71 to illumination system 72, which directs the radiation to reticle 76, as indicated by arrow R72. Optical lens system 73 projects an image of a pattern on reticle 76 onto the resist layer using the radiation, as indicated by arrow R73. Stage 75 moves wafer 77 relative to optical lens system 73, exposing different regions of the resist layer to the radiation.

Embodiments can be used in so-called "I-line" lithography tools which utilize the i-line of a mercury source. In such embodiments, the optical lens system can be designed to have low chromatic aberration at other wavelengths of the mercury source (e.g., at the g and h lines), allowing radiation at both the i-line and the other wavelengths to be used to expose the substrate. The additional wavelengths can provide higher power delivery to the substrate relative to systems which expose the substrate only to i-line radiation, allowing for shorter exposure time and increased throughput. For example, microlithography system 70 can have a throughput of about 125 30 mm diameter wafers per hour (WPH) or more (e.g., about 150 WPH or more, about 175 WPH or more, about 200 WPH or more, about 225 WPH or more, about 250 WPH or more).

In some embodiments, multiple substrates can be exposed to source radiation 14. For example, the multiple substrates can be multiple dies, and a field size of source radiation 14 can be sufficiently large so that multiple dies can be simultaneously exposed to the radiation.

We next discuss various embodiments of optical lens systems having different properties such as different numerical apertures in output plane 6 and different lens materials. Each of these optical lens systems can be used in microlithography systems.

Figure 6:
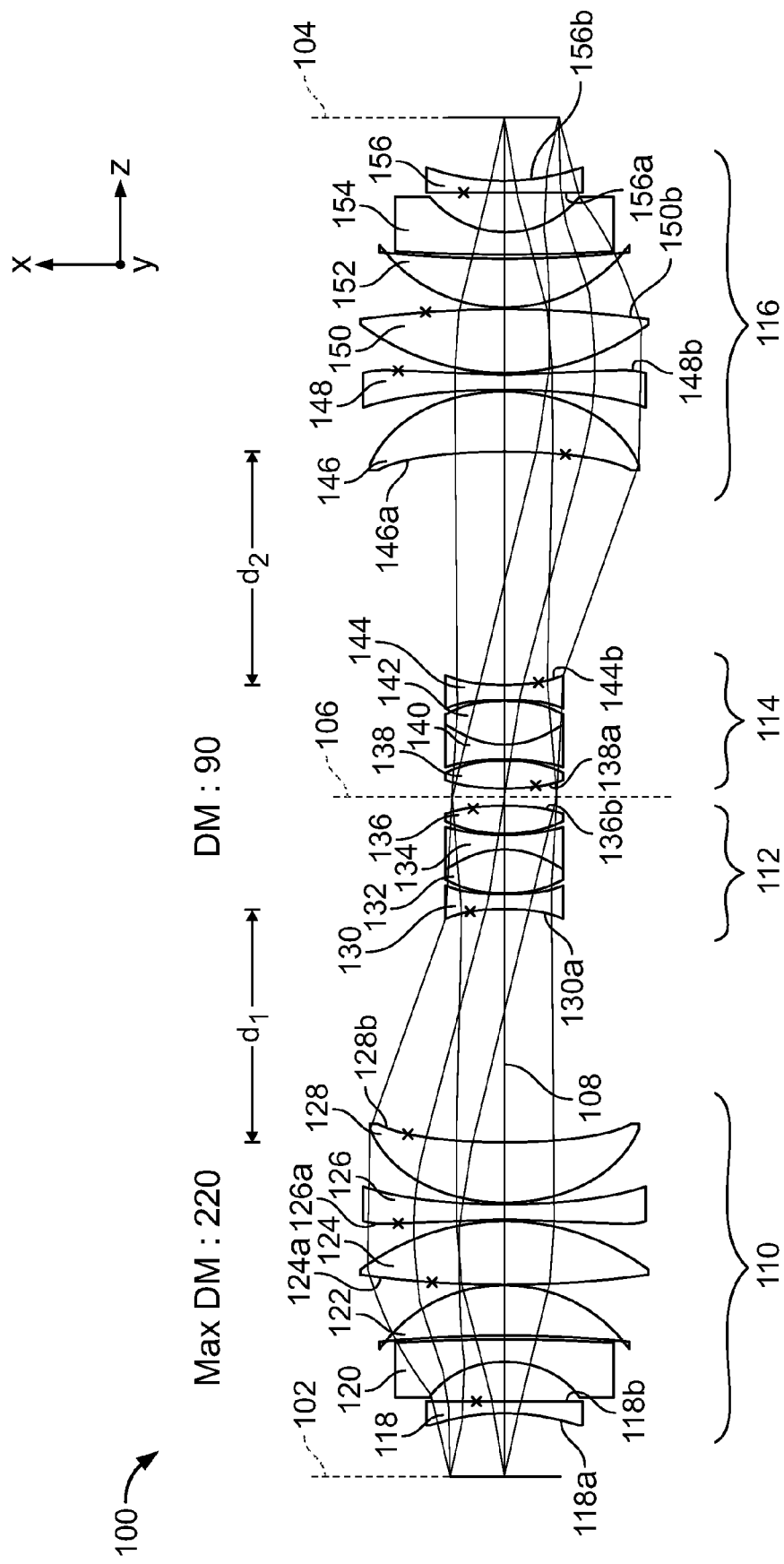
FIG. 6 is a schematic diagram of an embodiment of a imaging optical lens system.

An embodiment of a imaging optical lens system 100 is shown in FIG. 6. Optical lens system 100 is configured to transfer a light pattern from object plane 102 to image plane 104 through symmetry plane 106. Optical lens system 100 includes a first lens group 110, a second lens group 112, a third lens group 114, and a fourth lens group 116. Each of the lenses in the lens groups is rotationally symmetric about axis 108, which is parallel to the z-axis in the coordinate system shown. Optical lens system 100 is configured to provide a maximum numerical aperture of 0.20.

Optical lens system 100 has an $M_a$ value of 0.31, an $M_b$ value of 0.82, and a $\Gamma$ ratio of 0.38.

Each of the lenses in optical lens system 100 has a first surface facing object plane 102 and a second surface facing image plane 104. The first surface of each lens is denoted with an "a" label. For example, the first surface of lens 118 is labeled 118a. The second surface of each lens is denoted with a "b" label. Thus, the second surface of lens 118 is labeled 118b. Not all labels corresponding to first and second surfaces of the lenses in FIG. 6 are shown for purposes of clarity, but each lens includes first and second surfaces labeled "a" and "b", respectively.

First lens group 110 includes lenses 118, 120, 122, 124, 126, and 128. Lenses 118, 120, and 126 are formed of fused silica. Lenses 122, 124, and 128 are formed of a flint glass material such as LLF-1 glass. Thicknesses of the lenses in optical lens system 100 are measured along axis 108. Lens 118 has a thickness of 10.0 mm. Lens 120 has a thickness of 10.0 mm. Lens 122 has a thickness of 41.1 mm. Lens 124 has a thickness of 47.3 mm. Lens 126 has a thickness of 10.0 mm. Lens 128 has a thickness of 45.2 mm.

Spacings between two lenses are measured between facing surfaces of the two lenses along axis 108. Lens 118 is spaced from lens 120 by a distance of 29.6 mm. Lens 120 is spaced from lens 122 by a distance of 3.6 mm. Lens 122 is spaced from lens 124 by a distance of 1.0 mm. Lens 124 is spaced from lens 126 by a distance of 1.0 mm. Lens 126 is spaced from lens 128 by a distance of 1.0 mm. First lens group 110 is spaced from second lens group 112 by a distance $d_1$ measured along axis 108 (e.g., a distance measured between surfaces 128b and 130a along axis 108) of 171.2 mm.

Second lens group 112 includes lenses 130, 132, 134, and 136. Lenses 132 and 136 are formed of fused silica. Lenses 130 and 134 are formed of a flint glass such as LLF-1 glass. Lens 130 has a thickness of 10.0 mm. Lens 132 has a thickness of 33.0 mm. Lens 134 has a thickness of 10.0 mm. Lens 136 has a thickness of 20.0 mm.

Lens 130 is spaced from lens 132 by a distance of 1.0 mm. Lenses 132 and 134 are immediately adjacent along axis 108. Lens 134 is spaced from lens 136 by a distance of 1.0 mm. Second lens group 112 is spaced from symmetry plane 106 by a distance (e.g., a distance measured between surface 136b and symmetry plane 106 along axis 108) of 5.8 mm.

Third lens group 114 includes lenses 138, 140, 142, and 144. Lenses 138 and 142 are formed of fused silica. Lenses 140 and 144 are formed of a flint glass such as LLF-1 glass. Lens 138 has a thickness of 20.0 mm. Lens 140 has a thickness of 10.0 mm. Lens 142 has a thickness of 33.0 mm. Lens 144 has a thickness of 10.0 mm.

Third lens group 114 is spaced from symmetry plane 106 by a distance (e.g., a distance measured between symmetry plane 106 and surface 138a along axis 108) of 5.8 mm. Lens 138 is spaced from lens 140 by a distance of 1.0 mm. Lenses 140 and 142 are immediately adjacent along axis 108. Lens 142 is spaced from lens 144 by a distance of 1.0 mm. Third lens group 114 is spaced from fourth lens group 116 by a distance $d_2$ measured along axis 108 (e.g., a distance measured between surfaces 144b and 146a along axis 108) of 171.2 mm.

The dimensions, spacings, and materials of lenses in third lens group 114 are similar to the dimensions, spacings, and materials of lenses in second lens group 112. The lenses in third lens group 114 are positioned along axis 108 so that second lens group 112 and third lens group 114 form an arrangement of lenses that is symmetric with respect to symmetry plane 106.

Fourth lens group 116 includes lenses 146, 148, 150, 152, 154, and 156. Lenses 148, 154, and 156 are formed of fused silica. Lenses 146, 150, and 152 are formed of a flint glass such as LLF-1 glass. Lens 146 has a thickness of 45.2 mm. Lens 148 has a thickness of 10.0 mm. Lens 150 has a thickness of 47.3 mm. Lens 152 has a thickness of 41.1 mm. Lens 154 has a thickness of 10.0 mm. Lens 156 has a thickness of 10.0 mm.

Lens 146 is spaced from lens 148 by a distance of 1.0 mm. Lens 148 is spaced from lens 150 by a distance of 1.0 mm. Lens 150 is spaced from lens 152 by a distance of 1.0 mm. Lens 152 is spaced from lens 154 by a distance of 3.6 mm. Lens 154 is spaced from lens 156 by a distance of 29.6 mm. Fourth lens group 116 is spaced from image plane 104 by a distance (e.g., a distance measured between surface 156b and image plane 104 along axis 108) of 48.1 mm.

The dimensions, spacings, and materials of lenses in fourth lens group 116 are similar to the dimensions, spacings, and materials of lenses in first lens group 110. The lenses in fourth lens group 116 are positioned along axis 108 so that first lens group 110 and fourth lens group 116 form an arrangement of lenses that is symmetric with respect to symmetry plane 106.

Lens data, including a radius of curvature of each of the surfaces of each of the lenses in optical lens system 100, is shown in Table 2A. The radius of curvature of a lens surface is negative if the center of curvature of the lens surface is on the same side of the lens surface as object plane 102. The radius of curvature of a lens surface is positive if the center of curvature of the lens surface is on the same side of the lens surface as image plane 104.

Some of the surfaces of the lenses in optical lens system 100 are aspherical surfaces. Specifically, surfaces 118b, 124a, 126a, 128b, 130a, 136b, 138a, 144b, 146a, 148b, 150b, and 156a are aspherical surfaces. The other lens surfaces in optical lens system 100 are spherical surfaces. Aspherical surfaces are identified in Table 2A as having a shape "AS". Aspheric constants corresponding to Equation 1 for the aspherical surfaces of lenses in optical lens system 100 are shown in Table 2B.

A principal plane 160 of first lens group 110 is shown in optical lens system 100. The principal plane lies between first lens group 110 and second lens group 112.

Figure 7:
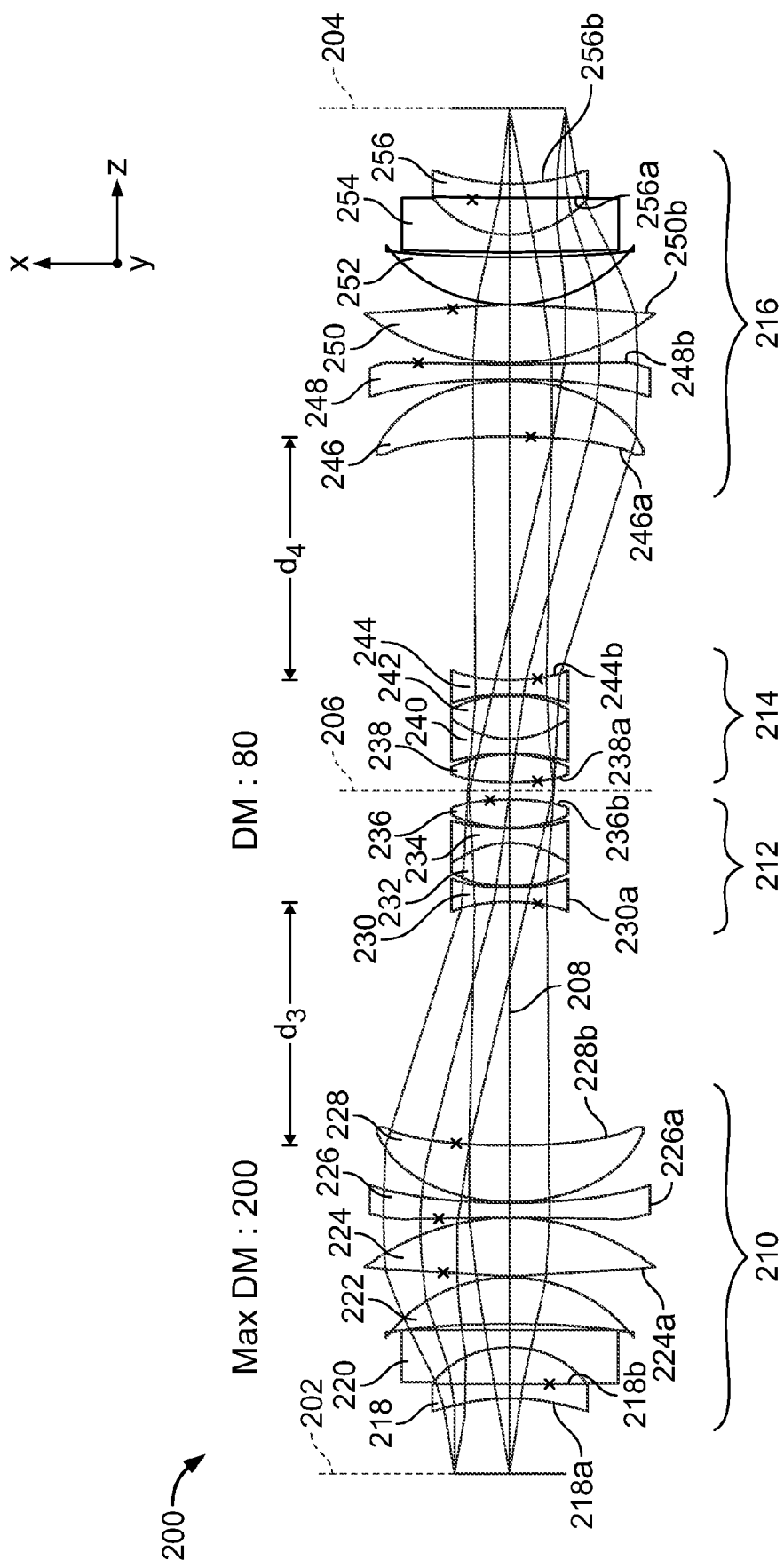
FIG. 7 is a schematic diagram of an embodiment of a imaging optical lens system.

Another embodiment of a imaging optical lens system is shown in FIG. 7. Optical lens system 200 is configured to transfer a light pattern from object plane 202 to image plane 204 through symmetry plane 206. Optical lens system 200 includes a first lens group 210, a second lens group 212, a third lens group 214, and a fourth lens group 216. Each of the lenses in the lens groups is positioned symmetrically about axis 208, which is parallel to the z-axis in the coordinate system shown. Optical lens system 200 is configured to provide a maximum numerical aperture of 0.16.

Optical lens system 200 has an $M_a$ value of 0.28, an $M_b$ value of 0.8, and a $\Gamma$ ratio of 0.35.

Each of the lenses in optical lens system 200 has a first surface facing object plane 202 and a second surface facing image plane 204. The first surface of each lens is denoted with an "a" label. For example, the first surface of lens 218 is labeled 218a. The second surface of each lens is denoted with a "b" label. Thus, the second surface of lens 218 is labeled 218b. Not all labels corresponding to first and second surfaces of the lenses in FIG. 7 are shown for purposes of clarity, but each lens includes first and second surfaces labeled "a" and "b", respectively.

First lens group 210 includes lenses 218, 220, 222, 224, 226, and 228. Lenses 218, 220, and 226 are formed of fused silica. Lenses 222, 224, and 1228 are formed of a flint glass such as LLF-1 glass. Thicknesses of the lenses in optical lens system 200 are measured along axis 208. Lens 218 has a thickness of 10.0 mm. Lens 220 has a thickness of 10.0 mm. Lens 222 has a thickness of 38.4 mm. Lens 224 has a thickness of 43.1 mm. Lens 226 has a thickness of 10.0 mm. Lens 228 has a thickness of 40.3 mm.

Spacings between two lenses are measured between facing surfaces of the two lenses along axis 208. Lens 218 is spaced from lens 220 by a distance of 27.1 mm. Lens 220 is spaced from lens 222 by a distance of 4.0 mm. Lens 222 is spaced from lens 224 by a distance of 1.0 mm. Lens 224 is spaced from lens 226 by a distance of 1.0 mm. Lens 226 is spaced from lens 228 by a distance of 1.0 mm. First lens group 210 is spaced from second lens group 212 by a distance $d_3$ measured along axis 208 (e.g., a distance measured between surfaces 228b and 230a along axis 208) of 178.2 mm.

Second lens group 212 includes lenses 230, 232, 234, and 236. Lenses 232 and 236 are formed of fused silica. Lenses 230 and 234 are formed of a flint glass such as LLF-1 glass. Lens 230 has a thickness of 10.0 mm. Lens 232 has a thickness of 33.0 mm. Lens 234 has a thickness of 10.0 mm. Lens 236 has a thickness of 20.0 mm.

Lens 230 is spaced from lens 232 by a distance of 1.0 mm. Lenses 232 and 234 are immediately adjacent along axis 208. Lens 234 is spaced from lens 236 by a distance of 1.0 mm. Second lens group 212 is spaced from symmetry plane 206 by a distance (e.g., a distance measured between surface 236b and symmetry plane 206 along axis 208) of 6.0 mm.

Third lens group 214 includes lenses 238, 240, 242, and 244. Lenses 238 and 242 are formed of fused silica. Lenses 240 and 244 are formed of a flint glass such as LLF-1 glass. Lens 238 has a thickness of 20.0 mm. Lens 240 has a thickness of 10.0 mm. Lens 242 has a thickness of 33.0 mm. Lens 244 has a thickness of 10.0 mm.

Third lens group 214 is spaced from symmetry plane 206 by a distance (e.g., a distance measured between symmetry plane 206 and surface 238a along axis 208) of 6.0 mm. Lens 238 is spaced from lens 240 by a distance of 1.0 mm. Lenses 240 and 242 are immediately adjacent along axis 208. Lens 242 is spaced from lens 244 by a distance of 1.0 mm. Third lens group 214 is spaced from fourth lens group 216 by a distance $d_4$ measured along axis 208 (e.g., a distance measured between surfaces 244b and 246a along axis 208) of 178.2 mm.

The dimensions, spacings, and materials of lenses in third lens group 214 are similar to the dimensions, spacings, and materials of lenses in second lens group 212. The lenses in third lens group 214 are positioned along axis 208 so that second lens group 212 and third lens group 214 form an arrangement of lenses that is symmetric with respect to symmetry plane 206.

Fourth lens group 216 includes lenses 246, 248, 250, 252, 254, and 256. Lenses 248, 254, and 256 are formed of fused silica. Lenses 246, 250, and 252 are formed of a flint glass such as LLF-1 glass. Lens 246 has a thickness of 40.3 mm. Lens 248 has a thickness of 10.0 mm. Lens 250 has a thickness of 43.1 mm. Lens 252 has a thickness of 38.4 mm. Lens 254 has a thickness of 10.0 mm. Lens 256 has a thickness of 10.0 mm.

Lens 246 is spaced from lens 248 by a distance of 1.0 mm. Lens 248 is spaced from lens 250 by a distance of 1.0 mm. Lens 250 is spaced from lens 252 by a distance of 1.0 mm. Lens 252 is spaced from lens 254 by a distance of 4.0 mm. Lens 254 is spaced from lens 256 by a distance of 27.1 mm. Fourth lens group 216 is spaced from image plane 204 by a distance (e.g., a distance measured between surface 256b and image plane 204 along axis 208) of 54.9 mm.

The dimensions, spacings, and materials of lenses in fourth lens group 216 are similar to the dimensions, spacings, and materials of lenses in first lens group 210. The lenses in fourth lens group 216 are positioned along axis 208 so that first lens group 210 and fourth lens group 216 form an arrangement of lenses that is symmetric with respect to symmetry plane 206.

Lens data, including a radius of curvature of each of the surfaces of each of the lenses in optical lens system 200, is shown in Table 3A.

Some of the surfaces of the lenses in optical lens system 200 are aspherical surfaces. Specifically, surfaces 218b, 224a, 226a, 228b, 230a, 236b, 238a, 244b, 246a, 248b, 250b, and 256a are aspherical surfaces. The other lens surfaces in optical lens system 200 are spherical surfaces. Aspherical surfaces are identified in Table 3A as having a shape "AS". Aspheric constants corresponding to Equation 1 for the aspherical surfaces of lenses in optical lens system 200 are shown in Table 3B.

Lenses are generally formed from one or more optical materials that absorb a portion of the light passing therethrough. Absorption of significant quantities of radiation by certain lenses can lead to thermal expansion of the lenses, which can produce changes in the geometrical and optical properties of the lenses. For example, the focusing properties of some lenses can change as a result of expansion or contraction due to heating or cooling of the lenses. In some embodiments, some or all of the materials from which the lenses are formed can be selected based, in part, on their optical absorption properties. For example, for a lens system designed to operate in the UV portion of the electromagnetic spectrum, lens materials that have relatively low UV absorption (e.g., materials such as fused silica, calcium fluoride, and others) can be used.

Figure 8:
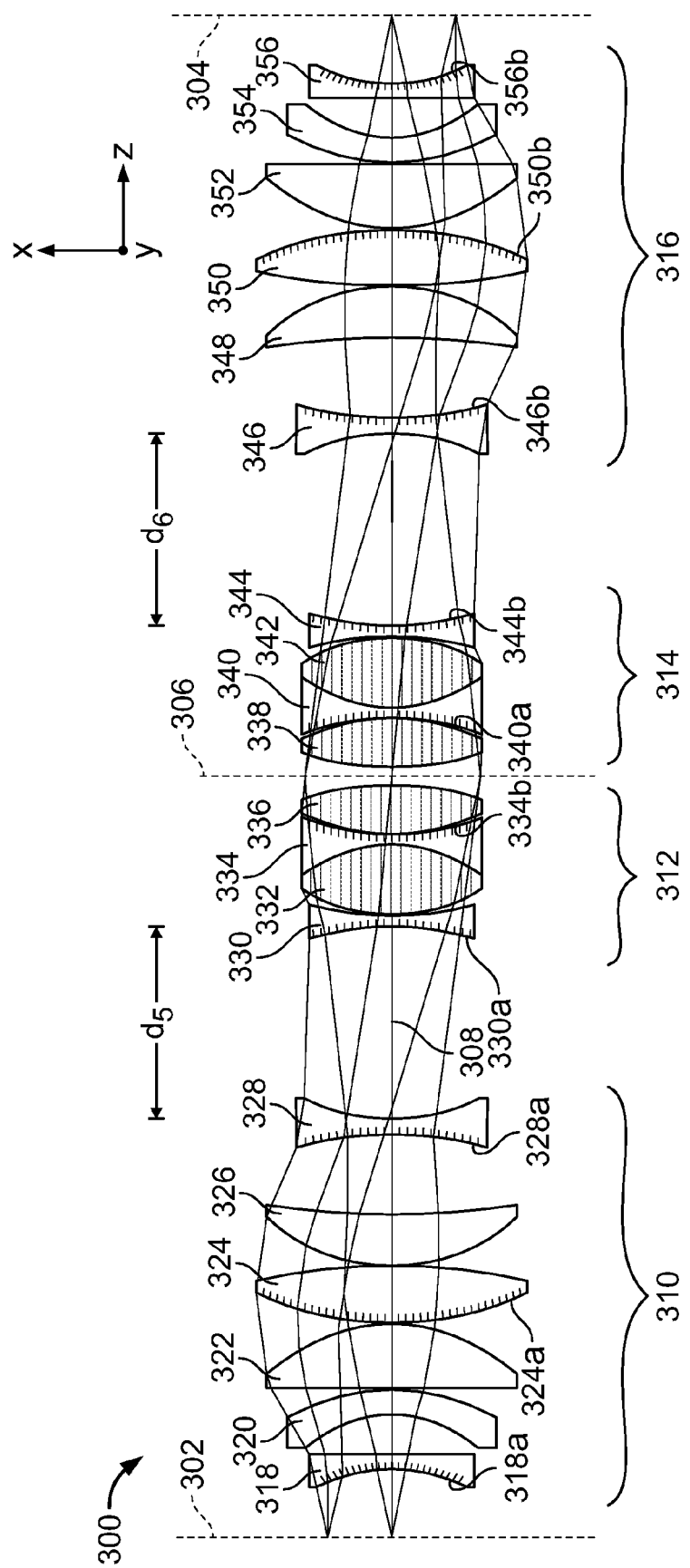
FIG. 8 is a schematic diagram of an embodiment of a imaging optical lens system.

An embodiment of a imaging optical lens system 300 having lenses formed of materials with relatively low absorption in the UV region of the spectrum is shown in FIG. 8. Optical lens system 300 is configured to transfer a light pattern from object plane 302 to image plane 304 through symmetry plane 306. Optical lens system 300 includes a first lens group 310, a second lens group 312, a third lens group 314, and a fourth lens group 316. Each of the lenses in the lens groups is rotationally symmetric about axis 308, which is parallel to the z-axis in the coordinate system shown. Optical lens system 300 is configured to provide a maximum numerical aperture of 0.20.

Optical lens system 300 has an $M_a$ value of 0.34, an $M_b$ value of 0.89, and a Γ ratio of 0.38.

Each of the lenses in optical lens system 300 has a first surface facing object plane 302 and a second surface facing image plane 304. The first surface of each lens is denoted with an "a" label. For example, the first surface of lens 318 is labeled 318a. The second surface of each lens is denoted with a "b" label. Thus, the second surface of lens 318 is labeled 318b. Not all labels corresponding to first and second surfaces of the lenses in FIG. 8 are shown for purposes of clarity, but each lens includes first and second surfaces labeled "a" and "b", respectively.

First lens group 310 includes lenses 318, 320, 322, 324, 326, and 328. Lenses 318, 320, 322, 324 and 326 are formed of fused silica. Thicknesses of the lenses in optical lens system 300 are measured along axis 308. Lens 318 has a thickness of 10.0 mm. Lens 320 has a thickness of 16.4 mm. Lens 322 has a thickness of 42.0 mm. Lens 324 has a thickness of 35.9 mm. Lens 326 has a thickness of 32.6 mm. Lens 328 has a thickness of 10.0 mm.

Spacings between two lenses are measured between facing surfaces of the two lenses along axis 308. Lens 318 is spaced from lens 320 by a distance of 25.6 mm. Lens 320 is spaced from lens 322 by a distance of 1.0 mm. Lens 322 is spaced from lens 324 by a distance of 1.0 mm. Lens 324 is spaced from lens 326 by a distance of 1.0 mm. Lens 326 is spaced from lens 328 by a distance of 54.5 mm. First lens group 310 is spaced from second lens group 312 by a distance $d_5$ measured along axis 308 (e.g., a distance measured between surfaces 328b and 330a along axis 308) of 127.3 mm.

Second lens group 312 includes lenses 330, 332, 334, and 336. Lenses 330 and 334 are formed of fused silica. Lenses 332 and 336 are formed of calcium fluoride. Lens 330 has a thickness of 7.0 mm. Lens 332 has a thickness of 44.3 mm. Lens 334 has a thickness of 7.0 mm. Lens 336 has a thickness of 31.9 mm.

Lens 330 is spaced from lens 332 by a distance of 1.0 mm. Lens 332 is spaced from lens 334 by a distance of 1.3 mm. Lens 334 is spaced from lens 336 by a distance of 0.1 mm. Second lens group 312 is spaced from symmetry plane 306 by a distance (e.g., a distance measured between surface 336b and symmetry plane 306 along axis 308) of 5.0 mm.

Third lens group 314 includes lenses 338, 340, 342, and 344. Lenses 338 and 342 are formed of calcium fluoride. Lenses 340 and 344 are formed of fused silica. Lens 338 has a thickness of 31.9 mm. Lens 340 has a thickness of 7.0 mm. Lens 342 has a thickness of 44.3 mm. Lens 344 has a thickness of 7.0 mm.

Third lens group 314 is spaced from symmetry plane 306 by a distance (e.g., a distance measured between symmetry plane 306 and surface 338a along axis 308) of 5.0 mm. Lens 338 is spaced from lens 340 by a distance of 0.1 mm. Lens 340 is spaced from lens 342 by a distance of 1.3 mm. Lens 342 is spaced from lens 344 by a distance of 1.0 mm. Third lens group 314 is spaced from fourth lens group 316 by a distance $d_6$ measured along axis 308 (e.g., a distance measured between surfaces 344b and 346a along axis 308) of 127.3 mm.

The dimensions, spacings, and materials of lenses in third lens group 314 are similar to the dimensions, spacings, and materials of lenses in second lens group 312. The lenses in third lens group 314 are positioned along axis 308 so that second lens group 312 and third lens group 314 form an arrangement of lenses that is symmetric with respect to symmetry plane 306.

Fourth lens group 316 includes lenses 346, 348, 350, 352, 354, and 356. Each of lenses 346, 348, 350, 352, 354, and 356 is formed of fused silica. Lens 346 has a thickness of 10.0 mm. Lens 348 has a thickness of 32.6 mm. Lens 350 has a thickness of 35.9 mm. Lens 352 has a thickness of 42.0 mm. Lens 354 has a thickness of 16.4 mm. Lens 356 has a thickness of 10.0 mm.

Lens 346 is spaced from lens 348 by a distance of 54.5 mm. Lens 348 is spaced from lens 350 by a distance of 1.0 mm. Lens 350 is spaced from lens 352 by a distance of 1.0 mm. Lens 352 is spaced from lens 354 by a distance of 1.0 mm. Lens 354 is spaced from lens 356 by a distance of 25.6 mm. Fourth lens group 316 is spaced from image plane 304 by a distance (e.g., a distance measured between surface 356b and image plane 304 along axis 308) of 45.0 mm.

The dimensions, spacings, and materials of lenses in fourth lens group 316 are similar to the dimensions, spacings, and materials of lenses in first lens group 310. The lenses in fourth lens group 316 are positioned along axis 308 so that first lens group 310 and fourth lens group 316 form an arrangement of lenses that is symmetric with respect to symmetry plane 306.

Lens data, including a radius of curvature of each of the surfaces of each of the lenses in optical lens system 300, is shown in Table 4A. The radius of curvature of a lens surface is negative if the center of curvature of the lens surface is on the same side of the lens surface as object plane 302. The radius of curvature of a lens surface is positive if the center of curvature of the lens surface is on the same side of the lens surface as image plane 304.

Some of the surfaces of the lenses in optical lens system 300 are aspherical surfaces. Specifically, surfaces 318a, 324a, 328a, 330a, 334b, 340a, 344b, 346b, 350b, and 356b are aspherical surfaces. The other lens surfaces in optical lens system 300 are spherical surfaces. Aspherical surfaces are identified in Table 4A as having a shape "AS". Aspheric constants corresponding to Equation 1 for the aspherical surfaces of lenses in optical lens system 300 are shown in Table 4B.

In some embodiments, lenses formed from more than two different materials can be used. For example, in certain embodiments, the overall length of the system can be constrained during system design (e.g., so that the lens system can be used as a microlithography optical lens system in certain applications). Three or more (e.g., four or more, five or more, six or more, ten or more) materials can be used individually, or in combination, to form the lenses to provide optical lens systems with suitably configured chromatic properties.

Figure 9:
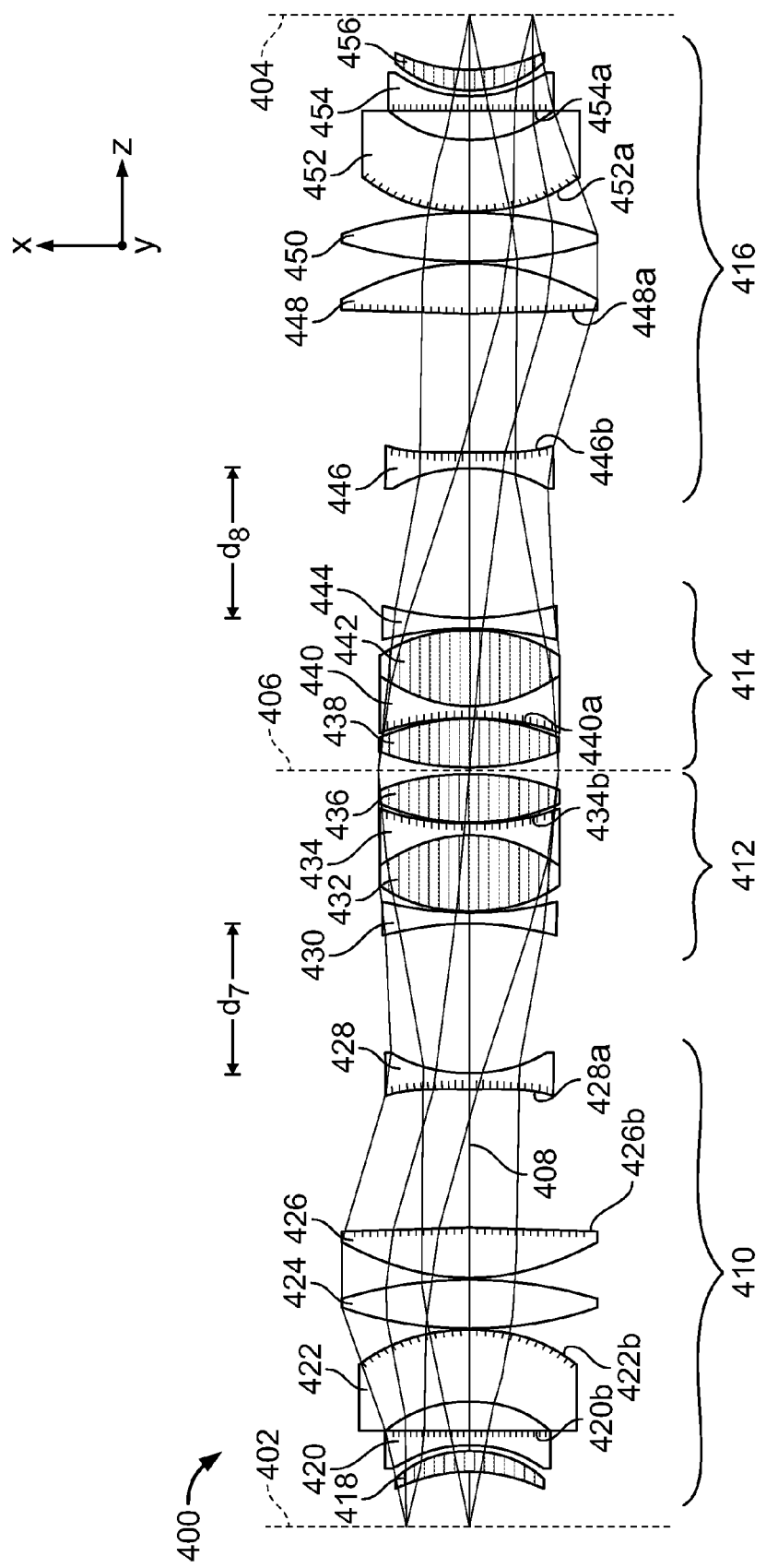
FIG. 9 is a schematic diagram of an embodiment of a imaging optical lens system.

An example of an embodiment of a imaging optical lens system 400 having lenses formed from one of three different materials is shown in FIG. 9. Most of the lenses in optical lens system 400 are formed from fused silica or calcium fluoride. These materials have relatively low absorption in the UV region of the electromagnetic spectrum. However, optical lens system 400 also includes two lenses formed from LLF-1 glass or another flint glass. These two lenses, which are typically the first and last lenses along the optical path of lens system 400, provide particular chromatic properties to lens system 400.

Optical lens system 400 is configured to transfer a light pattern from object plane 402 to image plane 404 through symmetry plane 406. Optical lens system 400 includes a first lens group 410, a second lens group 412, a third lens group 414, and a fourth lens group 416. Each of the lenses in the lens groups is rotationally symmetric about axis 408, which is parallel to the z-axis in the coordinate system shown. Optical lens system 400 is configured to provide a maximum numerical aperture of 0.20. Furthermore, optical lens system 400 is telecentric, has a magnification of one, and a field size of 52 mm×66 mm. Hence, $d_{max}$ for optical lens system 400 is 42 mm.

Optical lens system 400 has an $M_a$ value of 0.33, an $M_b$ value of 0.92, and a Γ ratio of 0.36.

Each of the lenses in optical lens system 400 has a first surface facing object plane 402 and a second surface facing image plane 404. The first surface of each lens is denoted with an "a" label. For example, the first surface of lens 418 is labeled 418a. The second surface of each lens is denoted with a "b" label. Thus, the second surface of lens 418 is labeled 418b. Not all labels corresponding to first and second surfaces of the lenses in FIG. 9 are shown for purposes of clarity, but each lens includes first and second surfaces labeled "a" and "b", respectively.

First lens group 410 includes lenses 418, 420, 422, 424, 426, and 428. Lens 418 is formed of LLF1 glass. Lenses 420, 422, 424, 426, and 428 are formed of fused silica. Thicknesses of the lenses in optical lens system 400 are measured along axis 408. Lens 418 has a thickness of 13.0 mm. Lens 420 has a thickness of 10.0 mm. Lens 422 has a thickness of 47.4 mm. Lens 424 has a thickness of 33.0 mm. Lens 426 has a thickness of 32.8 mm. Lens 428 has a thickness of 10.0 mm.

Spacings between two lenses are measured between facing surfaces of the two lenses along axis 408. Lens 418 is spaced from lens 420 by a distance of 5.1 mm. Lens 420 is spaced from lens 422 by a distance of 16.5 mm. Lens 422 is spaced from lens 424 by a distance of 1.0 mm. Lens 424 is spaced from lens 426 by a distance of 1.0 mm. Lens 426 is spaced from lens 428 by a distance of 91.8 mm. First lens group 410 is spaced from second lens group 412 by a distance $d_7$ measured along axis 408 (e.g., a distance measured between surfaces 428b and 430a along axis 408) of 97.9 mm.

Second lens group 412 includes lenses 430, 432, 434, and 436. Lenses 430 and 434 are formed of fused silica. Lenses 432 and 436 are formed of calcium fluoride. Lens 430 has a thickness of 7.0 mm. Lens 432 has a thickness of 50.1 mm. Lens 434 has a thickness of 7.0 mm. Lens 436 has a thickness of 32.0 mm.

Lens 430 is spaced from lens 432 by a distance of 1.0 mm. Lens 432 is spaced from lens 434 by a distance of 1.0 mm. Lens 434 is spaced from lens 436 by a distance of 1.5 mm. Second lens group 412 is spaced from symmetry plane 406 by a distance (e.g., a distance measured between surface 436b and symmetry plane 406 along axis 408) of 1.0 mm.

Third lens group 414 includes lenses 438, 440, 442, and 444. Lenses 438 and 442 are formed of calcium fluoride. Lenses 440 and 444 are formed of fused silica. Lens 438 has a thickness of 32.0 mm. Lens 440 has a thickness of 7.0 mm. Lens 442 has a thickness of 50.1 mm. Lens 444 has a thickness of 7.0 mm.

Third lens group 414 is spaced from symmetry plane 406 by a distance (e.g., a distance measured between symmetry plane 406 and surface 438a along axis 408) of 1.0 mm. Lens 438 is spaced from lens 440 by a distance of 1.5 mm. Lens 440 is spaced from lens 442 by a distance of 1.0 mm. Lens 442 is spaced from lens 444 by a distance of 1.0 mm. Third lens group 414 is spaced from fourth lens group 416 by a distance $d_8$ measured along axis 408 (e.g., a distance measured between surfaces 444b and 446a along axis 408) of 97.9 mm.

The dimensions, spacings, and materials of lenses in third lens group 414 are similar to the dimensions, spacings, and materials of lenses in second lens group 412. The lenses in third lens group 414 are positioned along axis 408 so that second lens group 412 and third lens group 414 form an arrangement of lenses that is symmetric with respect to symmetry plane 406.

Fourth lens group 416 includes lenses 446, 448, 450, 452, 454, and 456. Lenses 446, 448, 450, 452, and 454 are formed of fused silica. Lens 456 is formed of LLF-1 glass. Lens 446 has a thickness of 10.0 mm. Lens 448 has a thickness of 32.8 mm. Lens 450 has a thickness of 33.0 mm. Lens 452 has a thickness of 47.4 mm. Lens 454 has a thickness of 10.0 mm. Lens 456 has a thickness of 13.0 mm.

Lens 446 is spaced from lens 448 by a distance of 91.8 mm. Lens 448 is spaced from lens 450 by a distance of 1.0 mm. Lens 450 is spaced from lens 452 by a distance of 1.0 mm. Lens 452 is spaced from lens 454 by a distance of 16.5 mm. Lens 454 is spaced from lens 456 by a distance of 5.1 mm. Fourth lens group 416 is spaced from image plane 404 by a distance (e.g., a distance measured between surface 456b and image plane 404 along axis 408) of 40.0 mm.

The dimensions, spacings, and materials of lenses in fourth lens group 416 are similar to the dimensions, spacings, and materials of lenses in first lens group 410. The lenses in fourth lens group 416 are positioned along axis 408 so that first lens group 410 and fourth lens group 416 form an arrangement of lenses that is symmetric with respect to symmetry plane 406.

Computer modeling of optical lens 400 indicated the following lens heating induced aberrations for a range of input powers from 0 up to 40 W:

| | |
|---|---|
| Maximum Astigmatism Variation: | 263 nm/W; |
| Peak-to-Valley Focal Plane Deviation Variation: | 481 nm/W; |
| Peak-to-Valley Field Curvature Variation: | 318 nm/W; |
| On-axis Astigamtism Variation: | −62 nm/W; |
| Maximum Distortion Variation: | 12 nm/W. |

Lens data, including a radius of curvature of each of the surfaces of each of the lenses in optical lens system 400, is shown in Table 5A. The radius of curvature of a lens surface is negative if the center of curvature of the lens surface is on the same side of the lens surface as object plane 402. The radius of curvature of a lens surface is positive if the center of curvature of the lens surface is on the same side of the lens surface as image plane 404.

Some of the surfaces of the lenses in optical lens system 400 are aspherical surfaces. Specifically, surfaces 420b, 422b, 426b, 428a, 434b, 440a, 446b, 448a, 452a, and 454a are aspherical surfaces. The other lens surfaces in optical lens system 400 are spherical surfaces. Aspherical surfaces are identified in Table 5A as having a shape "AS". Aspheric constants corresponding to Equation 1 for the aspherical surfaces of lenses in optical lens system 400 are shown in Table 5B.

Values for |SA/CA|' for each lens surface is provided in Table 5C.

Figure 10:
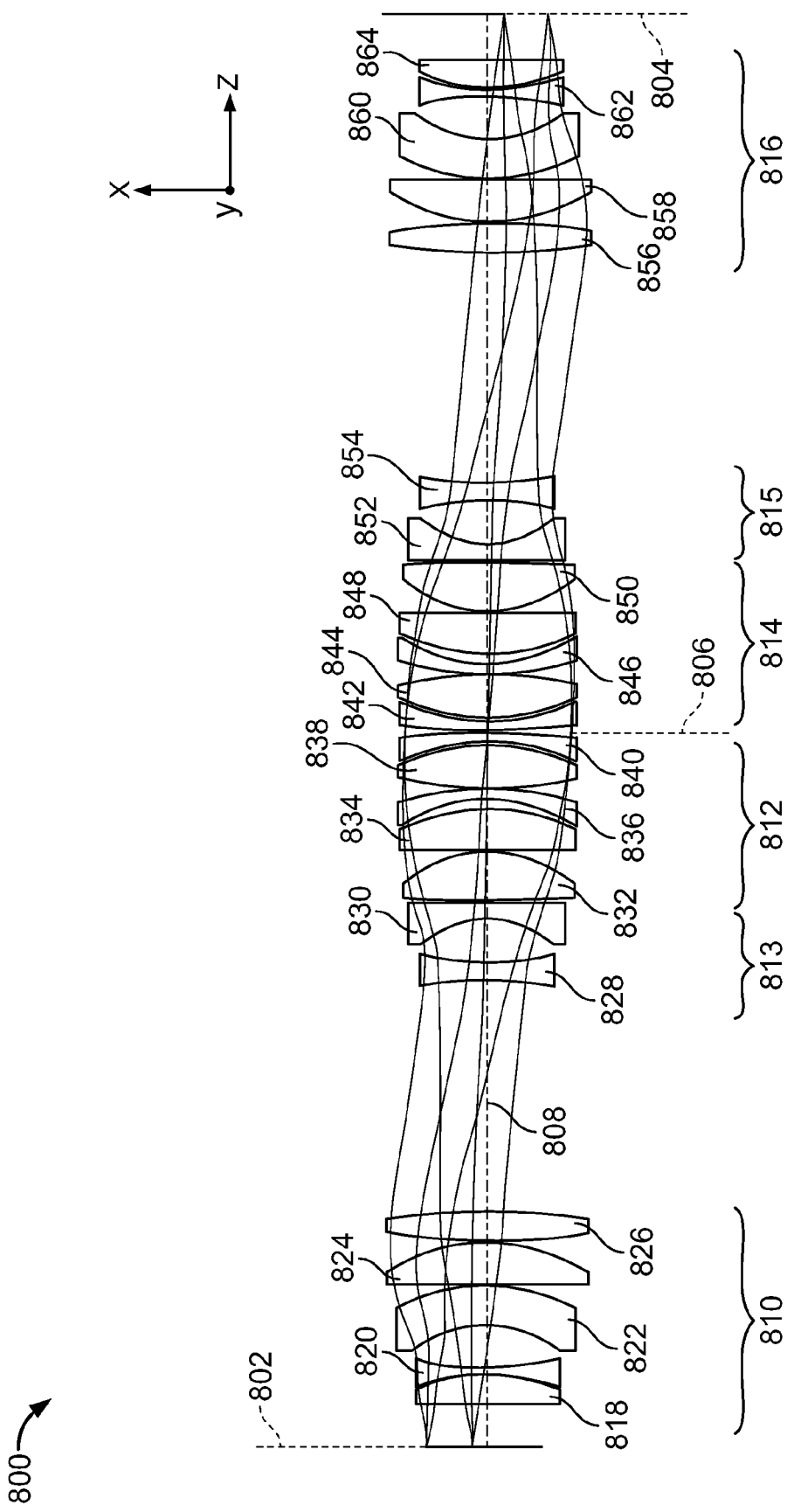
FIG. 10 is a schematic diagram of an embodiment of a imaging optical lens system.

Referring to FIG. 10, an example of an imaging optical lens system that has six lens groups is optical lens system 800. Optical lens system 800 is configured to image an object at object plane 802 to an image plane 804 through a symmetry plane 806, which corresponds to the pupil plane of optical lens system 800. Optical lens system has a focal length of 1,448 mm and provide a maximum numerical aperture of 0.16 at image plane 804. Furthermore, optical lens system 800 is telecentric and has a magnification of one.

Optical lens system 800 has an $M_a$ value of 0.22, an $M_b$ value of 0.88, and a Γ ratio of 0.25.

Optical lens system 800 includes lens groups 810, 813, 812, 820, 823, and 822. Lens groups 810, 812, 820, and 822 have positive optical power. Lens groups 813 and 823 have negative optical power. Each of the lenses in the lens groups is rotationally symmetric about axis 808, which is parallel to the z-axis in the coordinate system shown.

Lens group 810 includes lenses 818, 820, 822, 824, and 826. Lens 818 is formed from LLF-1 glass, while all the other lenses in lens group 810 are formed from fused silica. Lens 818 forms a PN doublet together with lens 820.

Lens group 813 includes lenses 828 and 830. Both lens 828 and lens 830 are formed from fused silica.

Lens group 812 includes lenses 832, 834, 836, 838, and 840. Lenses 832, 834, and 838 are formed from $CaF_2$, while lenses 836 and 840 are formed from fused silica. Lenses 834 and 836 form a first PN doublet. Lenses 838 and 840 form a PN second doublet.

Lens group 814 is arranged symmetrically to lens group 812 with respect to plane 806. Accordingly, lenses 842, 844, 846, 848, and 850 are formed from the same materials and are the same shape as lenses 840, 838, 836, 834, and 832, respectively.

Lens group 815 is arranged symmetrically to lens group 813 with respect to plane 806. Accordingly, lenses 852 and 854 are formed from the same materials and are the same shape as lenses 830 and 828, respectively.

Lens group 816 is arranged symmetrically to lens group 810 with respect to plane 806. Accordingly, lenses 856, 858, 860, 862, and 864 are formed from the same materials and are the same shape as lenses 826, 824, 822, 820, and 818, respectively.

Computer modeling of optical lens 800 indicated the following lens heating induced aberrations for a range of input powers from 0 up to 40 W:

| | |
|---|---|
| Maximum Astigmatism Variation: | 153 nm/W; |
| Peak-to-Valley Focal Plane Deviation Variation: | 270 nm/W; |
| Peak-to-Valley Field Curvature Variation: | 175 nm/W; |
| On-axis Astigamtism Variation: | −37 nm/W; |
| Maximum Distortion Variation: | 8.6 nm/W. |

Lens data, including a radius of curvature of each of the surfaces of each of the lenses in optical lens system 800, is shown in Table 6A. The surface of each lens facing object plane 802 is designated by the letter "a" and the surface of each lens facing image plane 804 is designated by the letter "b." The radius of curvature of a lens surface is negative if the center of curvature of the lens surface is on the same side of the lens surface as object plane 802. The radius of curvature of a lens surface is positive if the center of curvature of the lens surface is on the same side of the lens surface as image plane 804. Each lens surface in optical lens system 800 is spherical. The column of Table 6A designated "Thickness" refers to the distance from that surface to the adjacent lens surface in the direction of image plane 804 as measured along optical axis 808. The refractive index values are provided for the wavelength 365 nm. Table entries labeled DS refer to "dummy surfaces," which are virtual surfaces used when modeling the system to extract data.

Values for |SA/CA|' for each lens surface is provided in Table 6B.

Figure 11:
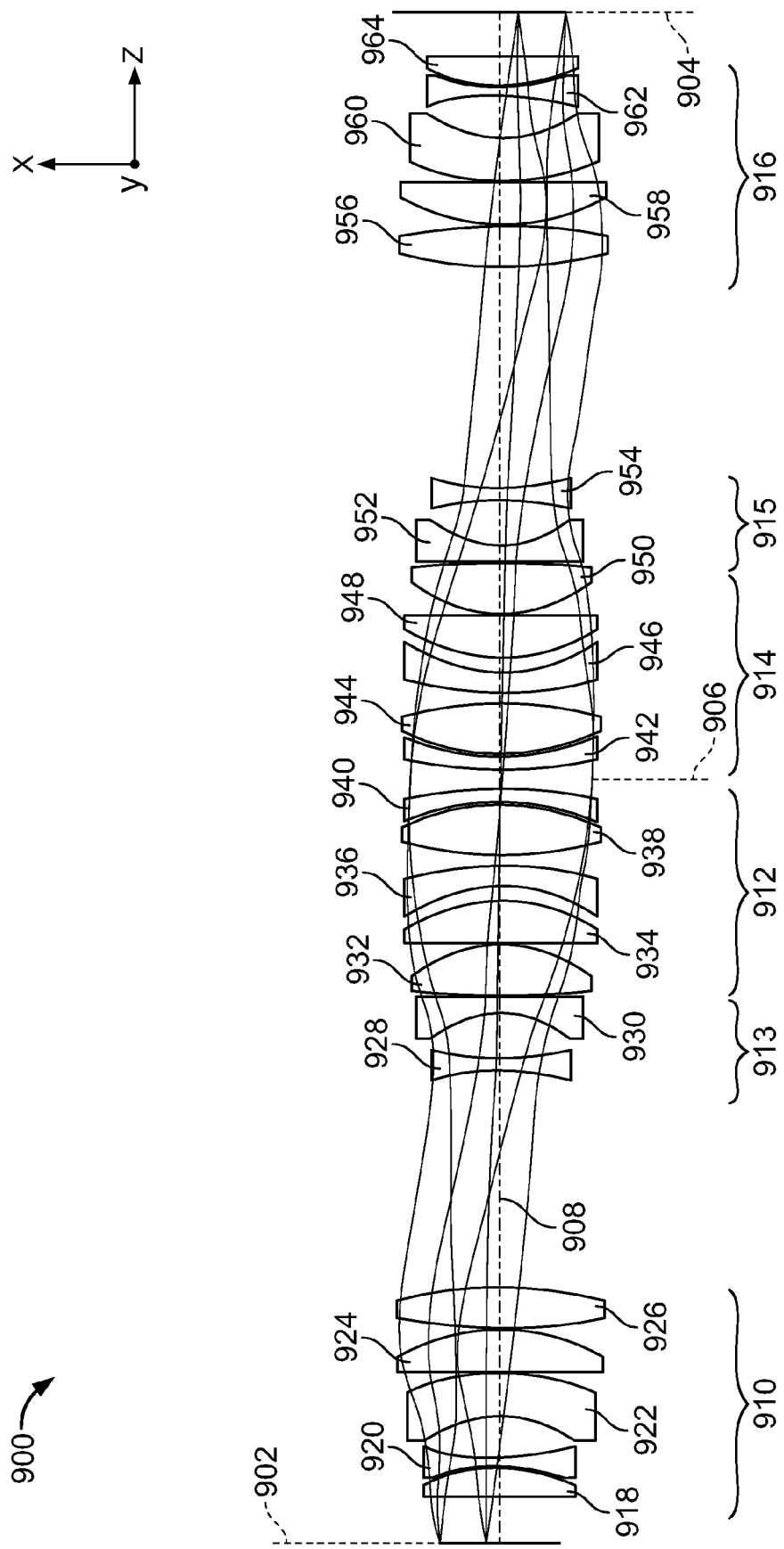
FIG. 11 is a schematic diagram of an embodiment of a imaging optical lens system.

Referring to FIG. 11, an example of an imaging optical lens system that has six lens groups is optical lens system 900. Optical lens system 900 is configured to image an object at object plane 902 to an image plane 904 through a symmetry plane 906, which corresponds to the pupil plane of optical lens system 900. Optical lens system has a focal length of 1,433 mm and provide a maximum numerical aperture of 0.16 at image plane 904. Furthermore, optical lens system 900 is telecentric and has a magnification of one.

Optical lens system 900 has an $M_a$ value of 0.22, an $M_b$ value of 0.88, and a Γ ratio of 0.26.

Optical lens system 900 includes lens groups 910, 913, 912, 920, 923, and 922. Lens groups 910, 912, 920, and 922 have positive optical power. Lens groups 913 and 923 have negative optical power. Each of the lenses in the lens groups is rotationally symmetric about axis 908, which is parallel to the z-axis in the coordinate system shown.

Lens group 910 includes lenses 918, 920, 922, 924, and 926. Lens 918 is formed from LLF-1 glass, while all the other lenses in lens group 910 are formed from fused silica. Lens 918 forms a PN doublet together with lens 920.

Lens group 913 includes lenses 928 and 930. Both lens 928 and lens 930 are formed from fused silica.

Lens group 912 includes lenses 932, 934, 936, 938, and 940. Lenses 932, 934, and 938 are formed from $CaF_2$. Lens 936 is formed from fused silica and lens 940 is formed from BK7 glass. Lenses 934 and 936 form a first PN doublet. Lenses 938 and 940 form a PN second doublet.

Lens group 914 is arranged symmetrically to lens group 912 with respect to plane 906. Accordingly, lenses 942, 944, 946, 948, and 950 are formed from the same materials and are the same shape as lenses 940, 938, 936, 934, and 932, respectively.

Lens group 915 is arranged symmetrically to lens group 913 with respect to plane 906. Accordingly, lenses 952 and 954 are formed from the same materials and are the same shape as lenses 930 and 928, respectively.

Lens group 916 is arranged symmetrically to lens group 910 with respect to plane 906. Accordingly, lenses 956, 958, 960, 962, and 964 are formed from the same materials and are the same shape as lenses 926, 924, 922, 920, and 918, respectively.

Lens data, including a radius of curvature of each of the surfaces of each of the lenses in optical lens system 900, is shown in Table 7. The surface of each lens facing object plane 902 is designated by the letter "a" and the surface of each lens facing image plane 904 is designated by the letter "b." The radius of curvature of a lens surface is negative if the center of curvature of the lens surface is on the same side of the lens surface as object plane 902. The radius of curvature of a lens surface is positive if the center of curvature of the lens surface is on the same side of the lens surface as image plane 904. Each lens surface in optical lens system 900 is spherical. The column of Table 7 designated "Thickness" refers to the distance from that surface to the adjacent lens surface in the direction of image plane 904 as measured along optical axis 908. The refractive index values are provided for the wavelength 365 nm.

Figure 12:
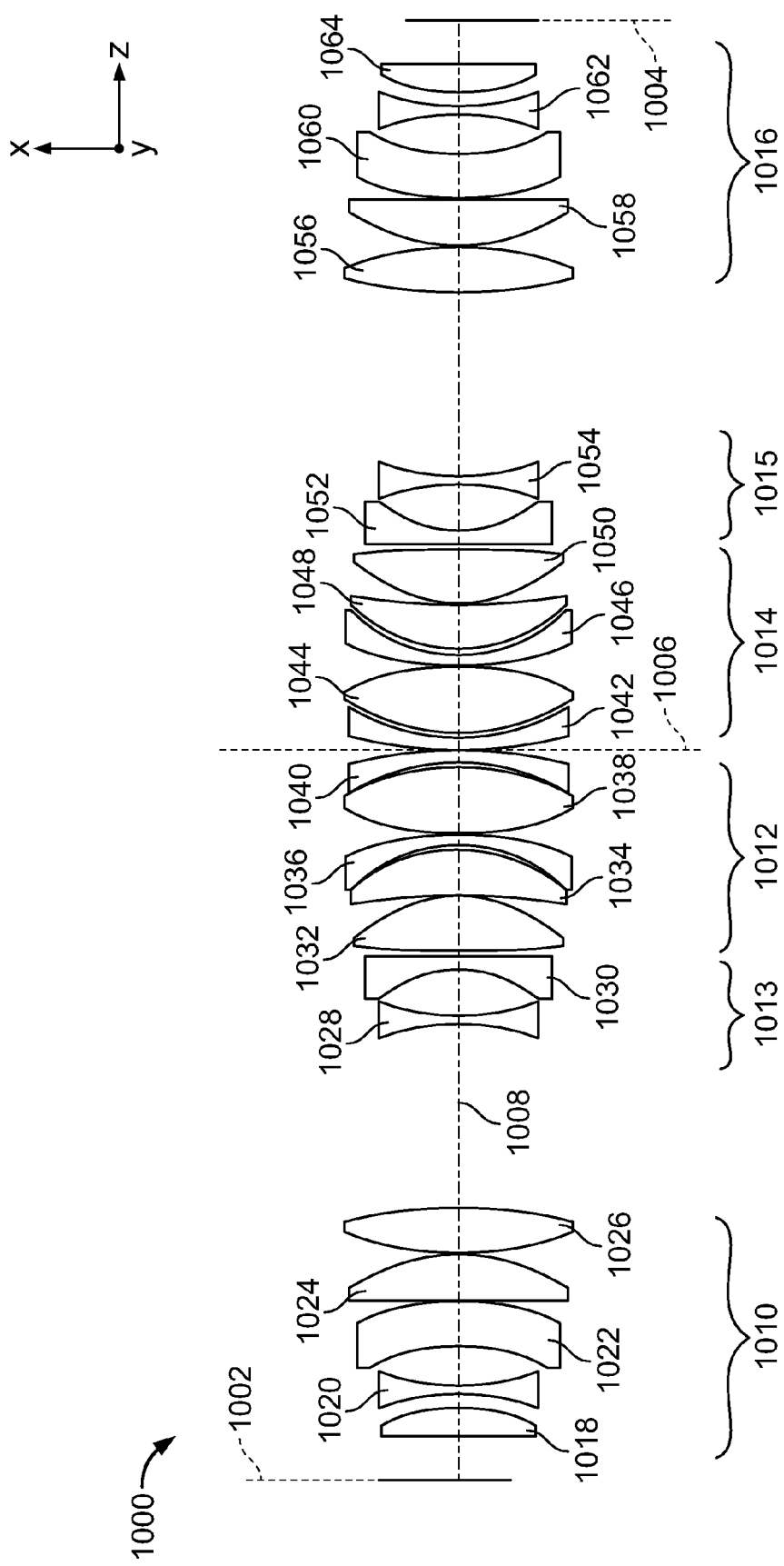
FIG. 12 is a schematic diagram of an embodiment of a imaging optical lens system.

Referring to FIG. 12, an example of an imaging optical lens system that has six lens groups is optical lens system 1000. Optical lens system 1000 is configured to image an object at object plane 1002 to an image plane 1004 through a symmetry plane 1006, which corresponds to the pupil plane of optical lens system 1000. Optical lens system has a focal length of 1,375 mm and provide a maximum numerical aperture of 0.2 at image plane 1004. Furthermore, optical lens system 1000 is telecentric and has a magnification of one.

Optical lens system 1000 has an $M_a$ value of 0.3, an $M_b$ value of 0.88, and a $\Gamma$ ratio of 0.34.

Optical lens system 1000 includes lens groups 1010, 1013, 1012, 1020, 1023, and 1022. Lens groups 1010, 1012, 1020, and 1022 have positive optical power. Lens groups 1013 and 1023 have negative optical power. Each of the lenses in the lens groups is rotationally symmetric about axis 1008, which is parallel to the z-axis in the coordinate system shown.

Lens group 1010 includes lenses 1018, 1020, 1022, 1024, and 1026. Lens 1018 is formed from LLF-1 glass, while all the other lenses in lens group 1010 are formed from fused silica. Lens 1018 forms a PN doublet together with lens 1020.

Lens group 1013 includes lenses 1028 and 1030. Both lens 1028 and lens 1030 are formed from fused silica.

Lens group 1012 includes lenses 1032, 1034, 1036, 1038, and 1040. Lenses 1032, 1034, and 1038 are formed from $CaF_2$. Lens 1036 is formed from fused silica and lens 1040 is formed from LLF-1 glass. Lenses 1034 and 1036 form a first PN doublet. Lenses 1038 and 1040 form a PN second doublet.

Lens group 1014 is arranged symmetrically to lens group 1012 with respect to plane 1006. Accordingly, lenses 1042, 1044, 1046, 1048, and 1050 are formed from the same materials and are the same shape as lenses 1040, 1038, 1036, 1034, and 1032, respectively.

Lens group 1015 is arranged symmetrically to lens group 1013 with respect to plane 1006. Accordingly, lenses 1052 and 1054 are formed from the same materials and are the same shape as lenses 1030 and 1028, respectively.

Lens group 1016 is arranged symmetrically to lens group 1010 with respect to plane 1006. Accordingly, lenses 1056, 1058, 860, 1062, and 1064 are formed from the same materials and are the same shape as lenses 1026, 1024, 1022, 1020, and 1018, respectively.

Lens data, including a radius of curvature of each of the surfaces of each of the lenses in optical lens system 1000, is shown in Table 8A. The surface of each lens facing object plane 1002 is designated by the letter "a" and the surface of each lens facing image plane 1004 is designated by the letter "b." The radius of curvature of a lens surface is negative if the center of curvature of the lens surface is on the same side of the lens surface as object plane 1002. The radius of curvature of a lens surface is positive if the center of curvature of the lens surface is on the same side of the lens surface as image plane 1004. The column of Table 8A designated "Thickness" refers to the distance from that surface to the adjacent lens surface in the direction of image plane 1004 as measured along optical axis 1008. The refractive index values are provided for the wavelength 365 nm.

Some of the surfaces of the lenses in optical lens system 1000 are aspherical surfaces. Specifically, surfaces 1028b, 1036b, 1046a, and 1054a are aspherical surfaces. The other lens surfaces in optical lens system 1000 are spherical surfaces. Aspheric constants corresponding to Equation 1 for the aspherical surfaces of lenses in optical lens system 1000 are shown in Table 8B.

Figure 13:
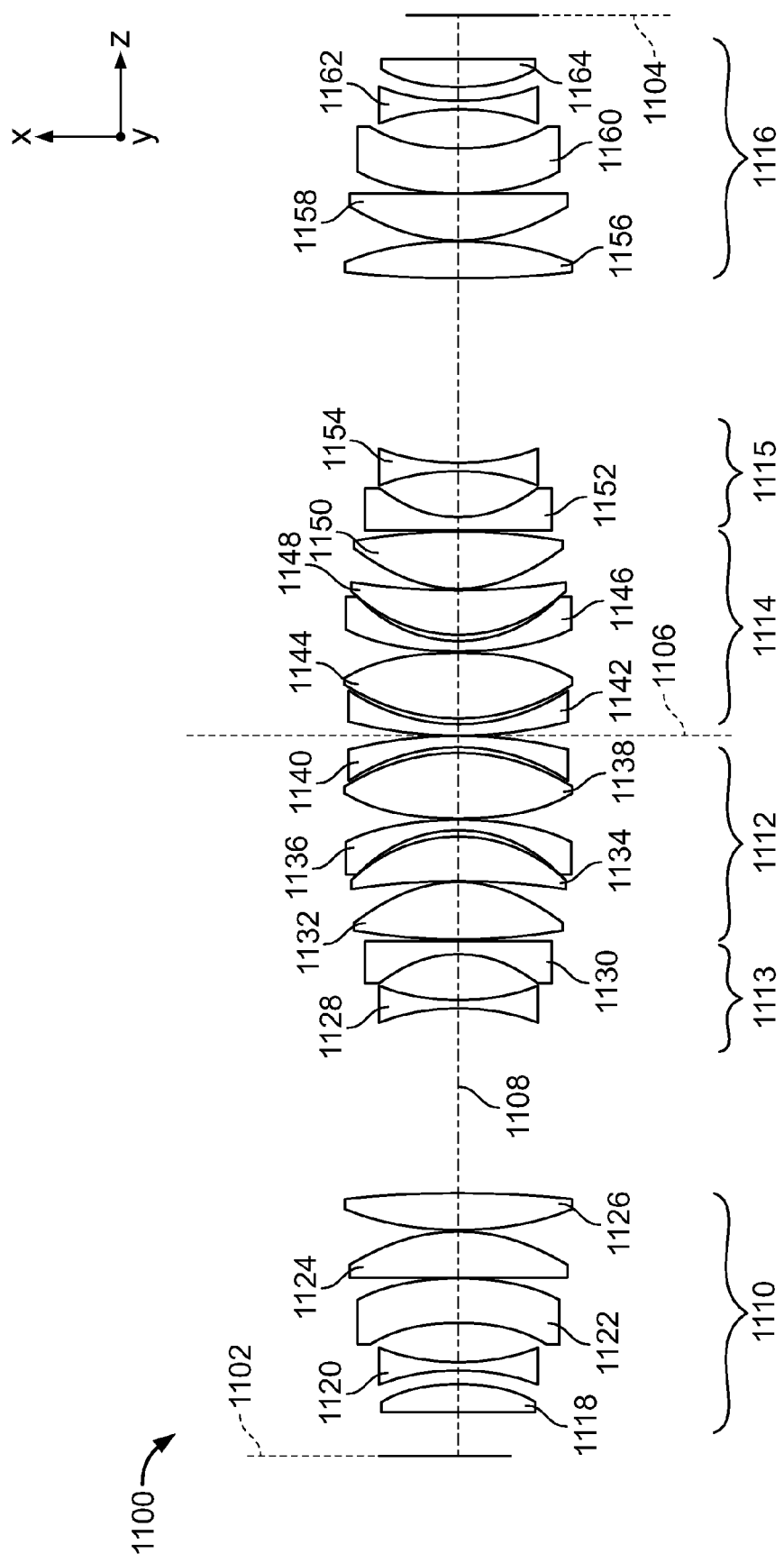
FIG. 13 is a schematic diagram of an embodiment of a imaging optical lens system.

Referring to FIG. 13, an example of an imaging optical lens system that has six lens groups is optical lens system 1100. Optical lens system 1100 is configured to image an object at object plane 1102 to an image plane 1104 through a symmetry plane 1106, which corresponds to the pupil plane of optical lens system 1100. Optical lens system has a focal length of 1,375 mm and provide a maximum numerical aperture of 0.2 at image plane 1104. Furthermore, optical lens system 1100 is telecentric and has a magnification of one.

Optical lens system 1100 has an $M_a$ value of 0.28, an $M_b$ value of 0.88, and a $\Gamma$ ratio of 0.32.

Optical lens system 1100 includes lens groups 1110, 1113, 1112, 1120, 1123, and 1122. Lens groups 1110, 1112, 1120, and 1122 have positive optical power. Lens groups 1113 and 1123 have negative optical power. Each of the lenses in the lens groups is rotationally symmetric about axis 1108, which is parallel to the z-axis in the coordinate system shown.

Lens group 1110 includes lenses 1118, 1120, 1122, 1124, and 1126. Lens 1118 is formed from LLF-1 glass, while all the other lenses in lens group 1110 are formed from fused silica. Lens 1118 forms a PN doublet together with lens 1120.

Lens group 1113 includes lenses 1128 and 1130. Both lens 1128 and lens 1130 are formed from fused silica.

Lens group 1112 includes lenses 1132, 1134, 1136, 1138, and 1140. Lenses 1132, 1134, and 1138 are formed from $CaF_2$. Lens 1136 is formed from fused silica. Lens 1140 is formed from BK7 glass. Lenses 1134 and 1136 form a first PN doublet. Lenses 1138 and 1140 form a PN second doublet.

Lens group 1114 is arranged symmetrically to lens group 1112 with respect to plane 1106. Accordingly, lenses 1142, 1144, 1146, 1148, and 1150 are formed from the same materials and are the same shape as lenses 1140, 1138, 1136, 1134, and 1132, respectively.

Lens group 1115 is arranged symmetrically to lens group 1113 with respect to plane 1106. Accordingly, lenses 1152 and 1154 are formed from the same materials and are the same shape as lenses 1130 and 1128, respectively.

Lens group 1116 is arranged symmetrically to lens group 1110 with respect to plane 1106. Accordingly, lenses 1156, 1158, 1160, 1162, and 1164 are formed from the same materials and are the same shape as lenses 1126, 1124, 1122, 1120, and 1118, respectively.

Lens data, including a radius of curvature of each of the surfaces of each of the lenses in optical lens system 1100, is shown in Table 9A. The surface of each lens facing object plane 1102 is designated by the letter "a" and the surface of each lens facing image plane 1104 is designated by the letter "b." The radius of curvature of a lens surface is negative if the center of curvature of the lens surface is on the same side of the lens surface as object plane 1102. The radius of curvature of a lens surface is positive if the center of curvature of the lens surface is on the same side of the lens surface as image plane 1104. The column of Table 9A designated "Thickness" refers to the distance from that surface to the adjacent lens surface in the direction of image plane 1104 as measured along optical axis 1108. The refractive index values are provided for the wavelength 365 nm.

Some of the surfaces of the lenses in optical lens system 1100 are aspherical surfaces. Specifically, surfaces 1128b, 1136b, 1146a, and 1154a are aspherical surfaces. The other lens surfaces in optical lens system 400 are spherical surfaces.

Aspheric constants corresponding to Equation 1 for the aspherical surfaces of lenses in optical lens system 1100 are shown in Table 9B.

Figure 14:
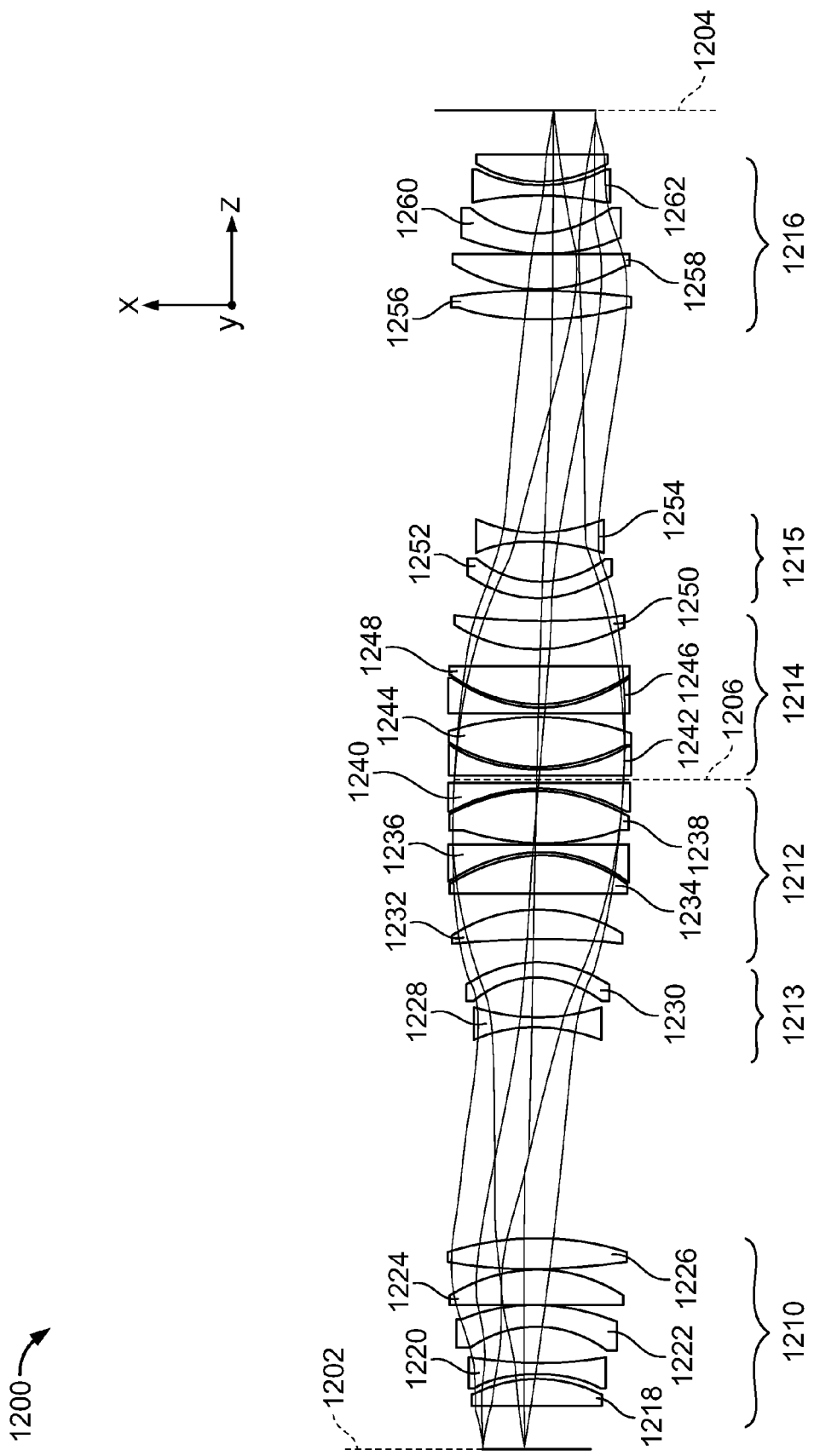
FIG. 14 is a schematic diagram of an embodiment of a imaging optical lens system.

Referring to FIG. 14, an example of an imaging optical lens system that has six lens groups is optical lens system 1200. Optical lens system 1200 is configured to image an object at object plane 1202 to an image plane 1204 through a symmetry plane 1206, which corresponds to the pupil plane of optical lens system 1200. Optical lens system has a focal length of 1,526 mm and provide a maximum numerical aperture of 0.16 at image plane 1204. Furthermore, optical lens system 1200 is telecentric and has a magnification of one.

Optical lens system 1200 has an $M_a$ value of 0.23, an $M_b$ value of 0.89, and a $\Gamma$ ratio of 0.26.

Optical lens system 1200 includes lens groups 1210, 1213, 1212, 1220, 1223, and 1222. Lens groups 1210, 1212, 1220, and 1222 have positive optical power. Lens groups 1213 and 1223 have negative optical power. Each of the lenses in the lens groups is rotationally symmetric about axis 1208, which is parallel to the z-axis in the coordinate system shown.

Lens group 1210 includes lenses 1218, 1220, 1222, 1224, and 1226. Lens 1218 is formed from LLF-1 glass, while all the other lenses in lens group 1210 are formed from fused silica. Lens 1218 forms a PN doublet together with lens 1220.

Lens group 1213 includes lenses 1228 and 1230. Lens 1228 is formed from fused silica. Lens 1230 is formed from LLF-1 glass.

Lens group 1212 includes lenses 1232, 1234, 1236, 1238, and 1240. Lenses 1232, 1234, and 1238 are formed from $CaF_2$, while lenses 1236 and 1240 are formed from fused silica. Lenses 1234 and 1236 form a first PN doublet. Lenses 1238 and 1240 form a PN second doublet.

Lens group 1214 is arranged symmetrically to lens group 1212 with respect to plane 1206. Accordingly, lenses 1242, 1244, 1246, 1248, and 1250 are formed from the same materials and are the same shape as lenses 1240, 1238, 1236, 1234, and 1232, respectively.

Lens group 1215 is arranged symmetrically to lens group 1213 with respect to plane 1206. Accordingly, lenses 1252 and 1254 are formed from the same materials and are the same shape as lenses 1230 and 1228, respectively.

Lens group 1216 is arranged symmetrically to lens group 1210 with respect to plane 1206. Accordingly, lenses 1256, 1258, 1260, 1262, and 1264 are formed from the same materials and are the same shape as lenses 1226, 1224, 1222, 1220, and 1218, respectively.

Lens data, including a radius of curvature of each of the surfaces of each of the lenses in optical lens system 1200, is shown in Table 10. The surface of each lens facing object plane 1202 is designated by the letter "a" and the surface of each lens facing image plane 1204 is designated by the letter "b." The radius of curvature of a lens surface is negative if the center of curvature of the lens surface is on the same side of the lens surface as object plane 1202. The radius of curvature of a lens surface is positive if the center of curvature of the lens surface is on the same side of the lens surface as image plane 1204. Each lens surface in optical lens system 1200 is spherical. The column of Table 10 designated "Thickness" refers to the distance from that surface to the adjacent lens surface in the direction of image plane 1204 as measured along optical axis 1208. The refractive index values are provided for the wavelength 365 nm.

Figure 15:
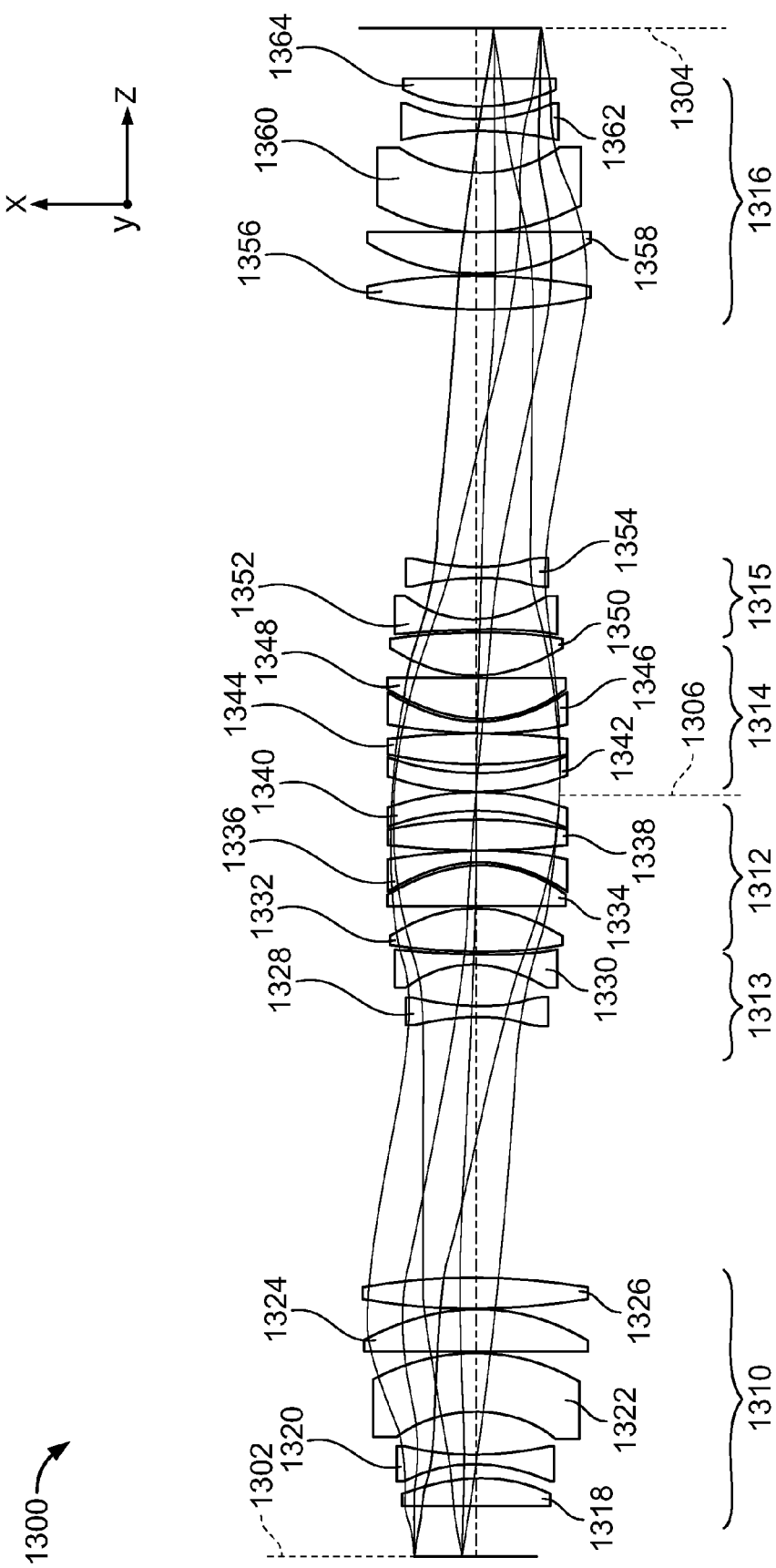
FIG. 15 is a schematic diagram of an embodiment of a imaging optical lens system.

Referring to FIG. 15, an example of an imaging optical lens system that has six lens groups is optical lens system 1300. Optical lens system 1300 is configured to image an object at object plane 1302 to an image plane 1304 through a symmetry plane 1306, which corresponds to the pupil plane of optical lens system 1300. Optical lens system has a focal length of 1,522 mm and provide a maximum numerical aperture of 0.16 at image plane 1304. Furthermore, optical lens system 1300 is telecentric and has a magnification of one.

Optical lens system 1300 has an $M_a$ value of 0.25, an $M_b$ value of 0.89, and a $\Gamma$ ratio of 0.28.

Optical lens system 1300 includes lens groups 1310, 1313, 1312, 1320, 1323, and 1322. Lens groups 1310, 1312, 1320, and 1322 have positive optical power. Lens groups 1313 and 1323 have negative optical power. Each of the lenses in the lens groups is rotationally symmetric about axis 1308, which is parallel to the z-axis in the coordinate system shown.

Lens group 1310 includes lenses 1318, 1320, 1322, 1324, and 1326. Lens 1318 is formed from LLF-1 glass, while all the other lenses in lens group 1310 are formed from fused silica. Lens 1318 forms a PN doublet together with lens 1320.

Lens group 1313 includes lenses 1328 and 1330. Both lens 1328 and lens 1330 are formed from fused silica.

Lens group 1312 includes lenses 1332, 1334, 1336, 1338, and 1340. Lenses 1332, 1334, and 1338 are formed from $CaF_2$. Lens 1336 is formed from fused silica and lens 1340 is formed from LLF-1. Lenses 1334 and 1336 form a first PN doublet. Lenses 1338 and 1340 form a PN second doublet.

Lens group 1314 is arranged symmetrically to lens group 1312 with respect to plane 1306. Accordingly, lenses 1342, 1344, 1346, 1348, and 1350 are formed from the same materials and are the same shape as lenses 1340, 1338, 1336, 1334, and 1332, respectively.

Lens group 1315 is arranged symmetrically to lens group 1313 with respect to plane 1306. Accordingly, lenses 1352 and 1354 are formed from the same materials and are the same shape as lenses 1330 and 1328, respectively.

Lens group 1316 is arranged symmetrically to lens group 1310 with respect to plane 1306. Accordingly, lenses 1356, 1358, 1360, 1362, and 1364 are formed from the same materials and are the same shape as lenses 1326, 1324, 1322, 1320, and 1318, respectively.

Lens data, including a radius of curvature of each of the surfaces of each of the lenses in optical lens system 1300, is shown in Table 11. The surface of each lens facing object plane 1302 is designated by the letter "a" and the surface of each lens facing image plane 1304 is designated by the letter "b." The radius of curvature of a lens surface is negative if the center of curvature of the lens surface is on the same side of the lens surface as object plane 1302. The radius of curvature of a lens surface is positive if the center of curvature of the lens surface is on the same side of the lens surface as image plane 1304. Each lens surface in optical lens system 1300 is spherical. The column of Table 11 designated "Thickness" refers to the distance from that surface to the adjacent lens surface in the direction of image plane 1304 as measured along optical axis 1308. The refractive index values are provided for the wavelength 365 nm.

Figure 16:
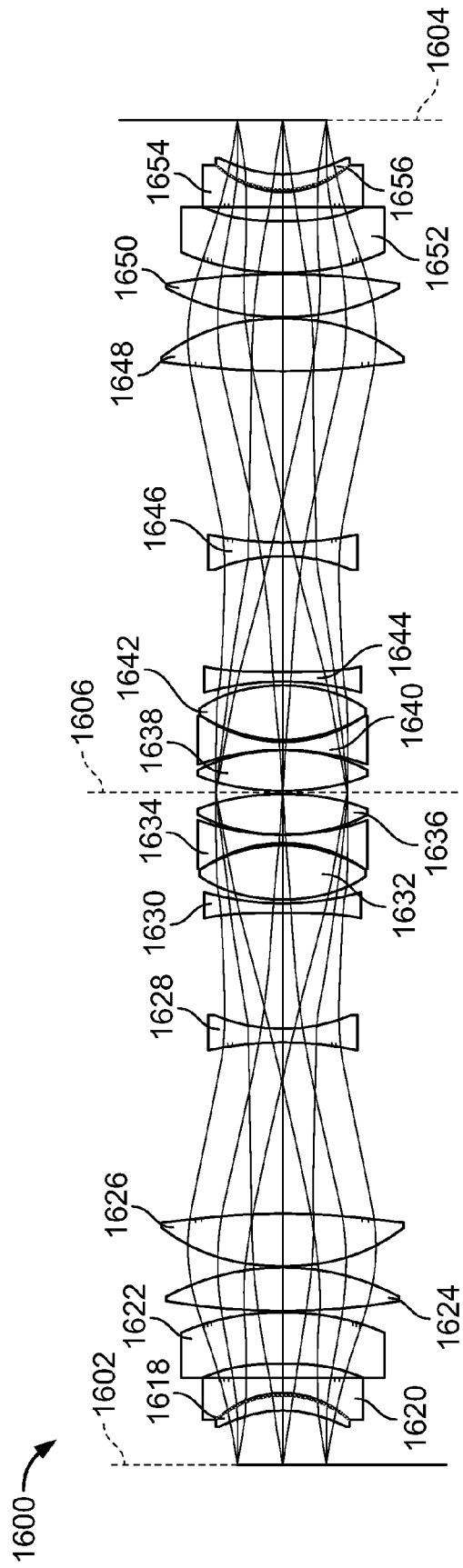
FIG. 16 is a schematic diagram of an embodiment of a imaging optical lens system.

Referring to FIG. 16, another example of an imaging optical lens system is optical lens system 1600. Optical lens system 1600 is configured to image an object at object plane 1602 to an image plane 1604 through a symmetry plane 1606, which corresponds to the pupil plane of optical lens system 1600. Optical lens system has a focal length of 1,948 mm and provide a numerical aperture of 0.2 at image plane 1604. Furthermore, optical lens system 1600 is telecentric, has a magnification of one, and a field size of 52 mm×66 mm. Therefore the maximum field size for the calculation of the Γ ratio is $d_{max} = \sqrt{(52/2)^2 + (66/2)^2} = 42$ mm.

Optical lens system 1600 has an $M_a$ value of 0.28, an $M_b$ value of 0.88, and a Γ ratio of 0.32.

Computer modeling of optical lens 1600 indicated the following lens heating induced aberrations for a range of input powers from 0 up to 40 W:

| | |
|---|---|
| Maximum Astigmatism Variation: | 150 nm/W; |
| Peak-to-Valley Focal Plane Deviation Variation: | 273 nm/W; |
| Peak-to-Valley Field Curvature Variation: | 232 nm/W; |
| On-axis Astigamtism Variation: | −52 nm/W; |
| Maximum Distortion Variation: | 5 nm/W. |

Optical lens system 1600 includes lenses 1618, 1620, 1622, 1624, 1626, 1628, 1630, 1632, 1634, 1636, 1638, 1640, 1642, 1644, 1648, 1650, 1652, 1654, and 1656. Lens data, including a radius of curvature of each of the surfaces of each of the lenses in optical lens system 1600, and lens composition, is shown in Table 12A. The surface of each lens facing object plane 1602 is designated by the letter "a" and the surface of each lens facing image plane 1604 is designated by the letter "b." The radius of curvature of a lens surface is negative if the center of curvature of the lens surface is on the same side of the lens surface as object plane 1602. The radius of curvature of a lens surface is positive if the center of curvature of the lens surface is on the same side of the lens surface as image plane 1604. The column of Table 12A designated "Thickness" refers to the distance from that surface to the adjacent lens surface in the direction of image plane 1604 as measured along optical axis 1608. The refractive index values are provided for the wavelength 365 nm.

Some of the surfaces of the lenses in optical lens system 1600 are aspherical surfaces. Specifically, surfaces 1620b, 1622b, 1626b, 1628a, 1634b, 1640a, 1646b, 1648a, 1652a, and 1654a are aspherical surfaces. The other lens surfaces in optical lens system 1600 are spherical surfaces. Aspherical surfaces are identified in Table 12B as having a shape "AS". Aspheric constants corresponding to Equation 1 for the aspherical surfaces of lenses in optical lens system 1600 are shown in Table 12B.

Values for |SA/CA|' for each lens surface is provided in Table 12C.

Figure 17:
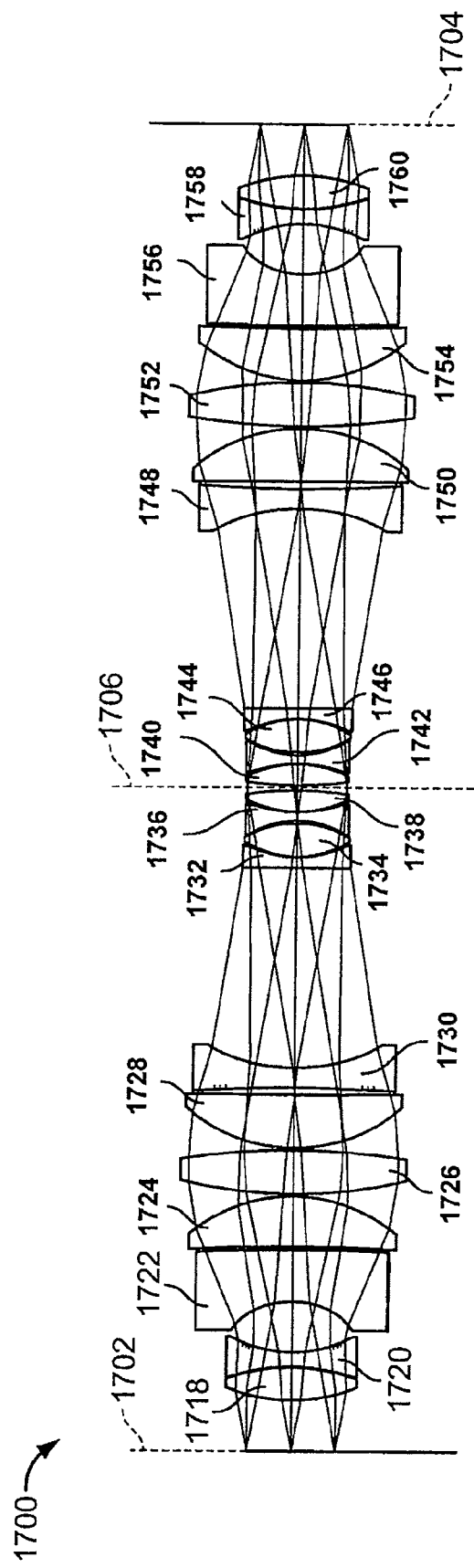
FIG. 17 is a schematic diagram of an embodiment of a imaging optical lens system.

Referring to FIG. 17, another example of an imaging optical lens system is optical lens system 1700. Optical lens system 1700 is configured to image an object at object plane 1702 to an image plane 1704 through a symmetry plane 1706, which corresponds to the pupil plane of optical lens system 1700. Optical lens system 1700 provides a numerical aperture of 0.16 at image plane 1704. Furthermore, optical lens system 1700 is telecentric, has a magnification of one, and a field size of 52 mm×66 mm. Hence, $d_{max}$ is 42 mm.

Optical lens system 1700 has an $M_a$ value of 0.39, an $M_b$ value of 0.92, and a Γ ratio of 0.42.

Computer modeling of optical lens 1700 indicated the following lens heating induced aberrations for a range of input powers from 0 up to 40 W:

| | |
|---|---|
| Maximum Astigmatism Variation: | 362 nm/W; |
| Peak-to-Valley Focal Plane Deviation Variation: | 703 nm/W; |
| Peak-to-Valley Field Curvature Variation: | 583 nm/W; |
| On-axis Astigamtism Variation: | −119 nm/W; |
| Maximum Distortion Variation: | 9 nm/W. |

Optical lens system 1700 includes lenses 1718, 1720, 1722, 1724, 1726, 1728, 1730, 1732, 1734, 1736, 1738, 1740, 1742, 1744, 1746, 1748, 1750, 1752, 1754, 1756, 1758, and 1760. Lens data, including a radius of curvature of each of the surfaces of each of the lenses in optical lens system 1700, and lens composition, is shown in Table 13A. The surface of each lens facing object plane 1702 is designated by the letter "a" and the surface of each lens facing image plane 1704 is designated by the letter "b." The radius of curvature of a lens surface is negative if the center of curvature of the lens surface is on the same side of the lens surface as object plane 1702. The radius of curvature of a lens surface is positive if the center of curvature of the lens surface is on the same side of the lens surface as image plane 1704. The column of Table 13A designated "Thickness" refers to the distance from that surface to the adjacent lens surface in the direction of image plane 1704 as measured along optical axis 1708. The refractive index values are provided for the wavelength 365 nm.

Some of the surfaces of the lenses in optical lens system 1700 are aspherical surfaces. Specifically, surfaces 1720b, 1730a, 1738b, 1740a, 1748b, and 1758a are aspherical surfaces. The other lens surfaces in optical lens system 1700 are spherical surfaces. Aspherical surfaces are identified in Table 13B as having a shape "AS". Aspheric constants corresponding to Equation 1 for the aspherical surfaces of lenses in optical lens system 1700 are shown in Table 13B.

Values for |SA/CA|' for each lens surface is provided in Table 13C.

Other embodiments are in the following claims.

TABLE 1

| Field Size | $0.02 \leq NA_{max} < 0.07$ | $0.07 \leq NA_{max} < 0.13$ | $0.13 \leq NA_{max} < 0.18$ | $0.18 \leq NA_{max} < 0.25$ |
|---|---|---|---|---|
| 7 mm $\leq d_{max} \leq$ 16 mm | $0.23 < \Gamma \leq 0.33$ | $0.35 < \Gamma \leq 0.47$ | $0.43 < \Gamma \leq 0.55$ | $0.46 < \Gamma \leq 0.57$ |
| 16 mm $< d_{max} \leq$ 27 mm | $0.16 < \Gamma \leq 0.23$ | $0.25 < \Gamma \leq 0.35$ | $0.33 < \Gamma \leq 0.43$ | $0.38 < \Gamma \leq 0.46$ |
| 27 mm $< d_{max} \leq$ 36 mm | $0.12 < \Gamma \leq 0.16$ | $0.19 < \Gamma \leq 0.25$ | $0.27 < \Gamma \leq 0.33$ | $0.31 < \Gamma \leq 0.38$ |
| 36 mm $< d_{max} \leq$ 42 mm | $0.11 < \Gamma \leq 0.12$ | $0.18 < \Gamma \leq 0.19$ | $0.25 < \Gamma \leq 0.27$ | $0.29 < \Gamma \leq 0.31$ |

TABLE 2A

| Surface | Radius of Curvature (mm) | Shape | Thickness (mm) | Material | Index of Refraction | Semi Diameter (mm) |
|---|---|---|---|---|---|---|
| 102 | 0.00000000e+00 | | 4.81220577e+01 | AIR | 1.00000000e+00 | 4.200e+01 |
| 118a | −1.37163991e+02 | | 1.00000000e+01 | SILUV | 1.47455005e+00 | 5.000e+01 |
| 118b | 2.68046442e+03 | AS | 2.96404134e+01 | AIR | 1.00000000e+00 | 5.800e+01 |
| 120a | −7.04402373e+01 | | 9.99991191e+00 | SILUV | 1.47455005e+00 | 5.600e+01 |
| 120b | −1.05369956e+03 | | 3.58048026e+00 | AIR | 1.00000000e+00 | 8.200e+01 |
| 122a | −7.23118004e+02 | | 4.11079582e+01 | LLF1 | 1.57932005e+00 | 9.000e+01 |
| 122b | −1.15979087e+02 | | 1.00000000e+00 | AIR | 1.00000000e+00 | 9.500e+01 |
| 124a | 4.21912949e+02 | AS | 4.73423762e+01 | LLF1 | 1.57932005e+00 | 1.100e+02 |
| 124b | −1.86155801e+02 | | 1.00000000e+00 | AIR | 1.00000000e+00 | 1.100e+02 |
| 126a | −5.18615573e+02 | AS | 1.00000000e+01 | SILUV | 1.47455005e+00 | 1.070e+02 |
| 126b | 4.69166378e+02 | | 1.00000000e+00 | AIR | 1.00000000e+00 | 1.070e+02 |
| 128a | 1.28407790e+02 | | 4.51525616e+01 | LLF1 | 1.57932005e+00 | 1.020e+02 |
| 128b | 7.86664518e+02 | AS | 1.71244007e+02 | AIR | 1.00000000e+00 | 9.600e+01 |
| 130a | −1.36979166e+02 | AS | 1.00000000e+01 | LLF1 | 1.57932005e+00 | 4.500e+01 |
| 130b | 1.54365594e+02 | | 1.00000000e+00 | AIR | 1.00000000e+00 | 4.500e+01 |
| 132a | 1.00838829e+02 | | 3.30000000e+01 | SILUV | 1.47455005e+00 | 4.500e+01 |
| 132b | −6.83500721e+01 | | 0.00000000e+00 | AIR | 1.00000000e+00 | 4.500e+01 |
| 134a | −6.83500721e+01 | | 1.00000000e+01 | LLF1 | 1.57932005e+00 | 4.500e+01 |
| 134b | 1.54346348e+02 | | 1.00000000e+00 | AIR | 1.00000000e+00 | 4.500e+01 |
| 136a | 1.15721725e+02 | | 2.00000000e+01 | SILUV | 1.47455005e+00 | 4.500e+01 |
| 136b | −1.43444316e+02 | AS | 1.16200856e+01 | AIR | 1.00000000e+00 | 4.500e+01 |
| 138a | 1.43444316e+02 | AS | 2.00000000e+01 | SILUV | 1.47455005e+00 | 4.500e+01 |
| 138b | −1.15721725e+02 | | 1.00000000e+00 | AIR | 1.00000000e+00 | 4.500e+01 |
| 140a | −1.54346348e+02 | | 1.00000000e+01 | LLF1 | 1.57932005e+00 | 4.500e+01 |
| 140b | 6.83500721e+01 | | 0.00000000e+00 | AIR | 1.00000000e+00 | 4.500e+01 |
| 142a | 6.83500721e+01 | | 3.30000000e+01 | SILUV | 1.47455005e+00 | 4.500e+01 |
| 142b | −1.00838829e+02 | | 1.00000000e+00 | AIR | 1.00000000e+00 | 4.500e+01 |
| 144a | −1.54346348e+02 | | 1.00000000e+01 | LLF1 | 1.57932005e+00 | 4.500e+01 |
| 144b | 1.36979166e+02 | AS | 1.71244007e+02 | AIR | 1.00000000e+00 | 4.500e+01 |
| 146a | −7.86664518e+02 | AS | 4.51525616e+01 | LLF1 | 1.57932005e+00 | 9.600e+01 |
| 146b | −1.28407790e+02 | | 1.00000000e+00 | AIR | 1.00000000e+00 | 1.020e+02 |
| 148a | −4.69166378e+02 | | 1.00000000e+01 | SILUV | 1.47455005e+00 | 1.070e+02 |
| 148b | 5.18615573e+02 | AS | 1.00000000e+00 | AIR | 1.00000000e+00 | 1.070e+02 |
| 150a | 1.86155801e+02 | | 4.73423762e+01 | LLF1 | 1.57932005e+00 | 1.100e+02 |
| 150b | −4.21912949e+02 | AS | 1.00000000e+00 | AIR | 1.00000000e+00 | 1.100e+02 |
| 152a | 1.15979087e+02 | | 4.11079582e+01 | LLF1 | 1.57932005e+00 | 9.500e+01 |
| 152b | 7.23118004e+02 | | 3.58048026e+00 | AIR | 1.00000000e+00 | 9.000e+01 |
| 154a | 1.05369956e+03 | | 9.99991191e+00 | SILUV | 1.47455005e+00 | 8.200e+01 |
| 154b | 7.04402373e+01 | | 2.96404134e+01 | AIR | 1.00000000e+00 | 5.600e+01 |
| 156a | −2.68046442e+03 | AS | 1.00000000e+01 | SILUV | 1.47455005e+00 | 5.800e+01 |
| 156b | 1.37163991e+02 | | 4.81224477e+01 | AIR | 1.00000000e+00 | 5.000e+01 |

TABLE 2B

| | Surface | | | | |
|---|---|---|---|---|---|
| | 118b | 124a | 126a | 128b | 130a |
| CC | 0.00000000e+00 | 0.00000000e+00 | 0.00000000e+00 | 0.00000000e+00 | 0.00000000e+00 |
| $C_1$ | −2.70066387e−07 | −6.84722869e−08 | 4.63743763e−08 | 8.03142288e−08 | −1.37530444e−07 |
| $C_2$ | 3.78396235e−11 | −4.25228527e−13 | 3.17941021e−12 | 1.24159547e−12 | 1.83982401e−12 |
| $C_3$ | 2.48445426e−16 | 1.52283147e−16 | −5.11975502e−17 | −3.59789562e−17 | 1.37522279e−15 |
| $C_4$ | 4.23149777e−19 | −4.67204568e−21 | 7.60852057e−22 | 2.49994642e−21 | 1.02582272e−18 |
| $C_5$ | 0.00000000e+00 | 0.00000000e+00 | 0.00000000e+00 | 0.00000000e+00 | 0.00000000e+00 |
| $C_6$ | 0.00000000e+00 | 0.00000000e+00 | 0.00000000e+00 | 0.00000000e+00 | 0.00000000e+00 |
| $C_7$ | 0.00000000e+00 | 0.00000000e+00 | 0.00000000e+00 | 0.00000000e+00 | 0.00000000e+00 |
| $C_8$ | 0.00000000e+00 | 0.00000000e+00 | 0.00000000e+00 | 0.00000000e+00 | 0.00000000e+00 |
| $C_9$ | 0.00000000e+00 | 0.00000000e+00 | 0.00000000e+00 | 0.00000000e+00 | 0.00000000e+00 |
| | Surface | | | | |
| | 136b | 138a | 144b | 146a | 148b |
| CC | 0.00000000e+00 | 0.00000000e+00 | 0.00000000e+00 | 0.00000000e+00 | 0.00000000e+00 |
| $C_1$ | 1.38417562e−07 | −1.38417562e−07 | 1.37530444e−07 | −8.03142288e−08 | −4.63743763e−08 |
| $C_2$ | 2.71948361e−11 | −2.71948361e−11 | −1.83982401e−12 | 1.24159547e−12 | −3.17941021e−12 |
| $C_3$ | 4.53134967e−15 | −4.53134967e−15 | −1.37522279e−15 | 3.59789562e−17 | 5.11975502e−17 |
| $C_4$ | −5.47235420e−19 | 5.47235420e−19 | −1.02582272e−18 | −2.49994642e−21 | −7.60852057e−22 |
| $C_5$ | 0.00000000e+00 | 0.00000000e+00 | 0.00000000e+00 | 0.00000000e+00 | 0.00000000e+00 |
| $C_6$ | 0.00000000e+00 | 0.00000000e+00 | 0.00000000e+00 | 0.00000000e+00 | 0.00000000e+00 |
| $C_7$ | 0.00000000e+00 | 0.00000000e+00 | 0.00000000e+00 | 0.00000000e+00 | 0.00000000e+00 |

TABLE 2B-continued

| | | | | | |
|---|---|---|---|---|---|
| $C_8$ | 0.00000000e+00 | 0.00000000e+00 | 0.00000000e+00 | 0.00000000e+00 | 0.00000000e+00 |
| $C_9$ | 0.00000000e+00 | 0.00000000e+00 | 0.00000000e+00 | 0.00000000e+00 | 0.00000000e+00 |

| | Surface | |
|---|---|---|
| | 150b | 156a |
| CC | 0.00000000e+00 | 0.00000000e+00 |
| $C_1$ | 6.84722869e-08 | 2.70066387e-07 |
| $C_2$ | 4.25228527e-13 | -3.78396235e-11 |
| $C_3$ | -1.52283147e-16 | -2.48445426e-16 |
| $C_4$ | 4.67204568e-21 | -4.23149777e-19 |
| $C_5$ | 0.00000000e+00 | 0.00000000e+00 |
| $C_6$ | 0.00000000e+00 | 0.00000000e+00 |
| $C_7$ | 0.00000000e+00 | 0.00000000e+00 |
| $C_8$ | 0.00000000e+00 | 0.00000000e+00 |
| $C_9$ | 0.00000000e+00 | 0.00000000e+00 |

TABLE 3A

| Surface | Radius of Curvature (mm) | Shape | Thickness (mm) | Material | Index of Refraction | Semi Diameter (mm) |
|---|---|---|---|---|---|---|
| 202 | 0.00000000e+00 | | 5.48734864e+01 | AIR | 1.00000000e+00 | 4.200e+01 |
| 218a | -1.32698774e+02 | | 1.00000000e+01 | SILUV | 1.47455005e+00 | 5.000e+01 |
| 218b | 3.77198602e+03 | AS | 2.70834077e+01 | AIR | 1.00000000e+00 | 5.800e+01 |
| 220a | -7.21732606e+01 | | 9.99996966e+00 | SILUV | 1.47455005e+00 | 5.600e+01 |
| 220b | -2.89920496e+04 | | 3.98757605e+00 | AIR | 1.00000000e+00 | 8.200e+01 |
| 222a | -1.46846778e+03 | | 3.84242606e+01 | LLF1 | 1.57932005e+00 | 9.000e+01 |
| 222b | -1.19832810e+02 | | 1.00000000e+00 | AIR | 1.00000000e+00 | 9.500e+01 |
| 224a | 4.19926570e+02 | AS | 4.31299293e+01 | LLF1 | 1.57932005e+00 | 1.100e+02 |
| 224b | -1.82888071e+02 | | 1.00000000e+00 | AIR | 1.00000000e+00 | 1.100e+02 |
| 226a | -5.96372972e+02 | AS | 1.00000000e+01 | SILUV | 1.47455005e+00 | 1.070e+02 |
| 226b | 4.78340357e+02 | | 1.00000000e+00 | AIR | 1.00000000e+00 | 1.070e+02 |
| 228a | 1.29506584e+02 | | 4.02559245e+01 | LLF1 | 1.57932005e+00 | 1.020e+02 |
| 228b | 7.72708728e+02 | AS | 1.78237690e+02 | AIR | 1.00000000e+00 | 9.600e+01 |
| 230a | -1.30731779e+02 | AS | 1.00000000e+01 | LLF1 | 1.57932005e+00 | 4.500e+01 |
| 230b | 1.56194513e+02 | | 1.00000000e+00 | AIR | 1.00000000e+00 | 4.500e+01 |
| 232a | 1.01942142e+02 | | 3.30000000e+01 | SILUV | 1.47455005e+00 | 4.500e+01 |
| 232b | -7.03869787e+01 | | 0.00000000e+00 | AIR | 1.00000000e+00 | 4.500e+01 |
| 234a | -7.03869787e+01 | | 1.00000000e+01 | LLF1 | 1.57932005e+00 | 4.500e+01 |
| 234b | 1.56194244e+02 | | 1.00000000e+00 | AIR | 1.00000000e+00 | 4.500e+01 |
| 236a | 1.15464365e+02 | | 2.00000000e+01 | SILUV | 1.47455005e+00 | 4.500e+01 |
| 236b | -1.39754365e+02 | AS | 1.20152969e+01 | AIR | 1.00000000e+00 | 4.500e+01 |
| 238a | 1.39754365e+02 | AS | 2.00000000e+01 | SILUV | 1.47455005e+00 | 4.500e+01 |
| 238b | -1.15464365e+02 | | 1.00000000e+00 | AIR | 1.00000000e+00 | 4.500e+01 |
| 240a | -1.56194244e+02 | | 1.00000000e+01 | LLF1 | 1.57932005e+00 | 4.500e+01 |
| 240b | 7.03869787e+01 | | 0.00000000e+00 | AIR | 1.00000000e+00 | 4.500e+01 |
| 242a | 7.03869787e+01 | | 3.30000000e+01 | SILUV | 1.47455005e+00 | 4.500e+01 |
| 242b | -1.01942142e+02 | | 1.00000000e+00 | AIR | 1.00000000e+00 | 4.500e+01 |
| 244a | -1.56194244e+02 | | 1.00000000e+01 | LLF1 | 1.57932005e+00 | 4.500e+01 |
| 244b | 1.30731779e+02 | AS | 1.78237690e+02 | AIR | 1.00000000e+00 | 4.500e+01 |
| 246a | -7.72708728e+02 | AS | 4.02559245e+01 | LLF1 | 1.57932005e+00 | 9.600e+01 |
| 246b | -1.29506584e+02 | | 1.00000000e+00 | AIR | 1.00000000e+00 | 1.020e+02 |
| 248a | -4.78340357e+02 | | 1.00000000e+01 | SILUV | 1.47455005e+00 | 1.070e+02 |
| 248b | 5.96372972e+02 | AS | 1.00000000e+00 | AIR | 1.00000000e+00 | 1.070e+02 |
| 250a | 1.82888071e+02 | | 4.31299293e+01 | LLF1 | 1.57932005e+00 | 1.100e+02 |
| 250b | -4.19926570e+02 | AS | 1.00000000e+00 | AIR | 1.00000000e+00 | 1.100e+02 |
| 252a | 1.19832810e+02 | | 3.84242606e+01 | LLF1 | 1.57932005e+00 | 9.500e+01 |
| 252b | 1.46846778e+03 | | 3.98757605e+00 | AIR | 1.00000000e+00 | 9.000e+01 |
| 254a | 2.89920496e+04 | | 9.99996966e+00 | SILUV | 1.47455005e+00 | 8.200e+01 |
| 254b | 7.21732606e+01 | | 2.70834077e+01 | AIR | 1.00000000e+00 | 5.600e+01 |
| 256a | -3.77198602e+03 | AS | 1.00000000e+01 | SILUV | 1.47455005e+00 | 5.800e+01 |
| 256b | 1.32698774e+02 | | 5.48737146e+01 | AIR | 1.00000000e+00 | 5.000e+01 |

TABLE 3B

| | Surface | | | | |
|---|---|---|---|---|---|
| | 218b | 224a | 226a | 228b | 230a |
| CC | 0.00000000e+00 | 0.00000000e+00 | 0.00000000e+00 | 0.00000000e+00 | 0.00000000e+00 |
| $C_1$ | -2.59722980e-07 | -6.91914714e-08 | 5.14143149e-08 | 8.41397300e-08 | -1.35581207e-07 |
| $C_2$ | 3.38879598e-11 | -5.90320344e-13 | 3.67036624e-12 | 9.10627316e-13 | 1.21285787e-13 |

TABLE 3B-continued

| | | | | | |
|---|---|---|---|---|---|
| $C_3$ | 6.85692115e−16 | 1.54142948e−16 | −4.07951568e−17 | −4.00030551e−17 | 1.47150542e−15 |
| $C_4$ | 2.33900113e−19 | −4.59059241e−21 | 2.26633961e−22 | 3.79483434e−21 | 1.09033148e−18 |
| $C_5$ | 0.00000000e+00 | 0.00000000e+00 | 0.00000000e+00 | 0.00000000e+00 | 0.00000000e+00 |
| $C_6$ | 0.00000000e+00 | 0.00000000e+00 | 0.00000000e+00 | 0.00000000e+00 | 0.00000000e+00 |
| $C_7$ | 0.00000000e+00 | 0.00000000e+00 | 0.00000000e+00 | 0.00000000e+00 | 0.00000000e+00 |
| $C_8$ | 0.00000000e+00 | 0.00000000e+00 | 0.00000000e+00 | 0.00000000e+00 | 0.00000000e+00 |
| $C_9$ | 0.00000000e+00 | 0.00000000e+00 | 0.00000000e+00 | 0.00000000e+00 | 0.00000000e+00 |

| | Surface | | | | |
|---|---|---|---|---|---|
| | 236b | 238a | 244b | 246a | 248b |
| CC | 0.00000000e+00 | 0.00000000e+00 | 0.00000000e+00 | 0.00000000e+00 | 0.00000000e+00 |
| $C_1$ | 1.46017945e−07 | −1.46017945e−07 | 1.35581207e−07 | −8.41397300e−08 | −5.14143149e−08 |
| $C_2$ | 2.90569192e−11 | −2.90569192e−11 | −1.21285787e−13 | −9.10627316e−13 | −3.67036624e−12 |
| $C_3$ | 3.60737279e−15 | −3.60737279e−15 | −1.47150542e−15 | 4.00030551e−17 | 4.07951568e−17 |
| $C_4$ | −1.79224288e−19 | 1.79224288e−19 | −1.09033148e−18 | −3.79483434e−21 | −2.26633961e−22 |
| $C_5$ | 0.00000000e+00 | 0.00000000e+00 | 0.00000000e+00 | 0.00000000e+00 | 0.00000000e+00 |
| $C_6$ | 0.00000000e+00 | 0.00000000e+00 | 0.00000000e+00 | 0.00000000e+00 | 0.00000000e+00 |
| $C_7$ | 0.00000000e+00 | 0.00000000e+00 | 0.00000000e+00 | 0.00000000e+00 | 0.00000000e+00 |
| $C_8$ | 0.00000000e+00 | 0.00000000e+00 | 0.00000000e+00 | 0.00000000e+00 | 0.00000000e+00 |
| $C_9$ | 0.00000000e+00 | 0.00000000e+00 | 0.00000000e+00 | 0.00000000e+00 | 0.00000000e+00 |

| | Surface | |
|---|---|---|
| | 250b | 256a |
| CC | 0.00000000e+00 | 0.00000000e+00 |
| $C_1$ | 6.91914714e−08 | 2.59722980e−07 |
| $C_2$ | 5.90320344e−13 | −3.38879598e−11 |
| $C_3$ | −1.54142948e−16 | −6.85692115e−16 |
| $C_4$ | 4.59059241e−21 | −2.33900113e−19 |
| $C_5$ | 0.00000000e+00 | 0.00000000e+00 |
| $C_6$ | 0.00000000e+00 | 0.00000000e+00 |
| $C_7$ | 0.00000000e+00 | 0.00000000e+00 |
| $C_8$ | 0.00000000e+00 | 0.00000000e+00 |
| $C_9$ | 0.00000000e+00 | 0.00000000e+00 |

TABLE 4A

| Surface | Radius of Curvature (mm) | Shape | Thickness (mm) | Material | Index of Refraction | Semi Diameter (mm) |
|---|---|---|---|---|---|---|
| 302 | 0.00000000e+00 | | 4.49992248e+01 | AIR | 1.00000000e+00 | 42.0 |
| 318a | −9.83948989e+01 | AS | 1.00000000e+01 | SILUV | 1.47455005e+00 | 48.8 |
| 318b | −7.91219829e+02 | | 2.56155587e+01 | AIR | 1.00000000e+00 | 54.9 |
| 320a | −8.19665406e+01 | | 1.63923290e+01 | SILUV | 1.47455005e+00 | 56.9 |
| 320b | −1.38852318e+02 | | 9.99737823e−01 | AIR | 1.00000000e+00 | 69.1 |
| 322a | 1.73825469e+04 | | 4.19957437e+01 | SILUV | 1.47455005e+00 | 80.5 |
| 322b | −1.21336650e+02 | | 1.00000000e+00 | AIR | 1.00000000e+00 | 83.6 |
| 324a | 2.06680985e+02 | AS | 3.58975943e+01 | SILUV | 1.47455005e+00 | 90.4 |
| 324b | −4.90301169e+02 | | 1.00000000e+00 | AIR | 1.00000000e+00 | 90.1 |
| 326a | 1.25668844e+02 | | 3.25531005e+01 | SILUV | 1.47455005e+00 | 83.7 |
| 326b | 4.21023390e+02 | | 5.44862022e+01 | AIR | 1.00000000e+00 | 80.6 |
| 328a | −2.43990350e+02 | AS | 9.99994016e+00 | SILUV | 1.47455005e+00 | 63.5 |
| 328b | 1.25682286e+02 | | 1.27344813e+02 | AIR | 1.00000000e+00 | 57.5 |
| 330a | −1.67071132e+02 | AS | 7.00000000e+00 | SILUV | 1.47455005e+00 | 54.1 |
| 330b | 2.38307401e+02 | | 9.99336534e−01 | AIR | 1.00000000e+00 | 56.2 |
| 332a | 1.16024868e+02 | | 4.43493562e+01 | CAFUV | 1.44491323e+00 | 59.1 |
| 332b | −9.98311300e+01 | | 1.32955642e+00 | AIR | 1.00000000e+00 | 58.9 |
| 334a | −9.75816342e+01 | | 7.00000000e+00 | SILUV | 1.47455005e+00 | 58.4 |
| 334b | 1.71980397e+02 | AS | 9.92401525e−02 | AIR | 1.00000000e+00 | 58.6 |
| 336a | 1.41179057e+02 | | 3.19385563e+01 | CAFUV | 1.44491323e+00 | 59.3 |
| 336b | −1.83456627e+02 | | 9.99949351e+00 | AIR | 1.00000000e+00 | 59.5 |
| 338a | 1.83456627e+02 | | 3.19385563e+01 | CAFUV | 1.44491323e+00 | 59.5 |
| 338b | −1.41179057e+02 | | 9.92401525e−02 | AIR | 1.00000000e+00 | 59.3 |
| 340a | −2.38537153e+02 | AS | 7.00000000e+00 | SILUV | 1.47455005e+00 | 58.6 |
| 340b | 9.75816342e+01 | | 1.32955642e+00 | AIR | 1.00000000e+00 | 58.4 |
| 342a | 9.98311300e+01 | | 4.43493562e+01 | CAFUV | 1.44491323e+00 | 58.9 |
| 342b | −1.16024868e+02 | | 9.99336534e−01 | AIR | 1.00000000e+00 | 59.1 |
| 344a | −2.38307401e+02 | | 7.00000000e+00 | SILUV | 1.47455005e+00 | 56.2 |
| 344b | 1.67071132e+02 | AS | 1.27344813e+02 | AIR | 1.00000000e+00 | 54.1 |
| 346a | −1.25682286e+02 | | 9.99994016e+00 | SILUV | 1.47455005e+00 | 57.5 |
| 346b | 2.43990350e+02 | AS | 5.44862022e+01 | AIR | 1.00000000e+00 | 63.4 |
| 348a | −4.21023390e+02 | | 3.25531005e+01 | SILUV | 1.47455005e+00 | 80.6 |
| 348b | −1.25668844e+02 | | 1.00000000e+00 | AIR | 1.00000000e+00 | 83.7 |
| 350a | 4.90301169e+02 | | 3.58975943e+01 | SILUV | 1.47455005e+00 | 90.0 |
| 350b | −2.06680985e+02 | AS | 1.00000000e+00 | AIR | 1.00000000e+00 | 90.4 |

TABLE 4A-continued

| Surface | Radius of Curvature (mm) | Shape | Thickness (mm) | Material | Index of Refraction | Semi Diameter (mm) |
|---|---|---|---|---|---|---|
| 352a | 1.21336650e+02 | | 4.19957437e+01 | SILUV | 1.47455005e+00 | 83.6 |
| 352b | −1.73825469e+04 | | 9.99737823e−01 | AIR | 1.00000000e+00 | 80.5 |
| 354a | 1.38852318e+02 | | 1.63923290e+01 | SILUV | 1.47455005e+00 | 69.1 |
| 354b | 8.19665406e+01 | | 2.56155587e+01 | AIR | 1.00000000e+00 | 56.9 |
| 356a | 7.91219829e+02 | | 1.00000000e+01 | SILUV | 1.47455005e+00 | 54.9 |
| 356b | 9.83948989e+01 | AS | 4.49992248e+01 | AIR | 1.00000000e+00 | 48.7 |

TABLE 4B

| | Surface | | | | |
|---|---|---|---|---|---|
| | 318a | 324a | 328a | 330a | 334b |
| CC | 0 | 0 | 0 | 0 | 0 |
| $C_1$ | 0 | 0 | 0 | 0 | 0 |
| $C_2$ | 2.258341e−07 | −4.343082e−08 | −1.081026e−07 | 7.094568e−08 | 2.595889e−07 |
| $C_3$ | −1.906710e−11 | 2.018085e−12 | 1.989980e−11 | −2.286484e−11 | −5.680232e−12 |
| $C_4$ | −1.035766e−14 | −1.405321e−16 | 2.177477e−16 | −1.299277e−15 | 2.061329e−15 |
| $C_5$ | 1.016534e−17 | 9.500322e−21 | −4.577578e−19 | 1.212881e−18 | −1.011288e−18 |
| $C_6$ | −8.969855e−21 | −8.651639e−25 | 1.639235e−22 | −6.679002e−22 | 5.301579e−22 |
| $C_7$ | 4.078566e−24 | 6.341420e−29 | −4.432664e−26 | 1.663016e−25 | −1.619427e−25 |
| $C_8$ | −1.018593e−27 | −2.847522e−33 | 6.815710e−30 | −1.330706e−29 | 2.641944e−29 |
| $C_9$ | 1.015099e−31 | 2.625852e−38 | −4.293616e−34 | −1.189795e−33 | −1.801675e−33 |

| | Surface | | | | |
|---|---|---|---|---|---|
| | 340a | 344b | 346b | 350b | 356b |
| CC | 0 | 0 | 0 | 0 | 0 |
| $C_1$ | 0 | 0 | 0 | 0 | 0 |
| $C_2$ | −2.595889e−07 | −7.094568e−08 | 1.081026e−07 | 4.343082e−08 | −2.258341e−07 |
| $C_3$ | 5.680232e−12 | 2.286484e−11 | −1.989980e−11 | −2.018085e−12 | 1.906710e−11 |
| $C_4$ | −2.061329e−15 | 1.299277e−15 | −2.177477e−16 | 1.405321e−16 | 1.035766e−14 |
| $C_5$ | 1.011288e−18 | −1.212881e−18 | 4.577578e−19 | −9.500322e−21 | −1.016534e−17 |
| $C_6$ | −5.301579e−22 | 6.679002e−22 | −1.639235e−22 | 8.651639e−25 | 8.969855e−21 |
| $C_7$ | 1.619427e−25 | −1.663016e−25 | 4.432664e−26 | −6.341420e−29 | −4.078566e−24 |
| $C_8$ | −2.641944e−29 | 1.330706e−29 | −6.815710e−30 | 2.847522e−33 | 1.018593e−27 |
| $C_9$ | 1.801675e−33 | 1.189795e−33 | 4.293616e−34 | −2.625852e−38 | −1.015099e−31 |

TABLE 5A

| Surface | Radius of Curvature (mm) | Shape | Thickness (mm) | Material | Index of Refraction | Semi Diameter (mm) |
|---|---|---|---|---|---|---|
| 402 | 0.00000000e+00 | | 4.00000000e+01 | AIR | 1.00000000e+00 | 42.0 |
| 418a | −9.99525336e+01 | | 1.30292896e+01 | LLF1 | 1.57932005e+00 | 47.7 |
| 418b | −6.99294764e+01 | | 5.11329958e+00 | AIR | 1.00000000e+00 | 49.3 |
| 420a | −8.02102778e+01 | | 9.95050863e+00 | SILUV | 1.47455005e+00 | 49.2 |
| 420b | −6.40160814e+02 | AS | 1.65290658e+01 | AIR | 1.00000000e+00 | 54.6 |
| 422a | −8.86316450e+01 | | 4.73916027e+01 | SILUV | 1.47455005e+00 | 54.7 |
| 422b | −1.46202017e+02 | AS | 1.00000000e+00 | AIR | 1.00000000e+00 | 74.0 |
| 424a | 2.56009461e+02 | | 3.29982438e+01 | SILUV | 1.47455005e+00 | 85.5 |
| 424b | −2.88346747e+02 | | 1.00000000e+00 | AIR | 1.00000000e+00 | 85.9 |
| 426a | 1.59513715e+02 | | 3.28094100e+01 | SILUV | 1.47455005e+00 | 84.6 |
| 426b | −4.85046273e+02 | AS | 9.17604655e+01 | AIR | 1.00000000e+00 | 83.1 |
| 428a | −4.04768357e+02 | AS | 9.99454097e+00 | SILUV | 1.47455005e+00 | 57.6 |
| 428b | 1.13338203e+02 | | 9.79115943e+01 | AIR | 1.00000000e+00 | 53.8 |
| 430a | −2.21127325e+02 | | 7.00000000e+00 | SILUV | 1.47455005e+00 | 57.0 |
| 430b | 2.55071101e+02 | | 9.80230573e−01 | AIR | 1.00000000e+00 | 59.4 |
| 432a | 1.26103272e+02 | | 5.00977095e+01 | CAFUV | 1.44491323e+00 | 62.5 |
| 432b | −1.11045143e+02 | | 1.04715898e+00 | AIR | 1.00000000e+00 | 62.6 |
| 434a | −1.08188037e+02 | | 7.00000000e+00 | SILUV | 1.47455005e+00 | 62.4 |
| 434b | 2.30990432e+02 | AS | 1.46516574e+00 | AIR | 1.00000000e+00 | 63.5 |
| 436a | 1.58316130e+02 | | 3.19746840e+01 | CAFUV | 1.44491323e+00 | 64.5 |
| 436b | −1.63517428e+02 | | 1.99718204e+00 | AIR | 1.00000000e+00 | 64.8 |
| 438a | 1.63517428e+02 | | 3.19746840e+01 | CAFUV | 1.44491323e+00 | 64.7 |
| 438b | −1.58316130e+02 | | 1.46516574e+00 | AIR | 1.00000000e+00 | 64.5 |
| 440a | −2.30990432e+02 | AS | 7.00000000e+00 | SILUV | 1.47455005e+00 | 63.5 |
| 440b | 1.08188037e+02 | | 1.04715898e+00 | AIR | 1.00000000e+00 | 62.4 |
| 442a | 1.11045143e+02 | | 5.00977095e+01 | CAFUV | 1.44491323e+00 | 62.6 |
| 442b | −1.26103272e+02 | | 9.80230573e−01 | AIR | 1.00000000e+00 | 62.5 |
| 444a | −2.55071101e+02 | | 7.00000000e+00 | SILUV | 1.47455005e+00 | 59.4 |

TABLE 5A-continued

| Surface | Radius of Curvature (mm) | Shape | Thickness (mm) | Material | Index of Refraction | Semi Diameter (mm) |
|---|---|---|---|---|---|---|
| 444b | 2.21127325e+02 | | 9.79115943e+01 | AIR | 1.00000000e+00 | 56.9 |
| 446a | −1.13338203e+02 | | 9.99454097e+00 | SILUV | 1.47455005e+00 | 53.8 |
| 446b | 4.04768357e+02 | AS | 9.17604655e+01 | AIR | 1.00000000e+00 | 57.6 |
| 448a | 4.85046273e+02 | AS | 3.28094100e+01 | SILUV | 1.47455005e+00 | 83.1 |
| 448b | −1.59513715e+02 | | 1.00000000e+00 | AIR | 1.00000000e+00 | 84.6 |
| 450a | 2.88346747e+02 | | 3.29982438e+01 | SILUV | 1.47455005e+00 | 85.9 |
| 450b | −2.56009461e+02 | | 1.00000000e+00 | AIR | 1.00000000e+00 | 85.5 |
| 452a | 1.46202017e+02 | AS | 4.73916027e+01 | SILUV | 1.47455005e+00 | 74.0 |
| 452b | 8.86316450e+01 | | 1.65290658e+01 | AIR | 1.00000000e+00 | 54.7 |
| 454a | 6.40160814e+02 | AS | 9.95050863e+00 | SILUV | 1.47455005e+00 | 54.6 |
| 454b | 8.02102778e+01 | | 5.11329958e+00 | AIR | 1.00000000e+00 | 49.2 |
| 456a | 6.99294764e+01 | | 1.30292896e+01 | LLF1 | 1.47455005e+00 | 49.3 |
| 456b | 9.99525336e+01 | | 4.00000000e+01 | AIR | 1.00000000e+00 | 47.7 |

TABLE 5B

| | Surface | | | | |
|---|---|---|---|---|---|
| | 420b | 422b | 426b | 428a | 434b |
| CC | 0 | 0 | 0 | 0 | 0 |
| $C_1$ | 0 | 0 | 0 | 0 | 0 |
| $C_2$ | −1.471278e−07 | 1.384667e−08 | 1.140753e−07 | 3.904134e−08 | 1.621903e−07 |
| $C_3$ | 3.821584e−11 | −1.188191e−11 | 5.572952e−12 | −4.020572e−12 | 3.015132e−12 |
| $C_4$ | −1.751915e−15 | −3.194922e−16 | −1.323554e−15 | −1.378776e−15 | 2.608037e−16 |
| $C_5$ | 4.078997e−19 | 6.538807e−20 | 1.078720e−19 | 4.212583e−19 | −1.233553e−19 |
| $C_6$ | −2.208901e−22 | −2.254772e−24 | −4.485745e−24 | −6.438074e−23 | 2.455384e−23 |
| $C_7$ | 1.730620e−26 | −3.678634e−28 | 9.755013e−29 | 5.710778e−27 | −2.090486e−27 |
| $C_8$ | 0 | 0 | 0 | 0 | 0 |
| $C_9$ | 0 | 0 | 0 | 0 | 0 |

| | Surface | | | | |
|---|---|---|---|---|---|
| | 440a | 446b | 448a | 452a | 454a |
| CC | 0 | 0 | 0 | 0 | 0 |
| $C_1$ | 0 | 0 | 0 | 0 | 0 |
| $C_2$ | −1.621903e−07 | −3.904134e−08 | −1.140753e−07 | −1.384667e−08 | 1.471278e−07 |
| $C_3$ | −3.015132e−12 | 4.020572e−12 | −5.572952e−12 | 1.188191e−11 | −3.821584e−11 |
| $C_4$ | −2.608037e−16 | 1.378776e−15 | 1.323554e−15 | 3.194922e−16 | 1.751915e−15 |
| $C_5$ | 1.233553e−19 | −4.212583e−19 | −1.078720e−19 | −6.538807e−20 | −4.078997e−19 |
| $C_6$ | −2.455384e−23 | 6.438074e−23 | 4.485745e−24 | 2.254772e−24 | 2.208901e−22 |
| $C_7$ | 2.090486e−27 | −5.710778e−27 | −9.755013e−29 | 3.678634e−28 | −1.730620e−26 |
| $C_8$ | 0 | 0 | 0 | 0 | 0 |
| $C_9$ | 0 | 0 | 0 | 0 | 0 |

TABLE 5C

| Surface | |SA/CA|′ |
|---|---|
| 418a | 0.17 |
| 418b | 0.19 |
| 420a | 0.21 |
| 420b | 0.23 |
| 422a | 0.27 |
| 422b | 0.33 |
| 424a | 0.35 |
| 424b | 0.36 |
| 426a | 0.37 |
| 426b | 0.39 |
| 428a | 0.56 |
| 428b | 0.58 |
| 430a | 0.84 |
| 430b | 0.85 |
| 432a | 0.86 |
| 432b | 0.93 |
| 434a | 0.94 |
| 434b | 0.95 |
| 436a | 0.95 |
| 436b | 1.00 |
| 438a | 1.00 |
| 438b | 0.95 |
| 440a | 0.95 |
| 440b | 0.94 |
| 442a | 0.93 |
| 442b | 0.86 |
| 444a | 0.85 |
| 444b | 0.84 |
| 446a | 0.58 |
| 446b | 0.56 |
| 448a | 0.39 |
| 448b | 0.37 |
| 450a | 0.36 |
| 450b | 0.33 |
| 452a | 0.33 |
| 452b | 0.27 |
| 454a | 0.23 |
| 454b | 0.21 |
| 456a | 0.19 |
| 456b | 0.17 |

TABLE 6A

| Surface | Radius of Curvature (mm) | Thickness (mm) | Material | Refractive index | Semi Diameter (mm) |
|---|---|---|---|---|---|
| 802 | 0.000000 | 31.000000 | AIR | 1.00000000 | 42.000 |
| DS | 0.000000 | 0.738915 | AIR | 1.00000000 | 47.104 |
| 818a | −1386.716234 | 19.227955 | LLF1 | 1.57931548 | 47.094 |
| 818b | −121.305114 | 1.699229 | AIR | 1.00000000 | 48.257 |
| 820a | −130.174964 | 6.998303 | SIO2 | 1.47458786 | 48.093 |
| 820b | 272.791152 | 28.886226 | AIR | 1.00000000 | 49.823 |
| 822a | −90.045309 | 28.917045 | SIO2 | 1.47458786 | 51.585 |
| 822b | −135.363404 | 1.360964 | AIR | 1.00000000 | 62.382 |
| 824a | 6155.057669 | 29.275288 | SIO2 | 1.47458786 | 67.306 |
| 824b | −139.550094 | 0.899164 | AIR | 1.00000000 | 69.286 |
| 826a | 401.571842 | 21.383701 | SIO2 | 1.47458786 | 69.707 |
| 826b | −460.590884 | 167.119731 | AIR | 1.00000000 | 69.251 |
| 828a | −222.584826 | 11.633677 | SIO2 | 1.47458786 | 45.497 |
| 828b | 178.118622 | 32.259267 | AIR | 1.00000000 | 44.909 |
| 830a | −73.302848 | 11.982081 | SIO2 | 1.47458786 | 45.802 |
| 830b | −1891.079945 | 0.933695 | AIR | 1.00000000 | 53.893 |
| 832a | 934.771604 | 35.031495 | CAF2 | 1.44491236 | 55.374 |
| 832b | −93.530438 | 0.899071 | AIR | 1.00000000 | 58.778 |
| 834a | 2332.011485 | 30.112767 | CAF2 | 1.44491236 | 60.039 |
| 834b | −148.096624 | 7.469957 | AIR | 1.00000000 | 60.545 |
| 836a | −110.309788 | 6.997917 | SIO2 | 1.47458786 | 60.126 |
| 836b | −232.642067 | 0.898370 | AIR | 1.00000000 | 61.828 |
| 838a | 277.876744 | 29.983730 | CAF2 | 1.44491236 | 62.202 |
| 838b | −152.278510 | 2.307181 | AIR | 1.00000000 | 61.662 |
| 840a | −150.671145 | 6.996035 | SIO2 | 1.47458786 | 60.892 |
| 840b | −745.217397 | 0.488251 | AIR | 1.00000000 | 60.113 |
| DS | 0.000000 | 0.000000 | AIR | 1.00000000 | 59.936 |
| DS | 0.000000 | 0.488251 | AIR | 1.00000000 | 59.936 |
| 842a | 745.217397 | 6.996035 | SIO2 | 1.47458786 | 60.237 |
| 842b | 150.671145 | 2.307181 | AIR | 1.00000000 | 61.017 |
| 844a | 152.278510 | 29.983730 | CAF2 | 1.44491236 | 61.789 |
| 844b | −277.876744 | 0.898370 | AIR | 1.00000000 | 62.324 |
| 846a | 232.642067 | 6.997917 | SIO2 | 1.47458786 | 61.943 |
| 846b | 110.309788 | 7.469957 | AIR | 1.00000000 | 60.231 |
| 848a | 148.096624 | 30.112767 | CAF2 | 1.44491236 | 60.647 |
| 848b | −2332.011485 | 0.899071 | AIR | 1.00000000 | 60.140 |
| 850a | 93.530438 | 35.031495 | CAF2 | 1.44491236 | 58.869 |
| 850b | −934.771604 | 0.933695 | AIR | 1.00000000 | 55.478 |
| 852a | 1891.079945 | 11.982081 | SIO2 | 1.47458786 | 53.989 |
| 852b | 73.302848 | 32.259267 | AIR | 1.00000000 | 45.863 |
| 854a | −178.118622 | 11.633677 | SIO2 | 1.47458786 | 44.972 |
| 854b | 222.584826 | 167.119731 | AIR | 1.00000000 | 45.556 |
| 856a | 460.590884 | 21.383701 | SIO2 | 1.47458786 | 69.292 |
| 856b | −401.571842 | 0.899164 | AIR | 1.00000000 | 69.746 |
| 858a | 139.550094 | 29.275288 | SIO2 | 1.47458786 | 69.320 |
| 858b | −6155.057669 | 1.360964 | AIR | 1.00000000 | 67.341 |
| 860a | 135.363404 | 28.917045 | SIO2 | 1.47458786 | 62.406 |
| 860b | 90.045309 | 28.886226 | AIR | 1.00000000 | 51.600 |
| 862a | −272.791152 | 6.998303 | SIO2 | 1.47458786 | 49.838 |
| 862b | 130.174964 | 1.699229 | AIR | 1.00000000 | 48.104 |
| 864a | 121.305114 | 19.227955 | LLF1 | 1.57931548 | 48.267 |
| 864b | 1386.716234 | 0.738915 | AIR | 1.00000000 | 47.102 |
| DS | 0.000000 | 31.000000 | AIR | 1.00000000 | 47.112 |
| 804 | 0.000000 | 0.000000 | AIR | 1.00000000 | 42.002 |

TABLE 6B

| Surface | $|SA/CA|'$ |
|---|---|
| 818a | 0.11 |
| 818b | 0.11 |
| 820a | 0.15 |
| 820b | 0.15 |
| 822a | 0.17 |
| 822b | 0.24 |
| 824a | 0.28 |
| 824b | 0.28 |
| 826a | 0.31 |
| 826b | 0.31 |
| 828a | 0.33 |
| 828b | 0.69 |
| 830a | 0.71 |
| 830b | 0.81 |
| 832a | 0.83 |
| 832b | 0.83 |
| 834a | 0.89 |
| 834b | 0.89 |
| 836a | 0.92 |
| 836b | 0.94 |
| 838a | 0.95 |
| 838b | 0.95 |
| 840a | 0.99 |
| 840b | 0.99 |
| 842a | 0.99 |
| 842b | 0.99 |

TABLE 6B-continued

| Surface | \|SA/CA\|' |
|---|---|
| 844a | 0.95 |
| 844b | 0.95 |
| 846a | 0.94 |
| 846b | 0.92 |
| 848a | 0.89 |
| 848b | 0.89 |
| 850a | 0.83 |
| 850b | 0.83 |
| 852a | 0.81 |
| 852b | 0.71 |
| 854a | 0.69 |
| 854b | 0.33 |

TABLE 6B-continued

| Surface | \|SA/CA\|' |
|---|---|
| 856a | 0.31 |
| 856b | 0.31 |
| 858a | 0.28 |
| 858b | 0.28 |
| 860a | 0.24 |
| 860b | 0.17 |
| 862a | 0.15 |
| 862b | 0.15 |
| 864a | 0.11 |
| 864b | 0.11 |

TABLE 7

| Surface | Radius of Curvature (mm) | Thickness (mm) | Material | Refractive index | Semi Diameter (mm) |
|---|---|---|---|---|---|
| 902 | 0.000000 | 31.000000 | AIR | 1.00000000 | 42.000 |
| DS | 0.000000 | −0.052414 | AIR | 1.00000000 | 47.184 |
| 918a | 5049.159359 | 19.405392 | LLF1 | 1.57923042 | 47.212 |
| 918b | −135.041281 | 0.899619 | AIR | 1.00000000 | 48.254 |
| 920a | −166.620099 | 6.999679 | SIO2 | 1.47458786 | 48.091 |
| 920b | 240.984838 | 28.710190 | AIR | 1.00000000 | 49.173 |
| 922a | −89.999203 | 29.913324 | SIO2 | 1.47458786 | 50.683 |
| 922b | −151.740549 | 0.899136 | AIR | 1.00000000 | 61.567 |
| 924a | −3003.828750 | 27.312859 | SIO2 | 1.47458786 | 65.347 |
| 924b | −139.016314 | 2.212690 | AIR | 1.00000000 | 67.431 |
| 926a | 456.789285 | 26.478155 | SIO2 | 1.47458786 | 68.347 |
| 926b | −287.360963 | 145.855106 | AIR | 1.00000000 | 68.034 |
| 928a | −169.244521 | 7.191640 | SIO2 | 1.47458786 | 45.075 |
| 928b | 182.330024 | 30.672386 | AIR | 1.00000000 | 44.831 |
| 930a | −79.043244 | 10.296350 | SIO2 | 1.47458786 | 45.903 |
| 930b | 758.586589 | 1.864795 | AIR | 1.00000000 | 53.575 |
| 932a | 602.238753 | 33.160633 | CAF2 | 1.44491236 | 54.789 |
| 932b | −104.420400 | 1.256671 | AIR | 1.00000000 | 58.436 |
| 934a | 15343.026605 | 29.509667 | CAF2 | 1.44491236 | 60.922 |
| 934b | −119.107703 | 9.505350 | AIR | 1.00000000 | 61.974 |
| 936a | −110.634076 | 14.322295 | SIO2 | 1.47458786 | 60.657 |
| 936b | −254.500321 | 7.729440 | AIR | 1.00000000 | 63.391 |
| 938a | 301.147710 | 34.000543 | CAF2 | 1.44491236 | 64.396 |
| 938b | −153.984686 | 2.482179 | AIR | 1.00000000 | 63.912 |
| 940a | −150.762017 | 7.023992 | BK7 | 1.53626700 | 63.207 |
| 940b | −367.549175 | 6.850325 | AIR | 1.00000000 | 63.128 |
| DS | 0.000000 | 0.000000 | AIR | 1.00000000 | 61.862 |
| DS | 0.000000 | 6.850325 | AIR | 1.00000000 | 61.862 |
| 942a | 367.549175 | 7.023992 | BK7 | 1.53626700 | 63.128 |
| 942b | 150.762017 | 2.482179 | AIR | 1.00000000 | 63.207 |
| 944a | 153.984686 | 34.000543 | CAF2 | 1.44491236 | 63.911 |
| 944b | −301.147710 | 7.729440 | AIR | 1.00000000 | 64.395 |
| 946a | 254.500321 | 14.322295 | SIO2 | 1.47458786 | 63.391 |
| 946b | 110.634076 | 9.505350 | AIR | 1.00000000 | 60.656 |
| 948a | 119.107703 | 29.509667 | CAF2 | 1.44491236 | 61.973 |
| 948b | −15343.026605 | 1.256671 | AIR | 1.00000000 | 60.921 |
| 950a | 104.420400 | 33.160633 | CAF2 | 1.44491236 | 58.435 |
| 950b | −602.238753 | 1.864795 | AIR | 1.00000000 | 54.788 |
| 952a | −758.586589 | 10.296350 | SIO2 | 1.47458786 | 53.573 |
| 952b | 79.043244 | 30.672386 | AIR | 1.00000000 | 45.902 |
| 954a | −182.330024 | 7.191640 | SIO2 | 1.47458786 | 44.830 |
| 954b | 169.244521 | 145.855106 | AIR | 1.00000000 | 45.074 |
| 956a | 287.360963 | 26.478155 | SIO2 | 1.47458786 | 68.029 |
| 956b | −456.789285 | 2.212690 | AIR | 1.00000000 | 68.341 |
| 958a | 139.016314 | 27.312859 | SIO2 | 1.47458786 | 67.425 |
| 958b | 3003.828750 | 0.899136 | AIR | 1.00000000 | 65.341 |
| 960a | 151.740549 | 29.913324 | SIO2 | 1.47458786 | 61.562 |
| 960b | 89.999203 | 28.710190 | AIR | 1.00000000 | 50.679 |
| 962a | −240.984838 | 6.999679 | SIO2 | 1.47458786 | 49.169 |
| 962b | 166.620099 | 0.899619 | AIR | 1.00000000 | 48.087 |
| 964a | 135.041281 | 19.405392 | LLF1 | 1.57923042 | 48.250 |
| 964b | −5049.159359 | −0.052414 | AIR | 1.00000000 | 47.207 |
| DS | 0.000000 | 31.000000 | AIR | 1.00000000 | 47.179 |
| 904 | 0.000000 | 0.000000 | AIR | 1.00000000 | 42.004 |

TABLE 8A

| Surface | Radius of Curvature (mm) | Thickness (mm) | Material | Refractive index | Semi Diameter (mm) |
|---|---|---|---|---|---|
| 1002 | 0.000000 | 31.000000 | AIR | 1.00000000 | 42.000 |
| DS | 0.000000 | 2.064129 | AIR | 1.00000000 | 48.692 |
| 1018a | −714.483756 | 32.318968 | LLF1 | 1.57923042 | 48.778 |
| 1018b | −102.459806 | 8.526314 | AIR | 1.00000000 | 51.968 |
| 1020a | −105.305325 | 7.021587 | SIO2 | 1.47458786 | 51.212 |
| 1020b | 336.481472 | 28.089807 | AIR | 1.00000000 | 54.246 |
| 1022a | −109.269539 | 29.828747 | SIO2 | 1.47458786 | 56.410 |
| 1022b | −180.351479 | 0.898273 | AIR | 1.00000000 | 68.304 |
| 1024a | −1965.401386 | 32.962557 | SIO2 | 1.47458786 | 72.884 |
| 1024b | −128.914358 | 0.898605 | AIR | 1.00000000 | 75.336 |
| 1026a | 175.630563 | 29.241898 | SIO2 | 1.47458786 | 77.015 |
| 1026b | −1970.532738 | 122.727577 | AIR | 1.00000000 | 75.736 |
| 1028a | −127.514984 | 6.998827 | SIO2 | 1.47458786 | 51.960 |
| 1028b | 142.262522 | 27.886577 | AIR | 1.00000000 | 52.268 |
| 1030a | −128.294477 | 6.985983 | SIO2 | 1.47458786 | 53.639 |
| 1030b | −8693.312028 | 2.583224 | AIR | 1.00000000 | 59.776 |
| 1032a | 370.184114 | 35.353675 | CAF2 | 1.44491236 | 64.121 |
| 1032b | −122.567730 | 0.896552 | AIR | 1.00000000 | 66.768 |
| 1034a | −1865.188090 | 32.094770 | CAF2 | 1.44491236 | 68.898 |
| 1034b | −115.779082 | 8.691016 | AIR | 1.00000000 | 69.769 |
| 1036a | −101.998197 | 6.997042 | SIO2 | 1.47458786 | 68.450 |
| 1036b | 315.525402 | 3.235522 | AIR | 1.00000000 | 74.753 |
| 1038a | 314.026847 | 48.494379 | CAF2 | 1.44491236 | 75.821 |
| 1038b | −117.310257 | 0.891835 | AIR | 1.00000000 | 77.488 |
| 1040a | −214.048188 | 8.330389 | LLF1 | 1.57923042 | 75.068 |
| 1040b | −245.512561 | 0.481755 | AIR | 1.00000000 | 75.546 |
| DS | 0.000000 | 0.000000 | AIR | 1.00000000 | 74.130 |
| DS | 0.000000 | 0.481755 | AIR | 1.00000000 | 74.130 |
| 1042a | 245.512561 | 8.330389 | LLF1 | 1.57923042 | 75.546 |
| 1042b | 214.048188 | 0.891835 | AIR | 1.00000000 | 75.068 |
| 1044a | 117.310257 | 48.494379 | CAF2 | 1.44491236 | 77.489 |
| 1044b | −314.026847 | 3.235522 | AIR | 1.00000000 | 75.821 |
| 1046a | −315.525402 | 6.997042 | SIO2 | 1.47458786 | 74.754 |
| 1046b | 101.998197 | 8.691016 | AIR | 1.00000000 | 68.450 |
| 1048a | 115.779082 | 32.094770 | CAF2 | 1.44491236 | 69.770 |
| 1048b | 1865.188090 | 0.896552 | AIR | 1.00000000 | 68.899 |
| 1050a | 122.567730 | 35.353675 | CAF2 | 1.44491236 | 66.769 |
| 1050b | −370.184114 | 2.583224 | AIR | 1.00000000 | 64.121 |
| 1052a | 8693.312028 | 6.985983 | SIO2 | 1.47458786 | 59.777 |
| 1052b | 128.294477 | 27.886577 | AIR | 1.00000000 | 53.640 |
| 1054a | −142.262522 | 6.998827 | SIO2 | 1.47458786 | 52.269 |
| 1054b | 127.514984 | 122.727577 | AIR | 1.00000000 | 51.961 |
| 1056a | 1970.532738 | 29.241898 | SIO2 | 1.47458786 | 75.740 |
| 1056b | −175.630563 | 0.898605 | AIR | 1.00000000 | 77.019 |
| 1058a | 128.914358 | 32.962557 | SIO2 | 1.47458786 | 75.339 |
| 1058b | 1965.401386 | 0.898273 | AIR | 1.00000000 | 72.887 |
| 1060a | 180.351479 | 29.828747 | SIO2 | 1.47458786 | 68.307 |
| 1060b | 109.269539 | 28.089807 | AIR | 1.00000000 | 56.413 |
| 1062a | −336.481472 | 7.021587 | SIO2 | 1.47458786 | 54.249 |
| 1062b | 105.305325 | 8.526314 | AIR | 1.00000000 | 51.215 |
| 1064a | 102.459806 | 32.318968 | LLF1 | 1.57923042 | 51.971 |
| 1064b | 714.483756 | 2.064129 | AIR | 1.00000000 | 48.781 |
| DS | 0.000000 | 31.000000 | AIR | 1.00000000 | 48.695 |
| 1004 | 0.000000 | 0.000000 | AIR | 0.00000000 | 42.003 |

TABLE 8B

| Constant | Surface | | | |
|---|---|---|---|---|
| | 1028b | 1036b | 1046a | 1054a |
| CC | 0 | 0 | 0 | 0 |
| C1 | 1.385482e−07 | 3.132832e−08 | −3.132832e−08 | −1.385482e−07 |
| C2 | 8.632193e−12 | −1.100556e−12 | 1.100556e−12 | −8.632193e−12 |
| C3 | −3.842467e−16 | 1.921077e−17 | −1.921077e−17 | 3.842467e−16 |
| C4 | −1.972976e−19 | −8.639391e−21 | 8.639391e−21 | 1.972976e−19 |

TABLE 8B-continued

| Constant | Surface | | | |
|---|---|---|---|---|
| | 1028b | 1036b | 1046a | 1054a |
| C5 | 2.360589e−23 | 1.290805e−24 | −1.290805e−24 | −2.360589e−23 |
| C6 | −5.264560e−27 | −6.807570e−29 | 6.807570e−29 | 5.264560e−27 |
| C7 | 0.000000e+00 | 0.000000e+00 | 0.000000e+00 | 0.000000e+00 |
| C8 | 0.000000e+00 | 0.000000e+00 | 0.000000e+00 | 0.000000e+00 |
| C9 | 0.000000e+00 | 0.000000e+00 | 0.000000e+00 | 0.000000e+00 |

TABLE 9A

| Surface | Radius of Curvature (mm) | Thickness (mm) | Material | Refractive index | Semi Diameter (mm) |
|---|---|---|---|---|---|
| 1102 | 0.000000 | 31.000000 | AIR | 1.00000000 | 42.000 |
| DS | 0.000000 | 1.085991 | AIR | 1.00000000 | 48.670 |
| 1118a | −1074.953079 | 20.088390 | LLF1 | 1.57931548 | 48.666 |
| 1118b | −118.099773 | 10.319949 | AIR | 1.00000000 | 50.183 |
| 1120a | −127.174617 | 6.998791 | SIO2 | 1.47458786 | 49.878 |
| 1120b | 264.036905 | 27.735334 | AIR | 1.00000000 | 52.505 |
| 1122a | −111.004381 | 29.912785 | SIO2 | 1.47458786 | 54.779 |
| 1122b | −209.615108 | 0.899258 | AIR | 1.00000000 | 67.124 |
| 1124a | −2354.298761 | 33.297268 | SIO2 | 1.47458786 | 71.314 |
| 1124b | −124.332341 | 0.899107 | AIR | 1.00000000 | 73.944 |
| 1126a | 229.098524 | 28.325494 | SIO2 | 1.47458786 | 76.189 |
| 1126b | −541.124133 | 131.560464 | AIR | 1.00000000 | 75.455 |
| 1128a | −155.658339 | 6.998803 | SIO2 | 1.47458786 | 52.550 |
| 1128b | 193.514951 | 31.900420 | AIR | 1.00000000 | 52.538 |
| 1130a | −82.534830 | 10.807916 | SIO2 | 1.47458786 | 53.238 |
| 1130b | −1636.143905 | 2.529714 | AIR | 1.00000000 | 63.231 |
| 1132a | 934.469453 | 37.477816 | CAF2 | 1.44491236 | 66.398 |
| 1132b | −107.665507 | 0.897636 | AIR | 1.00000000 | 69.402 |
| 1134a | −601.835449 | 31.283513 | CAF2 | 1.44491236 | 71.599 |
| 1134b | −114.555018 | 5.922061 | AIR | 1.00000000 | 72.617 |
| 1136a | −102.993837 | 6.998457 | SIO2 | 1.47458786 | 72.035 |
| 1136b | −237.160165 | 0.899542 | AIR | 1.00000000 | 76.019 |
| 1138a | 229.843953 | 44.798197 | CAF2 | 1.44491236 | 78.312 |
| 1138b | −152.565575 | 5.374336 | AIR | 1.00000000 | 77.788 |
| 1140a | −141.400299 | 6.996843 | BK7 | 1.53626700 | 75.850 |
| 1140b | −410.001369 | 0.491920 | AIR | 1.00000000 | 75.907 |
| DS | 0.000000 | 0.000000 | AIR | 1.00000000 | 75.161 |
| DS | 0.000000 | 0.491920 | AIR | 1.00000000 | 75.161 |
| 1142a | 410.001369 | 6.996843 | BK7 | 1.53626700 | 75.907 |
| 1142b | 141.400299 | 5.374336 | AIR | 1.00000000 | 75.850 |
| 1144a | 152.565575 | 44.798197 | CAF2 | 1.44491236 | 77.789 |
| 1144b | −229.843953 | 0.899542 | AIR | 1.00000000 | 78.313 |
| 1146a | 237.160165 | 6.998457 | SIO2 | 1.47458786 | 76.019 |
| 1146b | 102.993837 | 5.922061 | AIR | 1.00000000 | 72.035 |
| 1148a | 114.555018 | 31.283513 | CAF2 | 1.44491236 | 72.617 |
| 1148b | 601.835449 | 0.897636 | AIR | 1.00000000 | 71.599 |
| 1150a | 107.665507 | 37.477816 | CAF2 | 1.44491236 | 69.403 |
| 1150b | −934.469453 | 2.529714 | AIR | 1.00000000 | 66.399 |
| 1152a | 1636.143905 | 10.807916 | SIO2 | 1.47458786 | 63.231 |
| 1152b | 82.534830 | 31.900420 | AIR | 1.00000000 | 53.239 |
| 1154a | −193.514951 | 6.998803 | SIO2 | 1.47458786 | 52.539 |
| 1154b | 155.658339 | 131.560464 | AIR | 1.00000000 | 52.550 |
| 1156a | 541.124133 | 28.325494 | SIO2 | 1.47458786 | 75.457 |
| 1156b | −229.098524 | 0.899107 | AIR | 1.00000000 | 76.192 |
| 1158a | 124.332341 | 33.297268 | SIO2 | 1.47458786 | 73.946 |
| 1158b | 2354.298761 | 0.899258 | AIR | 1.00000000 | 71.317 |
| 1160a | 209.615108 | 29.912785 | SIO2 | 1.47458786 | 67.127 |
| 1160b | 111.004381 | 27.735334 | AIR | 1.00000000 | 54.781 |
| 1162a | −264.036905 | 6.998791 | SIO2 | 1.47458786 | 52.508 |
| 1162b | 127.174617 | 10.319949 | AIR | 1.00000000 | 49.880 |
| 1164a | 118.099773 | 20.088390 | LLF1 | 1.57931548 | 50.185 |
| 1164b | 1074.953079 | 1.085991 | AIR | 1.00000000 | 48.669 |
| DS | 0.000000 | 31.000000 | AIR | 1.00000000 | 48.672 |
| 1104 | 0.000000 | 0.000000 | AIR | 1.00000000 | 42.002 |

TABLE 9B

| Con-stant | Surface | | | |
|---|---|---|---|---|
| | 1128b | 1136b | 1146a | 1154a |
| CC | 0 | 0 | 0 | 0 |
| C1 | 3.367069e−08 | 2.187427e−09 | −2.187427e−09 | −3.367069e−08 |
| C2 | −2.130639e−12 | −1.705387e−13 | 1.705387e−13 | 2.130639e−12 |
| C3 | 2.373851e−16 | −4.255783e−17 | 4.255783e−17 | −2.373851e−16 |
| C4 | −6.778203e−19 | 1.915530e−21 | −1.915530e−21 | 6.778203e−19 |
| C5 | 2.002439e−22 | −1.032764e−24 | 1.032764e−24 | −2.002439e−22 |
| C6 | −3.257132e−26 | −2.394367e−29 | 2.394367e−29 | 3.257132e−26 |
| C7 | 0.000000e+00 | 0.000000e+00 | 0.000000e+00 | 0.000000e+00 |
| C8 | 0.000000e+00 | 0.000000e+00 | 0.000000e+00 | 0.000000e+00 |
| C9 | 0.000000e+00 | 0.000000e+00 | 0.000000e+00 | 0.000000e+00 |

TABLE 10

| Surface | Radius of Curvature (mm) | Thickness (mm) | Material | Refractive index | Semi Diameter (mm) |
|---|---|---|---|---|---|
| 1202 | 0.000000 | 34.000000 | AIR | 1.00000000 | 42.000 |
| DS | 0.000000 | 0.129009 | AIR | 1.00000000 | 47.717 |
| 1218a | −2822.625506 | 19.779989 | LLF1 | 1.57931548 | 47.671 |
| 1218b | −111.432935 | 4.292833 | AIR | 1.00000000 | 48.678 |
| 1220a | −112.313771 | 6.983415 | SIO2 | 1.47458786 | 48.197 |
| 1220b | 263.662579 | 29.009885 | AIR | 1.00000000 | 50.079 |
| 1222a | −91.049421 | 16.611623 | SIO2 | 1.47458786 | 51.862 |
| 1222b | −155.044025 | 0.876111 | AIR | 1.00000000 | 59.456 |
| 1224a | −2105.236338 | 26.377392 | SIO2 | 1.47458786 | 63.429 |
| 1224b | −126.111515 | 0.886241 | AIR | 1.00000000 | 65.520 |
| 1226a | 514.537706 | 22.633438 | SIO2 | 1.47458786 | 67.129 |
| 1226b | −248.337642 | 163.426725 | AIR | 1.00000000 | 67.160 |
| 1228a | −124.641106 | 6.987651 | SIO2 | 1.47458786 | 45.553 |
| 1228b | 152.690677 | 31.238755 | AIR | 1.00000000 | 46.463 |
| 1230a | −80.796014 | 12.165293 | LLF1 | 1.57931548 | 48.249 |
| 1230b | −99.544326 | 17.929417 | AIR | 1.00000000 | 53.292 |
| 1232a | −495.858897 | 21.966586 | CAF2 | 1.44491236 | 61.406 |
| 1232b | −128.239150 | 12.130589 | AIR | 1.00000000 | 63.448 |
| 1234a | 3242.978846 | 30.070885 | CAF2 | 1.44491236 | 65.975 |
| 1234b | −118.360906 | 2.375005 | AIR | 1.00000000 | 66.449 |
| 1236a | −116.506616 | 6.987333 | SIO2 | 1.47458786 | 65.842 |
| 1236b | −994.982554 | 0.956154 | AIR | 1.00000000 | 67.523 |
| 1238a | 222.776965 | 38.034869 | CAF2 | 1.44491236 | 68.456 |
| 1238b | −148.207715 | 2.336758 | AIR | 1.00000000 | 67.877 |
| 1240a | −143.867700 | 6.951350 | SIO2 | 1.47458786 | 67.098 |
| 1240b | −882.424034 | 0.362841 | AIR | 1.00000000 | 66.310 |
| DS | 0.000000 | 0.000000 | AIR | 1.00000000 | 66.049 |
| DS | 0.000000 | 0.362841 | AIR | 1.00000000 | 66.049 |
| 1242a | 882.424034 | 6.951350 | SIO2 | 1.47458786 | 66.310 |
| 1242b | 143.867700 | 2.336758 | AIR | 1.00000000 | 67.098 |
| 1244a | 148.207715 | 38.034869 | CAF2 | 1.44491236 | 67.876 |
| 1244b | −222.776965 | 0.956154 | AIR | 1.00000000 | 68.455 |
| 1246a | 994.982554 | 6.987333 | SIO2 | 1.47458786 | 67.522 |
| 1246b | 116.506616 | 2.375005 | AIR | 1.00000000 | 65.841 |
| 1248a | 118.360906 | 30.070885 | CAF2 | 1.44491236 | 66.448 |
| 1248b | −3242.978846 | 12.130589 | AIR | 1.00000000 | 65.974 |
| 1250a | 128.239150 | 21.966586 | CAF2 | 1.44491236 | 63.446 |
| 1250b | 495.858897 | 17.929417 | AIR | 1.00000000 | 61.405 |
| 1252a | 99.544326 | 12.165293 | LLF1 | 1.57931548 | 53.291 |
| 1252b | 80.796014 | 31.238755 | AIR | 1.00000000 | 48.247 |
| 1254a | −152.690677 | 6.987651 | SIO2 | 1.47458786 | 46.461 |
| 1254b | 124.641106 | 163.426725 | AIR | 1.00000000 | 45.551 |
| 1256a | 248.337642 | 22.633438 | SIO2 | 1.47458786 | 67.152 |
| 1256b | −514.537706 | 0.886241 | AIR | 1.00000000 | 67.120 |
| 1258a | 126.111515 | 26.377392 | SIO2 | 1.47458786 | 65.512 |
| 1258b | 2105.236338 | 0.876111 | AIR | 1.00000000 | 63.420 |
| 1260a | 155.044025 | 16.611623 | SIO2 | 1.47458786 | 59.448 |
| 1260b | 91.049421 | 29.009885 | AIR | 1.00000000 | 51.856 |
| 1262a | −263.662579 | 6.983415 | SIO2 | 1.47458786 | 50.072 |
| 1262b | 112.313771 | 4.292833 | AIR | 1.00000000 | 48.190 |
| 1264a | 111.432935 | 19.779989 | LLF1 | 1.57931548 | 48.670 |
| 1264b | 2822.625506 | 0.129009 | AIR | 1.00000000 | 47.664 |
| DS | 0.000000 | 34.000000 | AIR | 1.00000000 | 47.710 |
| 1204 | 0.000000 | 0.000000 | AIR | 1.00000000 | 42.007 |

TABLE 11

| Surface | Radius of Curvature (mm) | Thickness (mm) | Material | Refractive index | Semi Diameter (mm) |
|---|---|---|---|---|---|
| 1302 | 0.000000 | 34.000000 | AIR | 1.00000000 | 42.000 |
| DS | 0.000000 | 0.467159 | AIR | 1.00000000 | 47.783 |
| 1318a | −1785.908234 | 18.692487 | LLF1 | 1.57923042 | 47.754 |
| 1318b | −119.190867 | 8.319861 | AIR | 1.00000000 | 48.792 |
| 1320a | −123.985300 | 6.927511 | SIO2 | 1.47458786 | 48.130 |
| 1320b | 220.658080 | 29.122679 | AIR | 1.00000000 | 50.048 |
| 1322a | −95.784025 | 38.778204 | SIO2 | 1.47458786 | 52.043 |
| 1322b | −147.539869 | 0.793173 | AIR | 1.00000000 | 66.205 |
| 1324a | 2466.384582 | 29.377437 | SIO2 | 1.47458786 | 71.606 |
| 1324b | −148.054271 | 0.855573 | AIR | 1.00000000 | 73.329 |
| 1326a | 447.173248 | 22.796444 | SIO2 | 1.47458786 | 73.986 |
| 1326b | −356.283964 | 173.838552 | AIR | 1.00000000 | 73.655 |
| 1328a | −177.042387 | 8.188143 | SIO2 | 1.47458786 | 45.684 |

TABLE 11-continued

| Surface | Radius of Curvature (mm) | Thickness (mm) | Material | Refractive index | Semi Diameter (mm) |
|---|---|---|---|---|---|
| 1328b | 212.704934 | 27.637678 | AIR | 1.00000000 | 45.331 |
| 1330a | −81.128231 | 7.144835 | SIO2 | 1.47458786 | 45.982 |
| 1330b | 552.956939 | 1.174463 | AIR | 1.00000000 | 52.222 |
| 1332a | 398.409595 | 29.376607 | CAF2 | 1.44491236 | 53.284 |
| 1332b | −99.244661 | 0.871867 | AIR | 1.00000000 | 55.519 |
| 1334a | 1504.458490 | 27.725727 | CAF2 | 1.44491236 | 57.085 |
| 1334b | −100.775118 | 2.691105 | AIR | 1.00000000 | 57.477 |
| 1336a | −97.251847 | 6.897972 | SIO2 | 1.47458786 | 56.820 |
| 1336b | −339.226928 | 0.800439 | AIR | 1.00000000 | 58.163 |
| 1338a | 497.347850 | 20.951171 | CAF2 | 1.44491236 | 58.309 |
| 1338b | −253.759354 | 6.364884 | AIR | 1.00000000 | 58.035 |
| 1340a | −160.262958 | 11.460067 | LLF1 | 1.57923042 | 57.695 |
| 1340b | −182.498637 | 0.245522 | AIR | 1.00000000 | 58.360 |
| DS | 0.000000 | 0.000000 | AIR | 1.00000000 | 57.234 |
| DS | 0.000000 | 0.245522 | AIR | 1.00000000 | 57.234 |
| 1342a | 182.498637 | 11.460067 | LLF1 | 1.57923042 | 58.360 |
| 1342b | 160.262958 | 6.364884 | AIR | 1.00000000 | 57.694 |
| 1344a | 253.759354 | 20.951171 | CAF2 | 1.44491236 | 58.034 |
| 1344b | −497.347850 | 0.800439 | AIR | 1.00000000 | 58.309 |
| 1346a | 339.226928 | 6.897972 | SIO2 | 1.47458786 | 58.163 |
| 1346b | 97.251847 | 2.691105 | AIR | 1.00000000 | 56.819 |
| 1348a | 100.775118 | 27.725727 | CAF2 | 1.44491236 | 57.476 |
| 1348b | −1504.458490 | 0.871867 | AIR | 1.00000000 | 57.084 |
| 1350a | 99.244661 | 29.376607 | CAF2 | 1.44491236 | 55.517 |
| 1350b | −398.409595 | 1.174463 | AIR | 1.00000000 | 53.282 |
| 1352a | −552.956939 | 7.144835 | SIO2 | 1.47458786 | 52.220 |
| 1352b | 81.128231 | 27.637678 | AIR | 1.00000000 | 45.981 |
| 1354a | −212.704934 | 8.188143 | SIO2 | 1.47458786 | 45.329 |
| 1354b | 177.042387 | 173.838552 | AIR | 1.00000000 | 45.682 |
| 1356a | 356.283964 | 22.796444 | SIO2 | 1.47458786 | 73.646 |
| 136b | −447.173248 | 0.856573 | AIR | 1.00000000 | 73.978 |
| 1358a | 148.054271 | 29.377437 | SIO2 | 1.47458786 | 73.320 |
| 1358b | −2466.384582 | 0.793173 | AIR | 1.00000000 | 71.596 |
| 1360a | 147.539869 | 38.778204 | SIO2 | 1.47458786 | 66.197 |
| 1360b | 95.784025 | 29.122679 | AIR | 1.00000000 | 52.037 |
| 1362a | −220.658080 | 6.927511 | SIO2 | 1.47458786 | 50.041 |
| 1362b | 123.985300 | 8.319861 | AIR | 1.00000000 | 48.124 |
| 1364a | 119.190867 | 18.692487 | LLF1 | 1.57923042 | 48.785 |
| 1364b | 1785.908234 | 0.467159 | AIR | 1.00000000 | 47.747 |
| DS | 0.000000 | 34.000000 | AIR | 1.00000000 | 47.776 |
| 1304 | 0.000000 | 0.000000 | AIR | 1.00000000 | 42.007 |

TABLE 12A

| Surface | Radius of Curvature (mm) | Shape | Thickness (mm) | Material | Index of Refraction | Semi Diameter (mm) |
|---|---|---|---|---|---|---|
| 1602 | 0 | | 4.00E+01 | AIR | 1.000000E+00 | 47.71 |
| 1618a | −9.25E+01 | | 1.20E+01 | LLF1 | 1.579320E+00 | 49.42 |
| 1618b | −7.03E+01 | | 1.01E+00 | AIR | 1.000000E+00 | 49.44 |
| 1620a | −6.94E+01 | | 1.00E+01 | SIO2 | 1.474550E+00 | 59.42 |
| 1620b | 6.83E+02 | AS | 1.12E+01 | AIR | 1.000000E+00 | 59.56 |
| 1622a | −1.82E+02 | | 3.82E+01 | SIO2 | 1.474550E+00 | 75.23 |
| 1622b | −2.09E+02 | AS | 1.00E+00 | AIR | 1.000000E+00 | 84.99 |
| 1624a | 5.28E+02 | | 3.19E+01 | SIO2 | 1.474550E+00 | 85.89 |
| 1624b | −1.88E+02 | | 1.00E+00 | AIR | 1.000000E+00 | 89.76 |
| 1626a | 1.53E+02 | | 3.99E+01 | SIO2 | 1.474550E+00 | 89.03 |
| 1626b | −2.98E+02 | AS | 1.28E+02 | AIR | 1.000000E+00 | 55.20 |
| 1628a | −2.75E+02 | AS | 1.00E+01 | SIO2 | 1.474550E+00 | 52.43 |
| 1628b | 1.27E+02 | | 8.58E+01 | AIR | 1.000000E+00 | 56.79 |
| 1630a | −4.30E+02 | | 7.00E+00 | SIO2 | 1.474550E+00 | 58.42 |
| 1630b | 2.02E+02 | | 3.34E+00 | AIR | 1.000000E+00 | 61.83 |
| 1632a | 1.21E+02 | | 4.01E+01 | CAF2 | 1.444913E+00 | 61.79 |
| 1632b | −1.12E+02 | | 9.99E−01 | AIR | 1.000000E+00 | 61.60 |
| 1634a | −1.09E+02 | | 7.00E+00 | SIO2 | 1.474550E+00 | 62.14 |
| 1634b | 2.24E+02 | AS | 1.00E+00 | AIR | 1.000000E+00 | 63.01 |
| 1636a | 1.51E+02 | | 2.98E+01 | CAF2 | 1.444913E+00 | 63.15 |
| 1636b | −1.80E+02 | | 9.99E−01 | AIR | 1.000000E+00 | 61.55 |
| 1606 | 0.00E+00 | | 9.99E−01 | AIR | 1.000000E+00 | 63.15 |
| 1638a | 1.80E+02 | | 2.98E+01 | CAF2 | 1.444913E+00 | 63.01 |
| 1638b | −1.51E+02 | | 1.00E+00 | AIR | 1.000000E+00 | 62.14 |
| 1640a | −2.24E+02 | AS | 7.00E+00 | SIO2 | 1.474550E+00 | 61.60 |

TABLE 12A-continued

| Surface | Radius of Curvature (mm) | Shape | Thickness (mm) | Material | Index of Refraction | Semi Diameter (mm) |
|---|---|---|---|---|---|---|
| 1640b | 1.09E+02 | | 9.99E−01 | AIR | 1.000000E+00 | 61.79 |
| 1642a | 1.12E+02 | | 4.01E+01 | CAF2 | 1.444913E+00 | 61.83 |
| 1642b | −1.21E+02 | | 3.34E+00 | AIR | 1.000000E+00 | 58.43 |
| 1644a | −2.02E+02 | | 7.00E+00 | SIO2 | 1.474550E+00 | 56.79 |
| 1644b | 4.30E+02 | | 8.58E+01 | AIR | 1.000000E+00 | 52.43 |
| 1646a | −1.27E+02 | | 1.00E+01 | SIO2 | 1.474550E+00 | 55.20 |
| 1646b | 2.75E+02 | AS | 1.28E+02 | AIR | 1.000000E+00 | 89.03 |
| 1648a | 2.98E+02 | AS | 3.99E+01 | SIO2 | 1.474550E+00 | 89.76 |
| 1648b | −1.53E+02 | | 1.00E+00 | AIR | 1.000000E+00 | 85.89 |
| 1650a | 1.88E+02 | | 3.19E+01 | SIO2 | 1.474550E+00 | 84.99 |
| 1650b | −5.28E+02 | | 1.00E+00 | AIR | 1.000000E+00 | 75.23 |
| 1652a | 2.09E+02 | AS | 3.82E+01 | SIO2 | 1.474550E+00 | 59.56 |
| 1652b | 1.82E+02 | | 1.12E+01 | AIR | 1.000000E+00 | 59.42 |
| 1654a | −6.83E+02 | AS | 1.00E+01 | SIO2 | 1.474550E+00 | 49.44 |
| 1654b | 6.94E+01 | | 1.01E+00 | AIR | 1.000000E+00 | 49.42 |
| 1656a | 7.03E+01 | | 1.20E+01 | LLF1 | 1.579320E+00 | 47.71 |
| 1656b | 9.25E+01 | | 4.00E+01 | AIR | 1.000000E+00 | 42.03 |

TABLE 12B

| | Surface | | | | |
|---|---|---|---|---|---|
| | 1620b | 1622b | 1626b | 1628a | 1634b |
| CC | 0.00000E+00 | 0.00000E+00 | 0.00000E+00 | 0.00000E+00 | 0.00000E+00 |
| C1 | 0.00000E+00 | 0.00000E+00 | 0.00000E+00 | 0.00000E+00 | 0.00000E+00 |
| C2 | −3.11300E−07 | 6.43956E−08 | 9.00458E−08 | 2.63248E−08 | 1.61340E−07 |
| C3 | 3.61315E−11 | −6.76882E−12 | 4.69245E−12 | −5.89732E−12 | 4.63435E−12 |
| C4 | 7.37165E−15 | −2.06270E−15 | 3.89533E−17 | −1.30451E−16 | 5.75454E−16 |
| C5 | −1.84065E−18 | −1.24987E−19 | −7.45216E−20 | 1.77321E−19 | −1.96788E−19 |
| C6 | 3.93145E−22 | 5.04495E−23 | 6.31654E−24 | −8.04090E−23 | 3.99005E−23 |
| C7 | −4.02537E−26 | −4.59886E−27 | −1.89918E−28 | 1.15920E−26 | −3.54400E−27 |
| C8 | 0.00000E+00 | 0.00000E+00 | 0.00000E+00 | 0.00000E+00 | 0.00000E+00 |
| C9 | 0.00000E+00 | 0.00000E+00 | 0.00000E+00 | 0.00000E+00 | 0.00000E+00 |

| | Surface | | | | |
|---|---|---|---|---|---|
| | 1640a | 1646b | 1648a | 1652a | 1654a |
| CC | 0.00000E+00 | 0.00000E+00 | 0.00000E+00 | 0.00000E+00 | 0.00000E+00 |
| C1 | 0.00000E+00 | 0.00000E+00 | 0.00000E+00 | 0.00000E+00 | 0.00000E+00 |
| C2 | −1.61340E−07 | −2.63248E−08 | −9.00458E−08 | −6.43956E−08 | 3.11300E−07 |
| C3 | −4.63435E−12 | 5.89732E−12 | −4.69245E−12 | 6.76882E−12 | −3.61315E−11 |
| C4 | −5.75454E−16 | 1.30451E−16 | −3.89533E−17 | 2.06270E−15 | −7.37165E−15 |
| C5 | 1.96788E−19 | −1.77321E−19 | 7.45216E−20 | 1.24987E−19 | 1.84065E−18 |
| C6 | 3.99005E−23 | 8.04090E−23 | −6.31654E−24 | −5.04495E−23 | −3.93145E−22 |
| C7 | 3.54400E−27 | −1.15920E−26 | 1.89918E−28 | 4.59886E−27 | 4.02537E−26 |
| C8 | 0.00000E+00 | 0.00000E+00 | 0.00000E+00 | 0.00000E+00 | 0.00000E+00 |
| C9 | 0.00000E+00 | 0.00000E+00 | 0.00000E+00 | 0.00000E+00 | 0.00000E+00 |

TABLE 12C

| Surface | |SA/CA|′ |
|---|---|
| 1618a | 0.16 |
| 1618b | 0.19 |
| 1620a | 0.19 |
| 1620b | 0.21 |
| 1622a | 0.24 |
| 1622b | 0.28 |
| 1624a | 0.29 |
| 1624b | 0.31 |
| 1626a | 0.32 |
| 1626b | 0.35 |
| 1628a | 0.58 |
| 1628b | 0.60 |
| 1630a | 0.84 |
| 1630b | 0.86 |
| 1632a | 0.87 |

TABLE 12C-continued

| Surface | |SA/CA|′ |
|---|---|
| 1632b | 0.93 |
| 1634a | 0.94 |
| 1634b | 0.95 |
| 1636a | 0.95 |
| 1636b | 1.00 |
| 1638a | 1.00 |
| 1638b | 0.95 |
| 1640a | 0.95 |
| 1640b | 0.93 |
| 1642a | 0.93 |
| 1642b | 0.87 |
| 1644a | 0.86 |
| 1644b | 0.84 |
| 1646a | 0.60 |
| 1646b | 0.58 |

TABLE 12C-continued

| Surface | |SA/CA|' |
|---|---|
| 1648a | 0.34 |
| 1648b | 0.31 |
| 1650a | 0.31 |
| 1650b | 0.28 |
| 1652a | 0.28 |
| 1652b | 0.24 |

TABLE 12C-continued

| Surface | |SA/CA|' |
|---|---|
| 1654a | 0.21 |
| 1654b | 0.19 |
| 1656a | 0.19 |
| 1656b | 0.16 |

TABLE 13A

| Surface | Radius of Curvature (mm) | Shape | Thickness (mm) | Material | Index of Refraction | Semi Diameter (mm) |
|---|---|---|---|---|---|---|
| 1702 | 0 | | 4.00E+01 | AIR | 1.000000E+00 | 50.00 |
| 1718a | 1.31E+02 | | 2.46E+01 | LLF1 | 1.579320E+00 | 51.18 |
| 1718b | −1.37E+02 | | 6.00E−01 | AIR | 1.000000E+00 | 50.97 |
| 1720a | −1.35E+02 | | 1.00E+01 | SIO2 | 1.474550E+00 | 50.80 |
| 1720b | 7.89E+01 | AS | 3.85E+01 | AIR | 1.000000E+00 | 48.21 |
| 1722a | −6.16E+01 | | 3.98E+01 | SIO2 | 1.474550E+00 | 48.39 |
| 1722b | −1.23E+03 | | 1.00E+00 | AIR | 1.000000E+00 | 76.17 |
| 1724a | −1.85E+03 | | 3.98E+01 | LLF1 | 1.579320E+00 | 77.41 |
| 1724b | −1.20E+02 | | 1.00E+00 | AIR | 1.000000E+00 | 81.42 |
| 1726a | 3.61E+02 | | 3.36E+01 | LLF1 | 1.579320E+00 | 89.03 |
| 1726b | −4.46E+02 | | 1.00E+00 | AIR | 1.000000E+00 | 89.19 |
| 1728a | 1.24E+02 | | 4.00E+01 | LLF1 | 1.579320E+00 | 84.83 |
| 1728b | 2.84E+03 | | 5.36E+00 | AIR | 1.000000E+00 | 81.99 |
| 1730a | −1.71E+03 | AS | 1.50E+01 | SIO2 | 1.474550E+00 | 81.99 |
| 1730b | 1.30E+02 | | 1.52E+02 | AIR | 1.000000E+00 | 69.02 |
| 1732a | −1.11E+03 | | 7.00E+00 | LLF1 | 1.579320E+00 | 42.18 |
| 1732b | 8.78E+01 | | 1.00E−01 | AIR | 1.000000E+00 | 40.21 |
| 1734a | 7.10E+01 | | 2.50E+01 | SIO2 | 1.474550E+00 | 40.59 |
| 1734b | −8.67E+01 | | 2.07E+00 | AIR | 1.000000E+00 | 40.27 |
| 1736a | −7.78E+01 | | 7.00E+00 | LLF1 | 1.579320E+00 | 39.51 |
| 1736b | 1.09E+02 | | 1.00E−01 | AIR | 1.000000E+00 | 38.02 |
| 1738a | 7.84E+01 | | 1.57E+01 | SIO2 | 1.474550E+00 | 38.42 |
| 1738b | −2.47E+02 | AS | 1.00E+00 | AIR | 1.444913E+00 | 38.04 |
| 1706 | 0.00E+00 | | 1.00E+00 | AIR | 1.000000E+00 | 37.57 |
| 1740a | 2.47E+02 | AS | 1.57E+01 | SIO2 | 1.474550E+00 | 38.04 |
| 1740b | −7.84E+01 | | 1.00E−01 | AIR | 1.000000E+00 | 38.42 |
| 1742a | −1.09E+02 | | 7.00E+00 | LLF1 | 1.579320E+00 | 38.02 |
| 1742b | 7.78E+01 | | 2.07E+00 | AIR | 1.000000E+00 | 39.51 |
| 1744a | 8.67E+01 | | 2.50E+01 | SIO2 | 1.474550E+00 | 40.27 |
| 1744b | −7.10E+01 | | 1.00E−01 | AIR | 1.000000E+00 | 40.59 |
| 1746a | −8.78E+01 | | 7.00E+00 | LLF1 | 1.579320E+00 | 40.21 |
| 1746b | 1.11E+03 | | 1.52E+02 | AIR | 1.000000E+00 | 42.18 |
| 1748a | −1.30E+02 | | 1.50E+01 | SIO2 | 1.474550E+00 | 69.02 |
| 1748b | 1.71E+03 | AS | 5.36E+00 | AIR | 1.000000E+00 | 81.99 |
| 1750a | −2.84E+03 | | 4.00E+01 | LLF1 | 1.579320E+00 | 81.99 |
| 1750b | −1.24E+02 | | 1.00E+00 | AIR | 1.000000E+00 | 84.83 |
| 1752a | 4.46E+02 | | 3.36E+01 | LLF1 | 1.579320E+00 | 89.19 |
| 1752b | −3.61E+02 | | 1.00E+00 | AIR | 1.000000E+00 | 89.03 |
| 1754a | 1.20E+02 | | 3.98E+01 | LLF1 | 1.579320E+00 | 81.42 |
| 1754b | 1.85E+03 | | 1.00E+00 | AIR | 1.000000E+00 | 77.41 |
| 1756a | 1.23E+03 | | 3.98E+01 | SIO2 | 1.474550E+00 | 76.17 |
| 1756b | 6.16E+01 | | 3.85E+01 | AIR | 1.000000E+00 | 48.39 |
| 1758a | −78.931653 | AS | 1.00E+01 | SIO2 | 1.474550E+00 | 48.21 |
| 1758b | 135.26309 | | 6.00E−01 | AIR | 1.000000E+00 | 50.802 |
| 1760a | 137.492089 | | 24.607034 | LLF1 | 1.579320E+00 | 50.972 |
| 1760b | −131.087892 | | 40 | AIR | 1.000000E+00 | 51.177 |

TABLE 13B

| | Surface | | | | | |
|---|---|---|---|---|---|---|
| | 1720b | 1730a | 1738b | 1740a | 1748b | 1758a |
| CC | 0.000000E+00 | 0.000000E+00 | 0.000000E+00 | 0.000000E+00 | 0.000000E+00 | 0.00000E+00 |
| C1 | 0.000000E+00 | 0.000000E+00 | 0.000000E+00 | 0.000000E+00 | 0.000000E+00 | 0.00000E+00 |
| C2 | −5.348304E−07 | −7.891070E−08 | 3.669874E−07 | −3.669874E−07 | 7.891070E−08 | 5.34830E−07 |
| C3 | 3.874388E−11 | 4.407850E−12 | 7.729112E−11 | −7.729112E−11 | −4.407850E−12 | −3.87439E−11 |
| C4 | −5.668205E−15 | 1.421355E−16 | 1.275249E−14 | 1.275249E−14 | −1.421355E−16 | 5.66820E−15 |
| C5 | −3.960233E−19 | −2.853409E−20 | −1.768252E−18 | 1.768252E−18 | 2.853409E−20 | 3.96023E−19 |
| C6 | 2.902361E−22 | 1.535014E−24 | 8.963552E−22 | −8.963552E−22 | −1.535014E−24 | −2.90236E−22 |

TABLE 13B-continued

| | Surface | | | | | |
|---|---|---|---|---|---|---|
| | 1720b | 1730a | 1738b | 1740a | 1748b | 1758a |
| C7 | −3.561952E−26 | −4.083660E−29 | −4.833046E−25 | 4.833046E−25 | 4.083660E−29 | 3.56195E−26 |
| C8 | 0.000000E+00 | 0.000000E+00 | 0.000000E+00 | 0.000000E+00 | 0.000000E+00 | 0.00000E+00 |
| C9 | 0.000000E+00 | 0.000000E+00 | 0.000000E+00 | 0.000000E+00 | 0.000000E+00 | 0.00000E+00 |

TABLE 13C

| Surface | $|SA/CA|'$ |
|---|---|
| 1718a | 0.19 |
| 1718b | 0.23 |
| 1720a | 0.23 |
| 1720b | 0.27 |
| 1722a | 0.36 |
| 1722b | 0.42 |
| 1724a | 0.42 |
| 1724b | 0.44 |
| 1726a | 0.45 |
| 1726b | 0.46 |
| 1728a | 0.47 |
| 1728b | 0.51 |
| 1730a | 0.52 |
| 1730b | 0.52 |
| 1732a | 0.84 |
| 1732b | 0.86 |
| 1734a | 0.86 |
| 1734b | 0.93 |
| 1736a | 0.93 |
| 1736b | 0.95 |
| 1738a | 0.95 |
| 1738b | 1.00 |
| 1740a | 1.00 |
| 1740b | 0.95 |
| 1742a | 0.95 |
| 1742b | 0.93 |
| 1744a | 0.92 |
| 1744b | 0.87 |
| 1746a | 0.86 |
| 1746b | 0.84 |
| 1748a | 0.52 |
| 1748b | 0.50 |
| 1750a | 0.49 |
| 1750b | 0.47 |
| 1752a | 0.46 |
| 1752b | 0.45 |
| 1754a | 0.44 |
| 1754b | 0.42 |
| 1756a | 0.42 |
| 1756b | 0.36 |
| 1758a | 0.26 |
| 1758b | 0.23 |
| 1760a | 0.23 |
| 1760b | 0.18 |

What is claimed is:

1. An optical lens system for directing radiation from an object region to an image region, the optical lens system having an optical axis, the optical lens system comprising:
a first lens group comprising first and second lenses positioned along the optical axis of the optical lens system; and
a second lens group comprising first and second lenses positioned along the optical axis of the optical lens system,
wherein:
the first lens group has a first chromatic aberration for the radiation;
the second lens group has a second chromatic aberration for the radiation;
the radiation includes a wavelength, $\lambda$;
a difference between a magnitude of the second chromatic aberration and a magnitude of the first chromatic aberration is less than about $\lambda$;
the optical lens system images radiation at the wavelength $\lambda$ to an image region; and
a sign of the second chromatic aberration is opposite to a sign of the first chromatic aberration; and
wherein the optical lens system forms a portion of a microlithography optical lens system and the first lens group reduces a curvature of the image at the wavelength $\lambda$ in the image region to less than a depth of focus of the microlithography optical lens system in the image region of microlithography optical lens system.

2. The optical lens system of claim 1, wherein a magnitude of a chromatic aberration of the microlithography optical lens system for the radiation in an image region of the microlithography optical lens system is smaller than the magnitude of the first chromatic aberration.

3. The optical lens system of claim 1, wherein at least one of the lenses in the first lens group has an aspheric surface.

4. The optical lens system of claim 3, wherein at least one of the lenses in the second lens group has an aspheric surface.

5. The optical lens system of claim 1, wherein a minimum distance between the first and second lens groups along the optical axis is about five centimeters or more.

6. The optical lens system of claim 1, wherein the second lens group comprises a doublet of lenses that includes a convex lens and a concave lens.

7. The optical lens system of claim 6, wherein the convex lens comprises a crown glass and the concave lens comprises a flint glass.

8. The optical lens system of claim 6, wherein the convex lens and the concave lens are spaced apart.

9. The optical lens system of claim 1, wherein the sign of the second chromatic aberration is opposite a sign of a chromatic aberration of at least one lens in the second lens group.

10. The optical lens system of claim 1, wherein the first lens group comprises a lens having a concave surface with a radius of curvature of about 130 mm or less.

11. The optical lens system of claim 1, wherein the first lens group comprises a first lens subgroup and a second lens subgroup, the first lens subgroup having a positive optical power and the second lens subgroup having a negative optical power.

12. The optical lens system of claim 1, wherein the first lens group has a focal length and a principal plane, where a shortest distance between the principal plane and the second lens group is larger than the focal length of the first lens group.

13. The optical lens system of claim 1, wherein a maximum dimension of the first lens group in a direction transverse to the optical axis is about 1.5 or more times larger than a maximum dimension of the second lens group in a direction transverse to the optical axis.

14. The optical lens system of claim 1, wherein the first chromatic aberration has a magnitude that is less than a magnitude of a chromatic aberration of one of the lenses in the first lens group for the radiation.

15. The optical lens system of claim 1, wherein the optical lens system has maximum numerical aperture of 0.2 or less and a $\Gamma$ ratio of less than 0.33.

16. The optical lens system of claim 1, wherein the total number of lenses positioned along the optical axis between the object region and the image region is 30 or less.

17. The optical lens system of claim 1, wherein the total number of lenses positioned along the optical axis between the object region and the image region is 24 or less.

18. The optical lens system of claim 1, wherein a magnification factor of the microlithography optical lens system is one.

19. The optical lens system of claim 1, wherein at least half the total number of lenses positioned along the optical axis between the object region and the image region are formed from fused silica.

20. The optical lens system of claim 1, wherein a first one of the lenses is formed of a first material, a second one of the lenses is formed of a second material, the first material has a first dispersion, and the second material has a second dispersion different from the first dispersion.

21. The optical lens system of claim 1, wherein the radiation has at least one wavelength in a wavelength range selected from the group consisting of the visible wavelength range and the UV wavelength range.

22. The optical lens system of claim 1, wherein at least one of the lenses has an aspheric surface.

23. The optical lens system of claim 1, wherein each of at least two of the lenses have an aspheric surface.

24. The optical lens system of claim 1, wherein no more than 40% of the lenses forming the optical lens system have a sub-aperture to clear aperture ratio of 0.6 or more.

25. The optical lens system of claim 1, wherein the optical lens system has a $\Gamma$ ratio of 0.32 or less.

26. The optical lens system of claim 1, wherein the optical lens system is a purely refractive lens system.

* * * * *

UNITED STATES PATENT AND TRADEMARK OFFICE
CERTIFICATE OF CORRECTION

PATENT NO. : 7,697,211 B2 Page 1 of 1
APPLICATION NO. : 12/257156
DATED : April 13, 2010
INVENTOR(S) : David R. Shafer et al.

It is certified that error appears in the above-identified patent and that said Letters Patent is hereby corrected as shown below:

Column 6, line 28, delete "$\zeta_1$" insert -- $\lambda_1$ --.

Column 11, line 60, after "is" delete "be".

Column 26, line 55, delete "Astigamtism" insert -- Astigmatism --.

Column 27, line 61, delete "Astigamtism" insert -- Astigmatism --.

Column 33, line 24, delete "Astigamtism" insert -- Astigmatism --.

Column 34, line 24, delete "Astigamtism" insert -- Astigmatism --.

Signed and Sealed this

Twenty-ninth Day of June, 2010

David J. Kappos
*Director of the United States Patent and Trademark Office*